(12) United States Patent
Akhavan-Tafti

(10) Patent No.: US 11,935,978 B2
(45) Date of Patent: Mar. 19, 2024

(54) ELECTROMAGNETIC ENERGY CONVERTER

(71) Applicant: THE REGENTS OF THE UNIVERSITY OF MICHIGAN, Ann Arbor, MI (US)

(72) Inventor: Mojtaba Akhavan-Tafti, Ann Arbor, MI (US)

(73) Assignee: THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 166 days.

(21) Appl. No.: 16/677,912

(22) Filed: Nov. 8, 2019

(65) Prior Publication Data

US 2020/0119684 A1  Apr. 16, 2020

Related U.S. Application Data

(63) Continuation-in-part of application No. PCT/US2018/049880, filed on Sep. 7, 2018.
(Continued)

(51) Int. Cl.
*H01L 31/048* (2014.01)
*H01L 31/0216* (2014.01)
(Continued)

(52) U.S. Cl.
CPC ........ *H01L 31/048* (2013.01); *H01L 31/0216* (2013.01); *H01L 31/0504* (2013.01);
(Continued)

(58) Field of Classification Search
CPC ............... H01L 31/048; H01L 31/0543; H01L 31/0547; H01L 31/0216; H01L 31/055; H02S 40/22; H02S 40/42; H02S 40/425
See application file for complete search history.

(56) References Cited

U.S. PATENT DOCUMENTS 4,106,952 A * 8/1978 Kravitz ............... H01L 31/0521
136/246
4,224,082 A   9/1980 Jacobson
(Continued)

FOREIGN PATENT DOCUMENTS

BR       9000510 A    1/1991
CN    103384920 A   11/2013
(Continued)

OTHER PUBLICATIONS

International Search Report and Written Opinion of the International Searching Authority issued in PCT/US2018/049880, dated Nov. 21, 2018; ISA/US.
(Continued)

*Primary Examiner* — Golam Mowla
(74) *Attorney, Agent, or Firm* — Harness, Dickey & Pierce, P.L.C.

(57) ABSTRACT

An enclosed multi-dimensional system for converting electromagnetic (EM) energy into electricity. An electromagnetic energy convertor (EMEC) device comprises a plurality of electromagnetic (EM) energy converting cells disposed in a single-piece, at-least-partially transparent, insulating medium selected from a list of luminescent, transmissive, absorptive, diffusive, refractive, dispersive, conductive, and dielectric materials or a combination thereof. The medium facilitates the propagation of the electromagnetic energy within the EMEC device and helps to optimize its conversion to electricity by the plurality of electromagnetic (EM) energy converting cells. The plurality of electromagnetic (EM) energy converting cells are disposed at least partially within the medium. A method is provided for optimizing the power per occupied surface area of the electromagnetic energy convertor (EMEC) device by adjusting the medium diffusivity and setting positions and/or the orientations of the
(Continued)

plurality of electromagnetic (EM) energy converting cells by adjusting at least one of three main physical parameters.

17 Claims, 56 Drawing Sheets

Related U.S. Application Data

(60) Provisional application No. 62/555,686, filed on Sep. 8, 2017.

(51) Int. Cl.
    *H01L 31/05*     (2014.01)
    *H01L 31/054*     (2014.01)
    *H01L 31/055*     (2014.01)
    *H02S 10/40*     (2014.01)
    *H02S 20/30*     (2014.01)
    *H02S 40/22*     (2014.01)
    *H02S 40/42*     (2014.01)

(52) U.S. Cl.
    CPC ...... *H01L 31/0543* (2014.12); *H01L 31/0547* (2014.12); *H01L 31/055* (2013.01); *H02S 10/40* (2014.12); *H02S 20/30* (2014.12); *H02S 40/22* (2014.12); *H02S 40/42* (2014.12); *H02S 40/425* (2014.12)

(56) References Cited

U.S. PATENT DOCUMENTS

| | | | |
|---|---|---|---|
| 4,331,829 A | 5/1982 | Palazzetti et al. | |
| 4,338,480 A | 7/1982 | Antypas et al. | |
| 4,441,143 A | 4/1984 | Richardson, Jr. | |
| 4,746,370 A * | 5/1988 | Woolf | H02S 10/30 136/246 |
| 5,068,865 A | 11/1991 | Ohshima et al. | |
| 5,110,368 A | 5/1992 | Otto et al. | |
| 6,060,658 A | 5/2000 | Yoshida et al. | |
| 6,087,579 A | 7/2000 | Muskatevc | |
| 6,223,675 B1 | 5/2001 | Watt et al. | |
| 7,797,939 B2 | 9/2010 | Green | |
| 8,146,527 B2 | 4/2012 | Pellen | |
| 8,553,742 B1 | 10/2013 | Wu | |
| 8,664,514 B2 | 3/2014 | Watters | |
| 8,787,420 B2 | 7/2014 | Kimoto et al. | |
| 8,860,165 B2 | 10/2014 | Okaniwa et al. | |
| 8,963,704 B2 | 2/2015 | Adami | |
| 9,048,609 B2 | 6/2015 | Kim | |
| 9,059,558 B2 | 6/2015 | Zhu et al. | |
| 9,158,178 B2 | 10/2015 | Smeeton et al. | |
| 9,172,207 B2 | 10/2015 | Chen | |
| 9,180,551 B2 | 11/2015 | Paganelli | |
| 9,203,212 B2 | 12/2015 | Kurobe et al. | |
| 9,592,742 B1 | 3/2017 | Sosinov et al. | |
| 10,027,412 B2 | 7/2018 | Eroglu et al. | |
| 11,145,046 B2 | 10/2021 | Lakshmanan et al. | |
| 11,245,469 B2 | 2/2022 | Lakshmanan et al. | |
| 2004/0149988 A1* | 8/2004 | Shiozaki | H01L 31/03685 257/53 |
| 2006/0266407 A1 | 11/2006 | Lichy et al. | |
| 2007/0012353 A1* | 1/2007 | Fischer | H01L 31/046 257/E27.125 |
| 2008/0000518 A1 | 1/2008 | Basol | |
| 2008/0245401 A1 | 10/2008 | Winston et al. | |
| 2008/0289682 A1* | 11/2008 | Adriani | B32B 17/10018 136/251 |
| 2009/0009847 A1 | 1/2009 | Sasagawa et al. | |
| 2009/0040750 A1 | 2/2009 | Myer | |
| 2009/0272424 A1 | 11/2009 | Ortabasi | |
| 2009/0272425 A1 | 11/2009 | Green | |
| 2010/0089436 A1 | 4/2010 | Watters | |
| 2010/0212717 A1 | 8/2010 | Whitlock et al. | |
| 2010/0236609 A1 | 9/2010 | Tweedie | |
| 2011/0017256 A1 | 1/2011 | Stevens | |
| 2011/0061717 A1 | 3/2011 | Kwon et al. | |
| 2011/0290296 A1* | 12/2011 | Daniel | H02S 40/38 136/244 |
| 2011/0305010 A1 | 12/2011 | Leadford et al. | |
| 2012/0031018 A1 | 2/2012 | Kapany | |
| 2012/0080078 A1 | 4/2012 | Farrelly et al. | |
| 2012/0118359 A1* | 5/2012 | Battistutti | H02S 20/30 136/251 |
| 2012/0240982 A1 | 9/2012 | Corneille | |
| 2013/0038919 A1 | 2/2013 | Gibson et al. | |
| 2013/0112239 A1* | 5/2013 | Liptac | H01L 31/0201 136/246 |
| 2013/0174896 A1 | 7/2013 | Ardo et al. | |
| 2013/0192656 A1 | 8/2013 | Hardin et al. | |
| 2013/0192662 A1 | 8/2013 | Snidow | |
| 2013/0200709 A1 | 8/2013 | Kirchner et al. | |
| 2013/0346166 A1 | 12/2013 | Chihara | |
| 2014/0130851 A1 | 5/2014 | Osamura et al. | |
| 2015/0034147 A1 | 2/2015 | Le Perchec et al. | |
| 2015/0101761 A1 | 4/2015 | Moslehi et al. | |
| 2015/0144191 A1 | 5/2015 | Declerck et al. | |
| 2015/0336669 A1 | 11/2015 | Kantor et al. | |
| 2016/0049799 A1 | 2/2016 | Takatsu et al. | |
| 2017/0170776 A1 | 6/2017 | Janowski | |
| 2017/0174092 A1 | 6/2017 | Kohnke | |
| 2019/0252565 A1 | 8/2019 | Lyons | |
| 2019/0323733 A1 | 10/2019 | Lv | |
| 2020/0177026 A1 | 6/2020 | Sosinov et al. | |
| 2022/0060142 A1 | 2/2022 | Akhavan-Tafti | |
| 2022/0379762 A1 | 12/2022 | Akhavan-Tafti | |

FOREIGN PATENT DOCUMENTS

| | | |
|---|---|---|
| CN | 207701042 U | 8/2018 |
| GB | 2479024 A | 9/2011 |
| JP | 2003346521 A | 12/2003 |
| JP | 2017127040 A | 7/2017 |
| JP | 6376732 B2 | 8/2018 |
| KR | 10-2010-0027379 A | 3/2010 |
| KR | 100973774 B1 | 8/2010 |
| KR | 20120013745 A | 2/2012 |
| KR | 20140028179 A | 3/2014 |
| KR | 20160015716 A | 2/2016 |
| KR | 20160043902 A | 4/2016 |
| KR | 20160133838 A | 11/2016 |
| KR | 20160142014 A | 12/2016 |
| KR | 20170024300 A | 3/2017 |
| KR | 20190118689 A | 10/2019 |
| WO | 2012/166048 A1 | 12/2012 |
| WO | 2012/173350 A2 | 12/2012 |
| WO | 2015-009482 A2 | 1/2015 |
| WO | 2015196296 A1 | 12/2015 |
| WO | 2017-097772 A1 | 6/2017 |

OTHER PUBLICATIONS

"3M Ultra Barrier Solar Film 510-F." 3M™ Ultra Barrier Solar Film 510-F, 3M, Oct. 2016, https://multimedia.3m.com/mws/media/1285470O/3m-ultra-barrier-solar-film-510-f.pdf. (Year: 2016).

Liu, Ji-Tao, et al. "Curing Determination of EVA for Solar Panel Application by DSC." Curing Determination of EVA for Solar Panel Application, PerkinElmer, Inc, 2010, https://www.s4science.at/wordpress/wp-content/uploads/2018/10/EVA-Curing-for-Solar-Panels_DSC8000_APP .pdf. (Year: 2010).

Tomoyoshi Motohiro et al., "Concept of the solar-pumped laser-photovoltaics combined system and its application to laser beam power feeding to electric vehicles", Japanese Journal of Applied Physics, 2017.

International Search Report and Written Opinion of the International Searching Authority issued in PCT/US2020/059262, dated Feb. 26, 2021, ISA/US.

International Search Report and Written Opinion of the International Searching Authority regarding International Patent Application No. PCT/US2022/016614, dated May 31, 2022.

International Search Report regarding International Application No. PCT/US2021/047268 dated Dec. 21, 2021.

(56) References Cited

OTHER PUBLICATIONS

International Search Report and Written Opinion dated Apr. 29, 2020 regarding PCT/US2019/026580.
D.-R. Kim, S.-H. Yang, H.-S. Kim, Y.-H. Son, and S.-K. Han, "Outdoor Visible Light Communication for inter-vehicle communication using Controller Area Network," in 2012 Fourth International Conference on Communications and Electronics (ICCE), Hue, Vietnam, Aug. 2012, pp. 31-34. doi: 10.1109/CCE.2012.6315865.
Wang, Yiguang, Xingxing Huang, Jianyang Shi, Yuan-quan Wang, and Nan Chi. "Long-Range High-Speed Visible Light Communication System over 100-m Outdoor Transmission Utilizing Receiver Diversity Technology." Optical Engineering 55, No. 5 (May 2016): 056104.
Kim, Yong Hyeon, Willy Anugrah Cahyadi, and Yeon Ho Chung. "Experimental Demonstration of VLC-Based Vehicle-to-Vehicle Communications Under Fog Conditions." IEEE Photonics Journal 7, No. 6 (Dec. 2015): 1-9.
Rodríguez, Juan, Diego G. Lamar, Daniel G. Aller, Pablo F. Miaja, and Javier Sebastián. "Efficient Visible Light Communication Transmitters Based on Switching-Mode Dc-Dc Converters." Sensors 18, No. 4 (Apr. 2018): 1127.
Vega-Colado, César, Belén Arredondo, Juan Carlos Torres, Eduardo López-Fraguas, Ricardo Vergaz, Diego Martin-Martin, Gonzalo Del Pozo, et al. "An All-Organic Flexible Visible Light Communication System." Sensors 18, No. 9 (Sep. 2018): 3045.
Gordon Povey, "An IEEE Standard For Visible Light Communications", Visible Light Communications, Apr. 7, 2011.
"Shedding Light on LiFi", Pure LiFi, Aug. 2017.
"Deok Rae Kim et al., ""Outdoor Visible Light Communication For Inter-Vehicle Communication Using Control Area Network""", ICCE, 2012 (pp. 31-34)."
Harald Haas, "LiFi is a Paradigm-Shifting 5G Technology", Reviews in Physics, Oct. 27, 2017.
Mohamed Sufyan Islim et al., "The Impact of Solar Irradiance on Visible Light Communications", Journal of Lightwave Technology, vol. 36, No. 12, Jun. 15, 2018.
Saeed Ur Rehman et al., "Visible Light Communication: A System Perspective—Overview and Challenges", Sensors, Mar. 7, 2019.
Bugra Turan et al., "Vehicular Visible Light Communications", Intech, 2017.
Alin-Mihai Cailean et al., "A Survey on the Usage of DSRC and VLC in Communication-Based Vehicle Safety Applications", IEEE, 2014.
Cen Liu, "Enabling Vehicular Visible Light Communication (V2LC) Networks", VANET' 11, Sep. 23, 2011.
Arnez Pramesti Ardi et al., "VLC-Based Car-to-Car Communication", Jurnal Elecktronika dan Telekomunikasi (JET), vol. 20, No. 1, Aug. 2020, pp. 16-22.
Trong-Hop Do et al., "Potentialities and Challenges of VLC Based Outdoor Positioning", IEEE, 2015.
Hossien B. Eldeeb et al., "Vehicle-to-Vehicle Light Communication: How to Select Receiver Locations for Optimal Performance", IEEE.
Mohammed Elamassie et at., "Effect of Fog and Rain on the Performance of Vehicular Visible Light Communications", IEEE, 2018.
Hossien B. Eldeeb et al., "MAC Layer Performance of Multi-Hop Vehicular VLC Networks with CSMA/CA", 12th International Symposium on Communication Systems, Networks and Digital Signal Processing, 2020.
Harald Haas et al., "What is LiFi?", Journal of Lightwave Technology, IEEE, 2015.
Harald Haas et al., "Introduction to Indoor Networking Concepts and Challenges in LiFi", Journal of Optical Communications and Networking, vol. 12, No. 2, Feb. 2020.
Pable Palacios Jativa et al., "Performance Analysis of OFDM-Based VLC Schemes in NLOS Channels", IEEE, Downloaded May 16, 2021.
S. Sivaguru,"A High Speen Open Access Visible Light Communication System Based on Intensity Modulation", International Journal of Science Technology & Engineering, vol. 3, Issue 08, Feb. 2017.
Rahul R. Sharma et al., "Implementation of a Simple Li-Fi Based System", International Journal of Computing and Technology, vol. 1, Issue 9, Oct. 2014.
Tahmid H. Talukdar et al., "Small Scale Wireless Data Transmission via Light Using Light Source", Proceedings of the International Conference on Engineering Research, Innovation, and Education 2017.
Soumyajit Chatterjee, "Point-to-Point Digital Communication using VLC (Visible Light Communication) and LiFi Technology", IEEE.
Chinese Office Action regarding Patent Application No. 2018800722004, dated Mar. 7, 2023.
Chinese Office Action regarding Patent Application No. 201880072200.4, dated Sep. 21, 2023.
Extended European Search Report regarding Patent Application No. 20884793.9, dated Oct. 16, 2023.

* cited by examiner

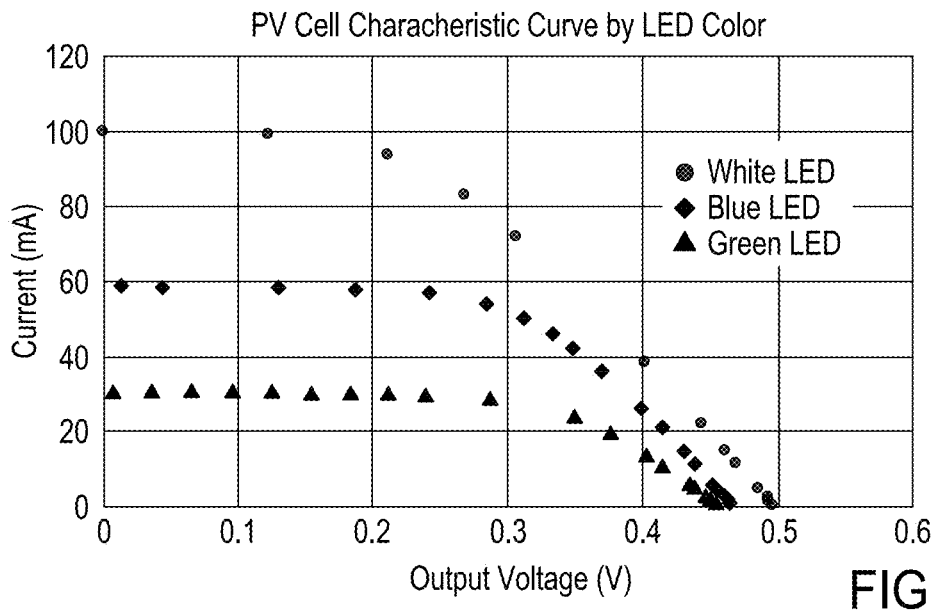
FIG. 30
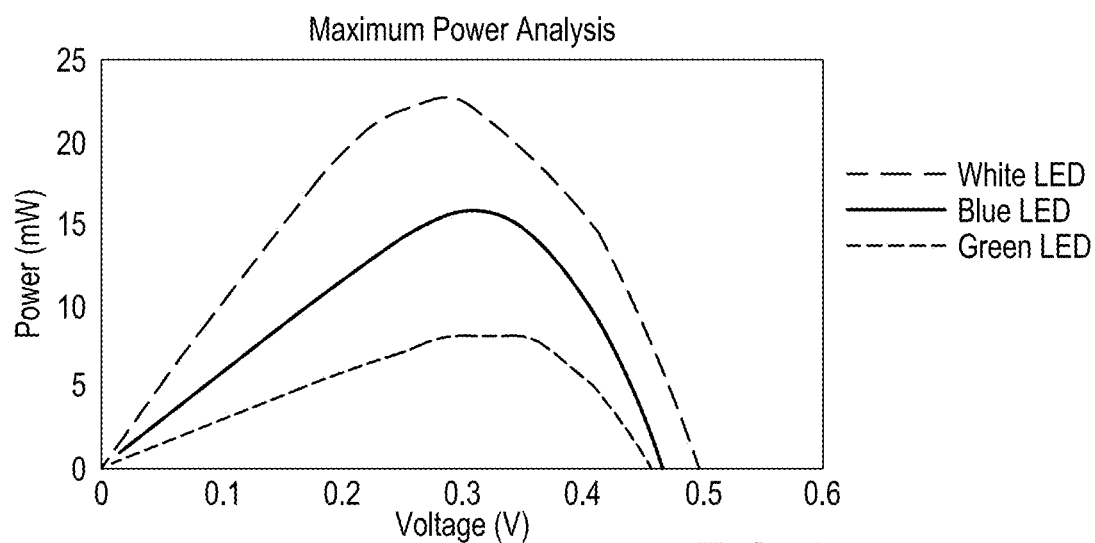
FIG. 31
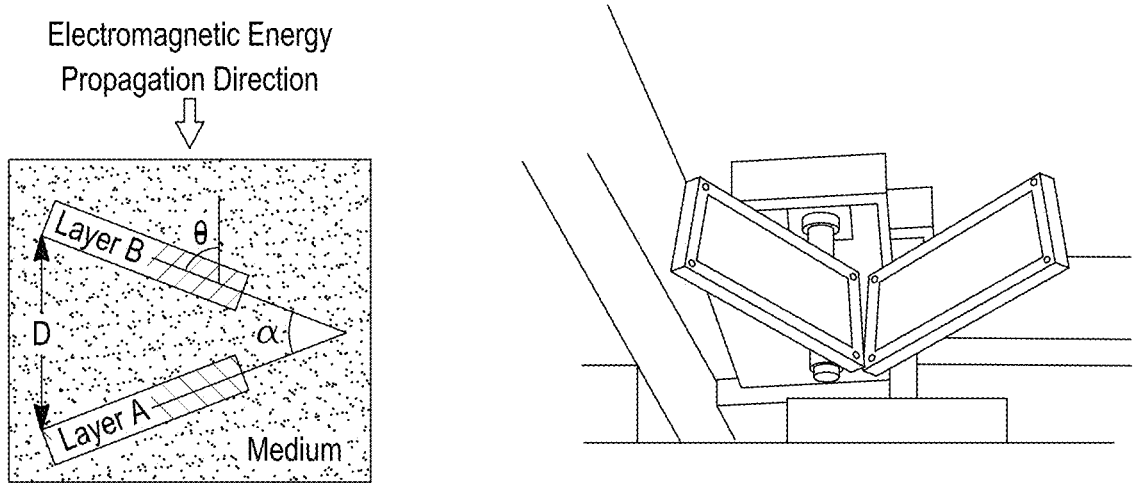
FIG. 32A
FIG. 32B

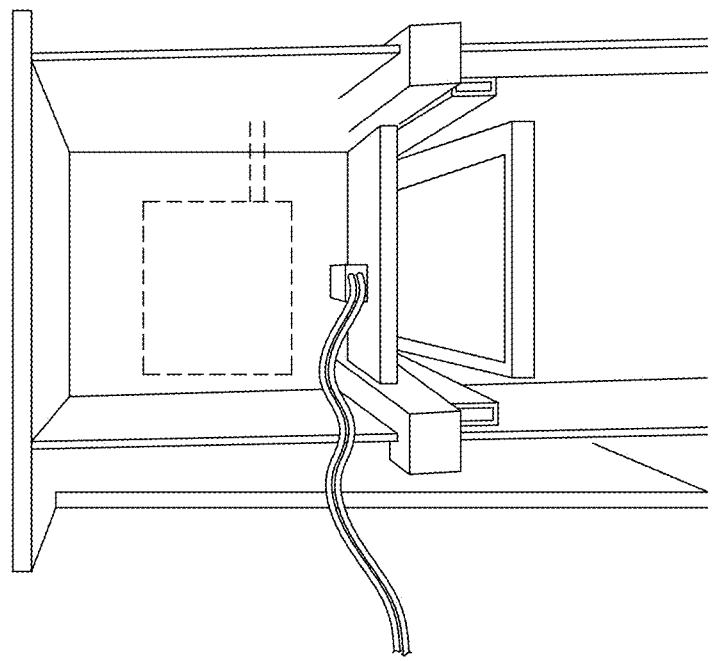
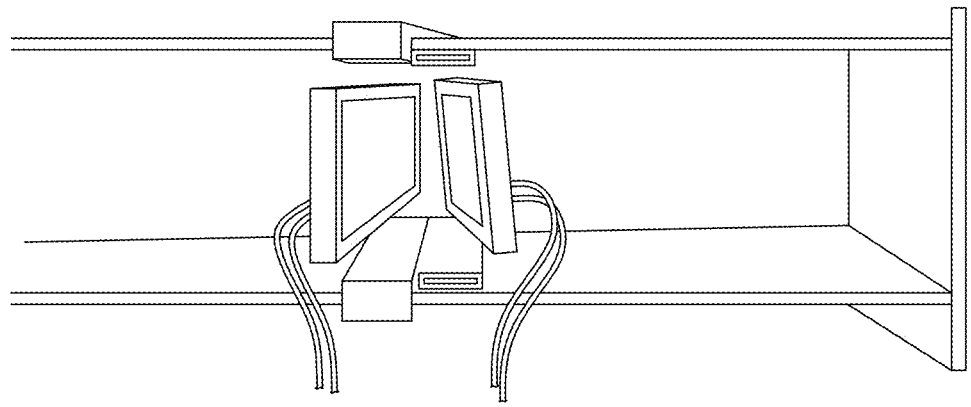
FIG. 38

| Normalized Power (425 Lux) | | | | | | | | | |
|---|---|---|---|---|---|---|---|---|---|
| | Transparency | | | | | | | | |
| Angle | 100 | 89.1 | 55.6 | 53.2 | 52 | 61.5 | 57.7 | 56.6 | LW9 53.2 |
| 0 (Reference Power (mW)) | 2.50 | 2.41 | 2.37 | 2.32 | 2.30 | 2.39 | 2.38 | 2.33 | 2.38 |
| 0 | 100% | 100% | 100% | 100% | 100% | 100% | 100% | 100% | 100% |
| 10 | 98.4% | 98.8% | 98.8% | 99.2% | 99.2% | 98.8% | 98.8% | 98.8% | 99.2% |
| 20 | 96.8% | 97.2% | 97.1% | 97.5% | 97.5% | 97.2% | 97.2% | 97.5% | 98.0% |
| 30 | 94.9% | 94.8% | 94.3% | 95.5% | 95.5% | 94.8% | 94.7% | 95.5% | 95.9% |
| 40 | 92.9% | 90.9% | 90.8% | 93.1% | 92.6% | 91.2% | 92.0% | 92.7% | 93.6% |
| 50 | 90.3% | 85.1% | 86.1% | 89.9% | 89.1% | 87.0% | 88.1% | 89.1% | 90.4% |
| 60 | 86.5% | 77.4% | 79.8% | 84.5% | 83.6% | 81.3% | 82.8% | 84.5% | 85.8% |
| 70 | 79.6% | 68.4% | 71.2% | 75.9% | 75.1% | 73.8% | 75.1% | 77.4% | 78.4% |
| 80 | 60.5% | 49.4% | 52.5% | 53.3% | 52.3% | 58.2% | 59.4% | 60.3% | 61.3% |
| 90 | 10.4% | 20.3% | 20.4% | 22.4% | 11.0% | 24.5% | 20.1% | 17.3% | 16.3% |
| 100 | 9.7% | 18.8% | 15.4% | 18.6% | 8.0% | 19.5% | 16.0% | 14.5% | 13.5% |
| 110 | 8.5% | 14.2% | 10.5% | 13.5% | 7.9% | 14.2% | 11.7% | 11.5% | 11.0% |
| 120 | 7.1% | 10.1% | 6.8% | 8.1% | 7.1% | 9.4% | 8.5% | 8.3% | 8.1% |
| 130 | 5.7% | 7.6% | 4.8% | 5.2% | 6.1% | 6.7% | 6.3% | 5.9% | 5.7% |
| 140 | 4.6% | 5.6% | 3.6% | 4.0% | 5.1% | 5.3% | 4.8% | 4.4% | 4.3% |
| 150 | 3.8% | 4.1% | 2.8% | 3.2% | 4.2% | 4.4% | 3.7% | 3.6% | 3.4% |
| 160 | 3.5% | 3.2% | 2.5% | 2.9% | 3.6% | 4.3% | 3.2% | 3.5% | 3.0% |
| 170 | 3.8% | 2.8% | 2.4% | 3.0% | 3.4% | 4.5% | 3.2% | 4.0% | 3.1% |
| 180 | 4.2% | 3.0% | 2.5% | 3.3% | 3.5% | 5.1% | 3.4% | 4.5% | 3.3% |

FIG. 60

Normalized Power (425 Lux)

| Angle | rrenc | 100 | 94.8 | 94.4 | 94.2 | KSH93 | 93 | 91.6 | 91.5 | 87.7 | 87.6 | 82 | 79.1 | 77 | 67.5 | 64.8 | 42.8 |
|---|---|---|---|---|---|---|---|---|---|---|---|---|---|---|---|---|---|
| 0 | 2.50 | 100% | 93.7% | 92.9% | 91.8% | 94.1% | 98.0% | 94.1% | 93.7% | 91.8% | 91.8% | 91.8% | 92.2% | 92.2% | 89.9% | 87.6% | 85.4% |
| 10 | 2.46 | 100% | 94.4% | 93.3% | 92.9% | 94.8% | 98.0% | 94.4% | 94.0% | 92.5% | 91.3% | 91.3% | 92.5% | 92.5% | 90.6% | 88.3% | 86.0% |
| 20 | 2.42 | 100% | 94.6% | 93.6% | 93.6% | 95.2% | 98.0% | 95.2% | 94.4% | 93.2% | 92.0% | 92.0% | 92.8% | 92.8% | 90.5% | 88.6% | 86.3% |
| 30 | 2.37 | 100% | 95.1% | 93.5% | 94.7% | 95.1% | 98.0% | 95.9% | 94.7% | 93.9% | 92.3% | 92.3% | 92.7% | 93.1% | 90.4% | 88.5% | 86.1% |
| 40 | 2.32 | 100% | 95.1% | 92.7% | 95.5% | 93.9% | 97.5% | 96.3% | 93.9% | 93.9% | 92.7% | 92.7% | 91.9% | 92.3% | 89.9% | 88.7% | 85.6% |
| 50 | 2.26 | 100% | 94.6% | 90.6% | 95.8% | 89.4% | 96.2% | 96.2% | 93.0% | 94.2% | 93.0% | 93.0% | 90.6% | 91.8% | 89.0% | 88.2% | 84.6% |
| 60 | 2.16 | 100% | 93.2% | 85.5% | 95.8% | 81.2% | 93.7% | 96.2% | 90.8% | 94.5% | 93.7% | 93.7% | 89.1% | 89.9% | 87.5% | 86.7% | 82.8% |
| 70 | 1.99 | 100% | 88.3% | 81.6% | 96.0% | 79.6% | 91.2% | 97.8% | 87.8% | 96.4% | 96.4% | 96.4% | 87.0% | 88.7% | 84.9% | 85.7% | 79.2% |
| 80 | 1.51 | 100% | 92.9% | 92.9% | 110.5% | 90.5% | 89.0% | 116.0% | 97.1% | 114.4% | 115.5% | 115.5% | 82.9% | 82.3% | 68.4% | 80.5% | 48.5% |
| 90 | 0.26 | 100% | 78.9% | 209.4% | 403.7% | 347.2% | 86.2% | 502.8% | 143.7% | 401.7% | 404.4% | 404.4% | 218.5% | 53.7% | 110.2% | 77.1% | — |
| 100 | 0.24 | 100% | 76.0% | 164.4% | 401.7% | 310.8% | 64.2% | 197.1% | 223.1% | 177.8% | 87.9% | 87.9% | 206.2% | 55.3% | 101.3% | — | — |
| 110 | 0.21 | 100% | 76.9% | 140.4% | 171.0% | 227.1% | 66.4% | 283.9% | 208.9% | 185.6% | 50.7% | 50.7% | 201.0% | 57.8% | 101.4% | — | — |
| 120 | 0.18 | 100% | 78.7% | 122.2% | 157.1% | 173.1% | 68.4% | 261.3% | 183.2% | 189.3% | 52.1% | 52.1% | 185.2% | 60.0% | 97.0% | — | — |
| 130 | 0.14 | 100% | 82.4% | 119.3% | 153.9% | 148.5% | 70.6% | 231.3% | 165.3% | 178.5% | 55.5% | 55.5% | 169.7% | 63.7% | 93.4% | 45.1% | — |
| 140 | 0.11 | 100% | 85.6% | 107.6% | 148.5% | 147.6% | 73.9% | 204.5% | 138.7% | 103.9% | 58.7% | 58.7% | 149.9% | 67.6% | 89.1% | 47.9% | — |
| 150 | 0.10 | 100% | 84.3% | 94.0% | 140.9% | 119.2% | 75.2% | 165.3% | 108.5% | 145.0% | 60.1% | 60.1% | 123.7% | 70.0% | 90.6% | 51.0% | — |
| 160 | 0.09 | 100% | 79.9% | 83.7% | 128.3% | 91.7% | 76.1% | 122.4% | 89.6% | 115.4% | 62.0% | 62.0% | 97.9% | 72.4% | 74.3% | 47.8% | — |
| 170 | 0.09 | 100% | 78.6% | 73.2% | 108.3% | 75.0% | 71.5% | 84.2% | 82.3% | 88.0% | 59.6% | 59.6% | 82.3% | 69.7% | 71.5% | 53.9% | 27.2% |
| 180 | 0.11 | 100% | 78.1% | 66.5% | 74.7% | 66.5% | 69.7% | 79.6% | 79.8% | 73.0% | 57.3% | 57.3% | 76.4% | 66.5% | 68.1% | 50.3% | — |

FIG. 61

Normalized Power (425 Lux)

| Angle | Reference Power (mW) | 100 | 89.1 | 55.6 | 53.2 | 52 | 61.5 | 57.7 | 56.6 | LW9 53.2 |
|---|---|---|---|---|---|---|---|---|---|---|
| | | | | | Transparency | | | | | |
| 0 | 2.50 | 100% | 96.4% | 94.9% | 92.9% | 92.2% | 95.6% | 95.3% | 93.3% | 95.3% |
| 10 | 2.46 | 100% | 96.8% | 95.2% | 93.7% | 92.9% | 96.0% | 95.6% | 93.7% | 96.0% |
| 20 | 2.42 | 100% | 96.8% | 95.2% | 93.6% | 92.8% | 96.0% | 95.6% | 94.0% | 96.4% |
| 30 | 2.37 | 100% | 96.3% | 94.3% | 93.5% | 92.7% | 95.5% | 95.1% | 93.9% | 96.3% |
| 40 | 2.32 | 100% | 94.3% | 92.7% | 93.1% | 91.9% | 93.9% | 94.3% | 93.1% | 95.9% |
| 50 | 2.26 | 100% | 91.0% | 90.6% | 92.6% | 91.0% | 93.2% | 93.0% | 92.2% | 95.4% |
| 60 | 2.16 | 100% | 86.3% | 87.5% | 90.8% | 89.1% | 89.9% | 91.2% | 91.2% | 94.5% |
| 70 | 1.99 | 100% | 82.9% | 84.9% | 88.7% | 87.0% | 88.7% | 90.0% | 90.8% | 93.8% |
| 80 | 1.51 | 100% | 78.7% | 82.3% | 81.9% | 79.6% | 91.9% | 93.4% | 92.9% | 96.4% |
| 90 | 0.26 | 100% | 188.4% | 186.7% | 200.5% | 97.5% | 225.9% | 185.0% | 155.9% | 149.7% |
| 100 | 0.24 | 100% | 186.4% | 149.9% | 177.8% | 76.0% | 191.7% | 156.3% | 139.1% | 131.7% |
| 110 | 0.21 | 100% | 160.6% | 117.1% | 147.0% | 85.5% | 158.8% | 130.8% | 126.2% | 123.1% |
| 120 | 0.18 | 100% | 137.6% | 91.2% | 106.1% | 92.6% | 127.2% | 114.0% | 109.2% | 109.2% |
| 130 | 0.14 | 100% | 128.7% | 80.8% | 85.4% | 100.0% | 113.9% | 105.1% | 96.7% | 96.7% |
| 140 | 0.11 | 100% | 117.5% | 75.5% | 80.5% | 101.9% | 111.5% | 100.0% | 89.1% | 89.1% |
| 150 | 0.10 | 100% | 104.1% | 70.0% | 77.0% | 100.0% | 110.5% | 92.0% | 88.1% | 84.3% |
| 160 | 0.09 | 100% | 87.6% | 67.1% | 76.1% | 93.7% | 115.4% | 85.7% | 93.7% | 81.8% |
| 170 | 0.09 | 100% | 71.5% | 59.8% | 73.2% | 84.2% | 115.0% | 80.4% | 97.9% | 78.6% |
| 180 | 0.11 | 100% | 68.1% | 55.9% | 71.3% | 76.4% | 114.1% | 76.4% | 100.0% | 74.7% |

Normalized Power (425 Lux)

| Angle | 100 | 94.8 | 94.4 | 94.2 | KSH 93 | 93 | 91.6 | 91.5 | 87.7 | 87.6 | 82 | 79.1 | 77 | 67.5 | 64.8 | 42.8 |
|---|---|---|---|---|---|---|---|---|---|---|---|---|---|---|---|---|
| | | | | | | | | | | Transparency | | | | | | |
| 0 Power (W) (Reference) | 2.50E-03 | 2.34E-03 | 2.32E-03 | 2.29E-03 | 2.35E-03 | 2.45E-03 | 2.35E-03 | 2.34E-03 | 2.29E-03 | 2.29E-03 | 2.28E-03 | 2.30E-03 | 2.30E-03 | 2.25E-03 | 2.19E-03 | 2.13E-03 |
| 0 | 100% | 100% | 100% | 100% | 100% | 100% | 100% | 100% | 100% | 100% | 100% | 100% | 100% | 100% | 100% | 100% |
| 10 | 98.4% | 99.2% | 98.6% | 98.6% | 99.2% | 98.4% | 98.6% | 98.6% | 99.2% | 97.9% | 98.7% | 98.6% | 98.6% | 99.2% | 99.1% | 99.1% |
| 20 | 96.6% | 97.6% | 97.5% | 96.6% | 97.9% | 96.4% | 97.9% | 97.9% | 96.8% | 97.9% | 97.3% | 97.9% | 97.9% | 97.9% | 97.3% | 97.6% |
| 30 | 94.8% | 96.5% | 95.5% | 96.5% | 95.6% | 94.6% | 96.0% | 95.3% | 95.6% | 95.6% | 95.5% | 95.6% | 95.6% | 95.6% | 95.4% | 94.5% |
| 40 | 92.9% | 94.5% | 92.7% | 94.7% | 92.7% | 91.2% | 93.3% | 93.0% | 92.6% | 93.4% | 93.0% | 93.0% | 93.0% | 93.0% | 92.5% | 89.0% |
| 50 | 90.5% | 91.0% | 87.9% | 94.2% | 87.2% | 86.7% | 90.2% | 88.8% | 89.6% | 91.4% | 88.4% | 88.6% | 88.8% | 88.8% | 88.6% | 85.5% |
| 60 | 86.5% | 86.1% | 83.6% | 90.6% | 82.6% | 82.6% | 88.4% | 83.6% | 85.6% | 88.3% | 84.6% | 86.1% | 84.4% | 84.2% | 83.6% | 83.6% |
| 70 | 78.9% | 74.9% | 79.6% | 88.2% | 74.6% | 74.1% | 82.7% | 78.6% | 83.6% | 85.6% | 77.4% | 75.1% | 76.6% | 75.2% | 77.9% | 73.8% |
| 80 | 60.5% | 53.7% | 60.5% | 72.9% | 58.2% | 55.0% | 74.6% | 56.3% | 73.4% | 78.2% | 58.9% | 54.1% | 54.1% | 46.7% | 55.0% | 34.4% |
| 90 | 10.4% | 8.9% | 23.4% | 55.5% | 38.3% | 7.0% | 55.4% | 15.9% | 55.5% | 53.9% | 5.9% | 24.6% | 8.0% | 12.7% | 4.8% | |

Blue LED Normalized Power (425 Lux)

Transparency

| Angle | Reference Power (W) | 100 | 94.8 | 94.4 | 94.2 | 93 | 91.6 | 91.5 | 89.1 | 87.7 | 87.6 | 82.6 | 79.1 | 77 | 67.5 | 64.8 | 61.5 | 57.7 | 56.6 | 55.6 | 53.8 | 53.2 | 52 | 42.8 |
|---|---|---|---|---|---|---|---|---|---|---|---|---|---|---|---|---|---|---|---|---|---|---|---|---|

2 Cell Power to 1 Cell Power Ratio

| Angle | \ | Lux | | | | | | | | | | | | | | |
|---|---|---|---|---|---|---|---|---|---|---|---|---|---|---|---|---|
|  | 25 | 75 | 125 | 175 | 225 | 275 | 325 | 375 | 425 | 475 | 525 | 575 | 625 | 675 | 725 | 775 |
| 0 | 1.53 | 1.64 | 1.63 | 1.61 | 1.62 | 1.64 | 1.66 | 1.69 | 1.72 | 1.86 | 1.92 | 2.10 | 2.18 | 2.25 | 2.28 | 2.29 |
| 9 | 4.57 | 4.67 | 3.96 | 3.05 | 2.71 | 2.58 | 2.50 | 2.45 | 2.42 | 2.40 | 2.38 | 2.37 | 2.35 | 2.34 | 2.33 | 2.32 |
| 18 | 1.51 | 2.02 | 2.10 | 2.11 | 2.11 | 2.11 | 2.11 | 2.10 | 2.10 | 2.11 | 2.11 | 2.10 | 2.10 | 2.09 | 2.09 | 2.09 |
| 27 | 1.04 | 1.92 | 2.00 | 2.01 | 2.02 | 2.02 | 2.03 | 2.03 | 2.03 | 2.03 | 2.03 | 2.02 | 2.02 | 2.02 | 2.02 | 2.02 |
| 36 | 0.94 | 1.89 | 1.95 | 1.97 | 1.98 | 1.99 | 1.98 | 1.98 | 1.99 | 1.99 | 1.99 | 1.99 | 1.98 | 1.99 | 1.99 | 1.98 |
| 45 | 0.92 | 1.87 | 1.92 | 1.94 | 1.95 | 1.96 | 1.95 | 1.95 | 1.96 | 1.96 | 1.97 | 1.96 | 1.96 | 1.96 | 1.97 | 1.96 |
| 54 | 0.89 | 1.83 | 1.89 | 1.92 | 1.93 | 1.93 | 1.94 | 1.94 | 1.94 | 1.95 | 1.94 | 1.95 | 1.95 | 1.95 | 1.94 | 1.95 |
| 63 | 0.88 | 1.82 | 1.89 | 1.91 | 1.92 | 1.93 | 1.93 | 1.93 | 1.93 | 1.93 | 1.94 | 1.93 | 1.94 | 1.93 | 1.94 | 1.94 |
| 72 | 0.85 | 1.81 | 1.87 | 1.90 | 1.91 | 1.92 | 1.92 | 1.92 | 1.92 | 1.93 | 1.93 | 1.93 | 1.93 | 1.93 | 1.93 | 1.93 |
| 81 | 0.80 | 1.80 | 1.87 | 1.89 | 1.90 | 1.91 | 1.91 | 1.92 | 1.92 | 1.92 | 1.92 | 1.92 | 1.93 | 1.93 | 1.92 | 1.93 |
| 90 | 0.74 | 1.78 | 1.86 | 1.88 | 1.89 | 1.90 | 1.90 | 1.91 | 1.91 | 1.91 | 1.91 | 1.91 | 1.92 | 1.92 | 1.92 | 1.92 |
| 99 | 0.67 | 1.75 | 1.85 | 1.87 | 1.88 | 1.90 | 1.90 | 1.90 | 1.90 | 1.90 | 1.91 | 1.91 | 1.91 | 1.91 | 1.91 | 1.92 |
| 108 | 0.60 | 1.71 | 1.83 | 1.86 | 1.87 | 1.88 | 1.89 | 1.89 | 1.89 | 1.89 | 1.90 | 1.90 | 1.91 | 1.91 | 1.91 | 1.91 |
| 117 | 0.52 | 1.65 | 1.80 | 1.84 | 1.86 | 1.88 | 1.88 | 1.89 | 1.89 | 1.89 | 1.88 | 1.89 | 1.89 | 1.89 | 1.89 | 1.90 |
| 126 | 0.45 | 1.53 | 1.76 | 1.82 | 1.84 | 1.86 | 1.86 | 1.87 | 1.88 | 1.88 | 1.87 | 1.87 | 1.88 | 1.88 | 1.87 | 1.89 |
| 135 | 0.39 | 1.31 | 1.69 | 1.77 | 1.81 | 1.83 | 1.84 | 1.85 | 1.86 | 1.87 | 1.84 | 1.85 | 1.86 | 1.86 | 1.87 | 1.87 |
| 144 | 0.33 | 0.93 | 1.51 | 1.69 | 1.76 | 1.78 | 1.80 | 1.82 | 1.83 | 1.84 | 1.79 | 1.80 | 1.80 | 1.81 | 1.82 | 1.83 |
| 153 | 0.25 | 0.45 | 0.98 | 1.38 | 1.56 | 1.65 | 1.70 | 1.73 | 1.76 | 1.77 | 1.53 | 1.58 | 1.62 | 1.65 | 1.66 | 1.68 |
| 162 | 0.15 | 0.15 | 0.25 | 0.42 | 0.63 | 0.85 | 1.06 | 1.23 | 1.37 | 1.47 | 0.27 | 0.32 | 0.37 | 0.44 | 0.50 | 0.58 |
| 171 | 0.09 | 0.07 | 0.06 | 0.07 | 0.08 | 0.10 | 0.12 | 0.15 | 0.19 | 0.21 | 0.75 | 0.79 | 0.83 | 0.89 | 0.95 | 1.00 |
| 180 | 0.81 | 0.76 | 0.72 | 0.70 | 0.71 | 0.69 | 0.69 | 0.69 | 0.71 | 0.73 | 0.75 | 0.79 | 0.83 | 0.89 | 0.95 | 1.00 |

FIG. 70

1 Cell Reflectivity Test

Lux

| Angle | 25 | 75 | 125 | 175 | 225 | 275 | 325 | 375 | 425 | 475 | 525 | 575 | 625 | 675 | 725 | 775 |
|---|---|---|---|---|---|---|---|---|---|---|---|---|---|---|---|---|
| 0 | 11.11 | 11.59 | 10.84 | 9.12 | 7.21 | 5.58 | 4.48 | 3.57 | 2.94 | 2.49 | 2.18 | 1.84 | 1.77 | 1.65 | 1.57 | 1.49 |
| 9 | 10.56 | 5.45 | 2.48 | 1.69 | 1.45 | 1.35 | 1.31 | 1.27 | 1.26 | 1.24 | 1.22 | 1.21 | 1.20 | 1.19 | 1.19 | 1.19 |
| 18 | 3.17 | 1.24 | 1.14 | 1.12 | 1.10 | 1.09 | 1.09 | 1.09 | 1.09 | 1.08 | 1.08 | 1.08 | 1.07 | 1.07 | 1.07 | 1.07 |
| 27 | 1.78 | 1.09 | 1.07 | 1.06 | 1.06 | 1.05 | 1.05 | 1.05 | 1.05 | 1.05 | 1.04 | 1.04 | 1.04 | 1.04 | 1.04 | 1.03 |
| 36 | 1.29 | 1.04 | 1.03 | 1.03 | 1.03 | 1.03 | 1.03 | 1.02 | 1.03 | 1.03 | 1.02 | 1.02 | 1.02 | 1.02 | 1.02 | 1.02 |
| 45 | 1.11 | 1.01 | 1.01 | 1.01 | 1.01 | 1.01 | 1.00 | 1.00 | 1.00 | 1.00 | 1.01 | 1.00 | 1.00 | 1.00 | 1.00 | 1.00 |
| 54 | 1.01 | 0.99 | 0.99 | 0.99 | 0.99 | 0.99 | 0.99 | 0.99 | 0.99 | 0.99 | 0.99 | 0.99 | 0.99 | 0.99 | 0.99 | 0.99 |
| 63 | 0.99 | 0.99 | 0.99 | 0.99 | 0.99 | 0.99 | 0.99 | 0.99 | 0.99 | 0.99 | 0.99 | 0.99 | 0.99 | 0.99 | 0.99 | 0.99 |
| 72 | 0.99 | 0.99 | 0.99 | 0.99 | 0.99 | 0.98 | 0.99 | 0.98 | 0.98 | 0.99 | 0.98 | 0.98 | 0.99 | 0.99 | 0.99 | 0.99 |
| 81 | 0.99 | 0.98 | 0.98 | 0.98 | 0.98 | 0.98 | 0.98 | 0.98 | 0.98 | 0.98 | 0.98 | 0.98 | 0.99 | 0.99 | 0.99 | 0.99 |
| 90 | 0.98 | 0.98 | 0.98 | 0.98 | 0.98 | 0.98 | 0.98 | 0.98 | 0.98 | 0.98 | 0.98 | 0.98 | 0.98 | 0.99 | 0.99 | 0.99 |
| 99 | 0.98 | 0.98 | 0.98 | 0.98 | 0.98 | 0.98 | 0.98 | 0.98 | 0.98 | 0.98 | 0.98 | 0.98 | 0.98 | 0.99 | 0.99 | 0.98 |
| 108 | 0.97 | 0.98 | 0.98 | 0.98 | 0.98 | 0.98 | 0.98 | 0.98 | 0.98 | 0.98 | 0.98 | 0.98 | 0.98 | 0.98 | 0.98 | 0.98 |
| 117 | 0.97 | 0.97 | 0.97 | 0.97 | 0.97 | 0.97 | 0.98 | 0.98 | 0.98 | 0.98 | 0.98 | 0.98 | 0.98 | 0.98 | 0.98 | 0.98 |
| 126 | 0.96 | 0.97 | 0.97 | 0.97 | 0.97 | 0.97 | 0.97 | 0.97 | 0.97 | 0.97 | 0.97 | 0.97 | 0.97 | 0.97 | 0.98 | 0.98 |
| 135 | 0.95 | 0.96 | 0.96 | 0.96 | 0.96 | 0.96 | 0.96 | 0.96 | 0.96 | 0.96 | 0.96 | 0.96 | 0.96 | 0.96 | 0.96 | 0.96 |
| 144 | 0.93 | 0.94 | 0.94 | 0.94 | 0.95 | 0.95 | 0.96 | 0.96 | 0.96 | 0.96 | 0.96 | 0.96 | 0.96 | 0.96 | 0.96 | 0.96 |
| 153 | 0.91 | 0.91 | 0.92 | 0.94 | 0.95 | 0.96 | 0.96 | 0.96 | 0.96 | 0.96 | 0.92 | 0.92 | 0.93 | 0.93 | 0.93 | 0.94 |
| 162 | 0.86 | 0.82 | 0.80 | 0.80 | 0.80 | 0.81 | 0.86 | 0.89 | 0.91 | 0.91 | 0.92 | 0.92 | 0.92 | 0.92 | 0.93 | 0.94 |
| 171 | 0.80 | 0.65 | 0.60 | 0.69 | 0.76 | 2.47 | 2.36 | 2.23 | 2.07 | 1.90 | 1.73 | 1.60 | 1.49 | 1.39 | 1.32 | 1.25 |
| 180 | 2.39 | 2.66 | 2.58 | 2.59 | 2.55 | 2.47 | 2.36 | 2.23 | 2.07 | 1.90 | 1.73 | 1.60 | 1.49 | 1.39 | 1.32 | 1.25 |

FIG. 71

1 Cell with Reflective Surface to 1 Normal Cell Power Ratio

| Angle | \multicolumn{16}{c}{Lux} |
|---|---|---|---|---|---|---|---|---|---|---|---|---|---|---|---|---|

| Angle | 25 | 75 | 125 | 175 | 225 | 275 | 325 | 375 | 425 | 475 | 525 | 575 | 625 | 675 | 725 | 775 |
|---|---|---|---|---|---|---|---|---|---|---|---|---|---|---|---|---|
| 0 | 0.34 | 0.33 | 0.32 | 0.32 | 0.32 | 0.33 | 0.34 | 0.34 | 0.34 | 0.36 | 0.38 | 0.40 | 0.43 | 0.46 | 0.50 | 0.54 |
| 9 | 0.15 | 0.14 | 0.16 | 0.19 | 0.25 | 0.32 | 0.40 | 0.49 | 0.56 | 0.62 | 0.67 | 0.70 | 0.73 | 0.75 | 0.76 | 0.78 |
| 18 | 0.16 | 0.33 | 0.63 | 0.75 | 0.79 | 0.82 | 0.83 | 0.84 | 0.85 | 0.86 | 0.86 | 0.87 | 0.87 | 0.87 | 0.88 | 0.88 |
| 27 | 0.20 | 0.67 | 0.81 | 0.84 | 0.86 | 0.87 | 0.87 | 0.88 | 0.88 | 0.89 | 0.89 | 0.89 | 0.89 | 0.90 | 0.90 | 0.90 |
| 36 | 0.25 | 0.78 | 0.85 | 0.86 | 0.88 | 0.88 | 0.88 | 0.89 | 0.89 | 0.90 | 0.90 | 0.90 | 0.90 | 0.90 | 0.91 | 0.91 |
| 45 | 0.30 | 0.81 | 0.86 | 0.87 | 0.88 | 0.89 | 0.89 | 0.89 | 0.90 | 0.90 | 0.90 | 0.90 | 0.90 | 0.91 | 0.91 | 0.91 |
| 54 | 0.33 | 0.82 | 0.86 | 0.88 | 0.89 | 0.89 | 0.89 | 0.90 | 0.90 | 0.90 | 0.90 | 0.91 | 0.91 | 0.91 | 0.91 | 0.91 |
| 63 | 0.36 | 0.83 | 0.87 | 0.88 | 0.89 | 0.89 | 0.89 | 0.89 | 0.90 | 0.90 | 0.91 | 0.90 | 0.91 | 0.91 | 0.91 | 0.91 |
| 72 | 0.36 | 0.83 | 0.87 | 0.88 | 0.89 | 0.89 | 0.90 | 0.90 | 0.90 | 0.90 | 0.90 | 0.91 | 0.91 | 0.91 | 0.91 | 0.91 |
| 81 | 0.35 | 0.83 | 0.87 | 0.88 | 0.89 | 0.89 | 0.89 | 0.90 | 0.90 | 0.90 | 0.90 | 0.91 | 0.91 | 0.91 | 0.91 | 0.91 |
| 90 | 0.34 | 0.82 | 0.86 | 0.88 | 0.89 | 0.89 | 0.89 | 0.90 | 0.90 | 0.90 | 0.90 | 0.90 | 0.90 | 0.91 | 0.91 | 0.91 |
| 99 | 0.31 | 0.81 | 0.86 | 0.88 | 0.88 | 0.89 | 0.89 | 0.89 | 0.89 | 0.90 | 0.90 | 0.90 | 0.90 | 0.91 | 0.91 | 0.91 |
| 108 | 0.28 | 0.80 | 0.85 | 0.87 | 0.88 | 0.88 | 0.89 | 0.89 | 0.89 | 0.90 | 0.90 | 0.90 | 0.90 | 0.91 | 0.91 | 0.91 |
| 117 | 0.25 | 0.78 | 0.84 | 0.87 | 0.88 | 0.88 | 0.89 | 0.89 | 0.89 | 0.89 | 0.90 | 0.90 | 0.90 | 0.90 | 0.90 | 0.90 |
| 126 | 0.23 | 0.73 | 0.83 | 0.86 | 0.87 | 0.87 | 0.88 | 0.88 | 0.89 | 0.89 | 0.89 | 0.90 | 0.90 | 0.90 | 0.90 | 0.90 |
| 135 | 0.21 | 0.66 | 0.81 | 0.84 | 0.86 | 0.86 | 0.87 | 0.88 | 0.88 | 0.88 | 0.89 | 0.89 | 0.89 | 0.90 | 0.90 | 0.89 |
| 144 | 0.19 | 0.51 | 0.75 | 0.81 | 0.84 | 0.85 | 0.85 | 0.86 | 0.87 | 0.88 | 0.88 | 0.88 | 0.88 | 0.89 | 0.89 | 0.88 |
| 153 | 0.16 | 0.31 | 0.59 | 0.73 | 0.78 | 0.81 | 0.83 | 0.84 | 0.85 | 0.85 | 0.86 | 0.86 | 0.87 | 0.87 | 0.87 | 0.86 |
| 162 | 0.14 | 0.16 | 0.27 | 0.43 | 0.57 | 0.66 | 0.71 | 0.75 | 0.77 | 0.79 | 0.80 | 0.81 | 0.82 | 0.83 | 0.83 | 0.83 |
| 171 | 0.60 | 0.60 | 0.61 | 0.65 | 0.73 | 0.80 | 0.85 | 0.88 | 0.90 | 0.91 | 0.92 | 0.93 | 0.93 | 0.94 | 0.94 | 0.93 |
| 180 | 4.37 | 4.66 | 4.56 | 4.49 | 4.31 | 3.97 | 3.56 | 3.11 | 2.69 | 2.35 | 2.06 | 1.86 | 1.69 | 1.56 | 1.48 | 1.54 |

FIG. 72

2 Cell with 1 Reflective Surface to 2 Normal Cell Power Ratio

| Angle | Lux | | | | | | | | | | | | | | | |
|---|---|---|---|---|---|---|---|---|---|---|---|---|---|---|---|---|
| | 25 | 75 | 125 | 175 | 225 | 275 | 325 | 375 | 425 | 475 | 525 | 575 | 625 | 675 | 725 | 775 |
| 0 | 0.15 | 0.12 | 0.11 | 0.11 | 0.11 | 0.11 | 0.11 | 0.11 | 0.11 | 0.10 | 0.10 | 0.10 | 0.10 | 0.11 | 0.12 | 0.13 |
| 9 | 0.22 | 0.12 | 0.15 | 0.24 | 0.36 | 0.50 | 0.64 | 0.73 | 0.78 | 0.81 | 0.82 | 0.84 | 0.85 | 0.85 | 0.86 | 0.86 |
| 18 | 0.21 | 0.27 | 0.60 | 0.81 | 0.85 | 0.87 | 0.88 | 0.89 | 0.90 | 0.90 | 0.90 | 0.91 | 0.91 | 0.91 | 0.91 | 0.92 |
| 27 | 0.20 | 0.51 | 0.84 | 0.88 | 0.90 | 0.91 | 0.91 | 0.92 | 0.92 | 0.92 | 0.92 | 0.93 | 0.93 | 0.93 | 0.93 | 0.93 |
| 36 | 0.21 | 0.68 | 0.88 | 0.90 | 0.91 | 0.92 | 0.92 | 0.93 | 0.93 | 0.93 | 0.93 | 0.93 | 0.94 | 0.94 | 0.94 | 0.94 |
| 45 | 0.22 | 0.76 | 0.89 | 0.91 | 0.92 | 0.93 | 0.93 | 0.93 | 0.94 | 0.94 | 0.94 | 0.94 | 0.94 | 0.94 | 0.94 | 0.95 |
| 54 | 0.23 | 0.77 | 0.89 | 0.91 | 0.92 | 0.93 | 0.93 | 0.93 | 0.94 | 0.94 | 0.94 | 0.94 | 0.94 | 0.95 | 0.95 | 0.95 |
| 63 | 0.23 | 0.79 | 0.90 | 0.92 | 0.92 | 0.93 | 0.93 | 0.94 | 0.94 | 0.94 | 0.94 | 0.94 | 0.95 | 0.95 | 0.95 | 0.95 |
| 72 | 0.24 | 0.79 | 0.90 | 0.92 | 0.93 | 0.94 | 0.94 | 0.94 | 0.94 | 0.94 | 0.95 | 0.95 | 0.95 | 0.95 | 0.95 | 0.95 |
| 81 | 0.24 | 0.77 | 0.90 | 0.92 | 0.93 | 0.94 | 0.94 | 0.94 | 0.95 | 0.95 | 0.95 | 0.95 | 0.95 | 0.95 | 0.95 | 0.96 |
| 90 | 0.24 | 0.74 | 0.90 | 0.92 | 0.93 | 0.94 | 0.94 | 0.94 | 0.95 | 0.95 | 0.95 | 0.95 | 0.95 | 0.95 | 0.96 | 0.96 |
| 99 | 0.24 | 0.68 | 0.89 | 0.92 | 0.93 | 0.94 | 0.94 | 0.94 | 0.95 | 0.95 | 0.95 | 0.95 | 0.95 | 0.96 | 0.96 | 0.96 |
| 108 | 0.24 | 0.60 | 0.88 | 0.92 | 0.93 | 0.94 | 0.94 | 0.94 | 0.95 | 0.95 | 0.95 | 0.95 | 0.95 | 0.96 | 0.96 | 0.96 |
| 117 | 0.24 | 0.50 | 0.85 | 0.91 | 0.93 | 0.93 | 0.94 | 0.94 | 0.95 | 0.95 | 0.95 | 0.95 | 0.95 | 0.96 | 0.96 | 0.96 |
| 126 | 0.24 | 0.40 | 0.78 | 0.89 | 0.92 | 0.93 | 0.94 | 0.94 | 0.94 | 0.95 | 0.95 | 0.95 | 0.95 | 0.95 | 0.96 | 0.96 |
| 135 | 0.24 | 0.32 | 0.62 | 0.84 | 0.89 | 0.92 | 0.93 | 0.93 | 0.94 | 0.94 | 0.94 | 0.95 | 0.95 | 0.95 | 0.95 | 0.95 |
| 144 | 0.25 | 0.27 | 0.42 | 0.66 | 0.83 | 0.88 | 0.91 | 0.92 | 0.93 | 0.93 | 0.94 | 0.94 | 0.94 | 0.95 | 0.95 | 0.95 |
| 153 | 0.26 | 0.27 | 0.29 | 0.38 | 0.51 | 0.66 | 0.78 | 0.85 | 0.88 | 0.90 | 0.91 | 0.92 | 0.93 | 0.93 | 0.94 | 0.94 |
| 162 | 0.32 | 0.35 | 0.36 | 0.36 | 0.36 | 0.38 | 0.41 | 0.45 | 0.51 | 0.58 | 0.67 | 0.74 | 0.80 | 0.85 | 0.87 | 0.89 |
| 171 | 1.28 | 1.44 | 1.48 | 1.50 | 1.50 | 1.52 | 1.52 | 1.53 | 1.53 | 1.53 | 1.53 | 1.53 | 1.52 | 1.51 | 1.49 | 1.47 |
| 180 | 1.15 | 0.92 | 0.90 | 0.89 | 0.87 | 0.88 | 0.89 | 0.89 | 0.88 | 0.88 | 0.88 | 0.88 | 0.88 | 0.88 | 0.89 | 0.89 |

FIG. 73

2 Cell with 2 Reflective Surface to 2 Normal Cell Power Ratio

| Angle | Lux | | | | | | | | | | | | | | | |
|---|---|---|---|---|---|---|---|---|---|---|---|---|---|---|---|---|
| | 25 | 75 | 125 | 175 | 225 | 275 | 325 | 375 | 425 | 475 | 525 | 575 | 625 | 675 | 725 | 775 |
| 0 | 0.18 | 0.17 | 0.17 | 0.16 | 0.16 | 0.16 | 0.16 | 0.16 | 0.16 | 0.15 | 0.16 | 0.15 | 0.16 | 0.17 | 0.18 | 0.20 |
| 9 | 0.09 | 0.09 | 0.11 | 0.18 | 0.28 | 0.38 | 0.50 | 0.61 | 0.69 | 0.73 | 0.77 | 0.78 | 0.80 | 0.80 | 0.82 | 0.83 |
| 18 | 0.16 | 0.26 | 0.57 | 0.76 | 0.82 | 0.85 | 0.86 | 0.87 | 0.88 | 0.89 | 0.89 | 0.90 | 0.90 | 0.90 | 0.91 | 0.91 |
| 27 | 0.22 | 0.54 | 0.79 | 0.86 | 0.88 | 0.89 | 0.90 | 0.91 | 0.91 | 0.92 | 0.92 | 0.92 | 0.92 | 0.93 | 0.93 | 0.93 |
| 36 | 0.23 | 0.65 | 0.83 | 0.87 | 0.89 | 0.90 | 0.91 | 0.91 | 0.92 | 0.92 | 0.92 | 0.92 | 0.93 | 0.93 | 0.93 | 0.93 |
| 45 | 0.22 | 0.68 | 0.84 | 0.87 | 0.89 | 0.90 | 0.91 | 0.91 | 0.92 | 0.92 | 0.92 | 0.92 | 0.92 | 0.93 | 0.93 | 0.93 |
| 54 | 0.21 | 0.66 | 0.83 | 0.86 | 0.88 | 0.89 | 0.90 | 0.90 | 0.91 | 0.91 | 0.92 | 0.92 | 0.92 | 0.92 | 0.93 | 0.93 |
| 63 | 0.21 | 0.65 | 0.82 | 0.86 | 0.88 | 0.89 | 0.90 | 0.90 | 0.91 | 0.91 | 0.91 | 0.92 | 0.92 | 0.92 | 0.92 | 0.92 |
| 72 | 0.22 | 0.65 | 0.82 | 0.86 | 0.88 | 0.89 | 0.90 | 0.90 | 0.91 | 0.91 | 0.91 | 0.91 | 0.91 | 0.92 | 0.92 | 0.92 |
| 81 | 0.22 | 0.63 | 0.82 | 0.86 | 0.88 | 0.89 | 0.90 | 0.90 | 0.90 | 0.91 | 0.91 | 0.91 | 0.92 | 0.92 | 0.92 | 0.92 |
| 90 | 0.22 | 0.60 | 0.81 | 0.86 | 0.88 | 0.89 | 0.89 | 0.90 | 0.90 | 0.91 | 0.91 | 0.91 | 0.91 | 0.92 | 0.92 | 0.92 |
| 99 | 0.21 | 0.55 | 0.79 | 0.85 | 0.87 | 0.88 | 0.89 | 0.90 | 0.90 | 0.90 | 0.91 | 0.91 | 0.91 | 0.92 | 0.92 | 0.92 |
| 108 | 0.21 | 0.49 | 0.76 | 0.84 | 0.87 | 0.88 | 0.89 | 0.90 | 0.90 | 0.90 | 0.91 | 0.91 | 0.91 | 0.91 | 0.92 | 0.92 |
| 117 | 0.21 | 0.41 | 0.70 | 0.81 | 0.85 | 0.86 | 0.88 | 0.89 | 0.90 | 0.90 | 0.90 | 0.91 | 0.91 | 0.91 | 0.91 | 0.91 |
| 126 | 0.20 | 0.32 | 0.61 | 0.76 | 0.81 | 0.84 | 0.86 | 0.87 | 0.88 | 0.89 | 0.89 | 0.90 | 0.90 | 0.90 | 0.91 | 0.91 |
| 135 | 0.19 | 0.24 | 0.46 | 0.65 | 0.76 | 0.81 | 0.84 | 0.85 | 0.86 | 0.87 | 0.88 | 0.89 | 0.89 | 0.90 | 0.90 | 0.90 |
| 144 | 0.18 | 0.18 | 0.27 | 0.43 | 0.58 | 0.69 | 0.76 | 0.80 | 0.82 | 0.84 | 0.85 | 0.86 | 0.87 | 0.87 | 0.88 | 0.89 |
| 153 | 0.15 | 0.14 | 0.14 | 0.18 | 0.25 | 0.33 | 0.42 | 0.51 | 0.59 | 0.66 | 0.72 | 0.75 | 0.78 | 0.80 | 0.82 | 0.83 |
| 162 | 0.12 | 0.10 | 0.09 | 0.09 | 0.09 | 0.09 | 0.09 | 0.10 | 0.12 | 0.14 | 0.16 | 0.18 | 0.21 | 0.24 | 0.28 | 0.32 |
| 171 | 0.28 | 0.22 | 0.20 | 0.19 | 0.18 | 0.18 | 0.17 | 0.17 | 0.17 | 0.17 | 0.17 | 0.17 | 0.17 | 0.17 | 0.17 | 0.17 |
| 180 | 0.33 | 0.21 | 0.20 | 0.19 | 0.19 | 0.19 | 0.18 | 0.18 | 0.18 | 0.18 | 0.18 | 0.18 | 0.18 | 0.18 | 0.18 | 0.18 |

FIG. 74

| 1 Cell Normalized Green LED Test |||||||||||||||||
|---|---|---|---|---|---|---|---|---|---|---|---|---|---|---|---|---|
| | Lux |||||||||||||||| 
| Angle | 25 | 75 | 125 | 175 | 225 | 275 | 325 | 375 | 425 | 475 | 525 | 575 | 625 | 675 | 725 | 775 |
| 0 | 0.84 | 0.44 | 0.39 | 0.35 | 0.32 | 0.31 | 0.29 | 0.29 | 0.28 | 0.27 | 0.29 | 0.32 | 0.33 | 0.35 | 0.37 | 0.40 |
| 9 | 2.18 | 1.05 | 0.96 | 0.93 | 0.93 | 0.94 | 0.94 | 0.95 | 0.95 | 0.95 | 0.95 | 0.95 | 0.95 | 0.95 | 0.95 | 0.95 |
| 18 | 0.81 | 0.70 | 0.85 | 0.88 | 0.89 | 0.90 | 0.90 | 0.91 | 0.91 | 0.91 | 0.91 | 0.91 | 0.91 | 0.91 | 0.91 | 0.91 |
| 27 | 0.62 | 0.80 | 0.87 | 0.89 | 0.90 | 0.90 | 0.90 | 0.90 | 0.90 | 0.90 | 0.90 | 0.90 | 0.90 | 0.90 | 0.90 | 0.90 |
| 36 | 0.61 | 0.84 | 0.88 | 0.89 | 0.89 | 0.90 | 0.89 | 0.89 | 0.90 | 0.90 | 0.90 | 0.90 | 0.90 | 0.90 | 0.90 | 0.90 |
| 45 | 0.63 | 0.85 | 0.88 | 0.89 | 0.89 | 0.89 | 0.89 | 0.89 | 0.89 | 0.90 | 0.89 | 0.90 | 0.90 | 0.90 | 0.90 | 0.90 |
| 54 | 0.66 | 0.85 | 0.88 | 0.89 | 0.89 | 0.89 | 0.89 | 0.89 | 0.90 | 0.89 | 0.89 | 0.89 | 0.90 | 0.90 | 0.90 | 0.90 |
| 63 | 0.66 | 0.85 | 0.88 | 0.89 | 0.89 | 0.89 | 0.89 | 0.89 | 0.89 | 0.89 | 0.89 | 0.89 | 0.89 | 0.90 | 0.90 | 0.89 |
| 72 | 0.65 | 0.85 | 0.88 | 0.89 | 0.89 | 0.89 | 0.89 | 0.89 | 0.89 | 0.89 | 0.89 | 0.89 | 0.89 | 0.89 | 0.89 | 0.90 |
| 81 | 0.64 | 0.85 | 0.88 | 0.89 | 0.89 | 0.89 | 0.89 | 0.89 | 0.89 | 0.89 | 0.89 | 0.89 | 0.89 | 0.89 | 0.89 | 0.89 |
| 90 | 0.60 | 0.84 | 0.87 | 0.88 | 0.88 | 0.88 | 0.88 | 0.88 | 0.88 | 0.88 | 0.89 | 0.88 | 0.89 | 0.89 | 0.89 | 0.89 |
| 99 | 0.56 | 0.82 | 0.86 | 0.87 | 0.87 | 0.88 | 0.88 | 0.88 | 0.88 | 0.88 | 0.88 | 0.88 | 0.88 | 0.89 | 0.89 | 0.89 |
| 108 | 0.51 | 0.80 | 0.85 | 0.86 | 0.87 | 0.87 | 0.88 | 0.88 | 0.88 | 0.88 | 0.88 | 0.88 | 0.88 | 0.88 | 0.88 | 0.89 |
| 117 | 0.45 | 0.77 | 0.84 | 0.85 | 0.86 | 0.87 | 0.87 | 0.87 | 0.87 | 0.87 | 0.87 | 0.88 | 0.88 | 0.88 | 0.88 | 0.88 |
| 126 | 0.40 | 0.72 | 0.81 | 0.84 | 0.85 | 0.85 | 0.86 | 0.86 | 0.86 | 0.86 | 0.87 | 0.87 | 0.87 | 0.87 | 0.87 | 0.87 |
| 135 | 0.36 | 0.62 | 0.78 | 0.81 | 0.83 | 0.84 | 0.84 | 0.85 | 0.85 | 0.85 | 0.85 | 0.86 | 0.86 | 0.86 | 0.86 | 0.86 |
| 144 | 0.32 | 0.45 | 0.69 | 0.76 | 0.80 | 0.81 | 0.81 | 0.82 | 0.83 | 0.83 | 0.83 | 0.84 | 0.84 | 0.84 | 0.85 | 0.85 |
| 153 | 0.27 | 0.26 | 0.48 | 0.64 | 0.70 | 0.74 | 0.76 | 0.77 | 0.78 | 0.79 | 0.80 | 0.80 | 0.81 | 0.81 | 0.82 | 0.82 |
| 162 | 0.20 | 0.12 | 0.13 | 0.26 | 0.37 | 0.46 | 0.53 | 0.58 | 0.61 | 0.66 | 0.68 | 0.70 | 0.72 | 0.73 | 0.74 | 0.75 |
| 171 | 0.12 | 0.06 | 0.06 | 0.06 | 0.06 | 0.07 | 0.09 | 0.10 | 0.12 | 0.14 | 0.16 | 0.19 | 0.21 | 0.24 | 0.26 | 0.28 |
| 180 | 0.67 | 0.37 | 0.31 | 0.28 | 0.27 | 0.25 | 0.24 | 0.23 | 0.23 | 0.22 | 0.22 | 0.22 | 0.23 | 0.24 | 0.25 | 0.26 |

FIG. 75

| | \multicolumn{16}{c|}{1 Cell Normalized Blue LED Test} |
| --- | --- |

| | \multicolumn{16}{c|}{Lux} |
| Angle | 25 | 75 | 125 | 175 | 225 | 275 | 325 | 375 | 425 | 475 | 525 | 575 | 625 | 675 | 725 | 775 |
| --- | --- | --- | --- | --- | --- | --- | --- | --- | --- | --- | --- | --- | --- | --- | --- | --- |
| 0 | 4.34 | 3.72 | 3.46 | 3.25 | 3.10 | 2.91 | 2.71 | 2.45 | 2.19 | 1.95 | 1.76 | 1.61 | 1.50 | 1.42 | 1.36 | 1.31 |
| 9 | 6.02 | 3.87 | 2.16 | 1.54 | 1.34 | 1.26 | 1.22 | 1.20 | 1.18 | 1.17 | 1.16 | 1.15 | 1.15 | 1.13 | 1.13 | 1.13 |
| 18 | 1.67 | 1.09 | 1.05 | 1.04 | 1.03 | 1.03 | 1.03 | 1.03 | 1.03 | 1.03 | 1.03 | 1.03 | 1.02 | 1.02 | 1.02 | 1.02 |
| 27 | 1.11 | 1.00 | 1.00 | 1.00 | 1.00 | 0.99 | 1.00 | 1.00 | 1.00 | 1.00 | 1.00 | 0.99 | 0.99 | 1.00 | 0.99 | 0.99 |
| 36 | 0.97 | 0.98 | 0.98 | 0.98 | 0.98 | 0.98 | 0.98 | 0.98 | 0.98 | 0.98 | 0.98 | 0.98 | 0.98 | 0.98 | 0.98 | 0.98 |
| 45 | 0.95 | 0.98 | 0.97 | 0.97 | 0.97 | 0.97 | 0.97 | 0.97 | 0.98 | 0.98 | 0.98 | 0.98 | 0.98 | 0.98 | 0.98 | 0.98 |
| 54 | 0.93 | 0.97 | 0.96 | 0.97 | 0.97 | 0.97 | 0.97 | 0.97 | 0.97 | 0.97 | 0.97 | 0.97 | 0.97 | 0.97 | 0.97 | 0.97 |
| 63 | 0.92 | 0.96 | 0.96 | 0.97 | 0.96 | 0.97 | 0.96 | 0.96 | 0.97 | 0.97 | 0.97 | 0.97 | 0.97 | 0.97 | 0.97 | 0.97 |
| 72 | 0.90 | 0.96 | 0.96 | 0.96 | 0.96 | 0.96 | 0.96 | 0.96 | 0.96 | 0.96 | 0.96 | 0.96 | 0.97 | 0.97 | 0.96 | 0.97 |
| 81 | 0.89 | 0.95 | 0.96 | 0.96 | 0.96 | 0.96 | 0.96 | 0.96 | 0.96 | 0.96 | 0.96 | 0.96 | 0.96 | 0.96 | 0.96 | 0.96 |
| 90 | 0.86 | 0.94 | 0.95 | 0.95 | 0.95 | 0.95 | 0.96 | 0.96 | 0.95 | 0.95 | 0.96 | 0.96 | 0.96 | 0.96 | 0.96 | 0.96 |
| 99 | 0.82 | 0.94 | 0.95 | 0.95 | 0.95 | 0.95 | 0.95 | 0.95 | 0.95 | 0.95 | 0.95 | 0.95 | 0.96 | 0.96 | 0.96 | 0.96 |
| 108 | 0.76 | 0.93 | 0.94 | 0.94 | 0.94 | 0.94 | 0.95 | 0.95 | 0.95 | 0.95 | 0.95 | 0.95 | 0.95 | 0.95 | 0.95 | 0.96 |
| 117 | 0.69 | 0.91 | 0.93 | 0.93 | 0.93 | 0.94 | 0.94 | 0.94 | 0.94 | 0.94 | 0.95 | 0.95 | 0.95 | 0.95 | 0.95 | 0.95 |
| 126 | 0.61 | 0.89 | 0.91 | 0.92 | 0.93 | 0.93 | 0.93 | 0.93 | 0.93 | 0.94 | 0.94 | 0.94 | 0.94 | 0.94 | 0.94 | 0.95 |
| 135 | 0.53 | 0.84 | 0.89 | 0.91 | 0.92 | 0.92 | 0.92 | 0.92 | 0.92 | 0.93 | 0.93 | 0.93 | 0.93 | 0.93 | 0.93 | 0.93 |
| 144 | 0.44 | 0.74 | 0.85 | 0.88 | 0.89 | 0.90 | 0.90 | 0.91 | 0.91 | 0.91 | 0.91 | 0.92 | 0.92 | 0.92 | 0.92 | 0.93 |
| 153 | 0.33 | 0.47 | 0.72 | 0.80 | 0.83 | 0.85 | 0.86 | 0.87 | 0.88 | 0.88 | 0.88 | 0.89 | 0.89 | 0.90 | 0.90 | 0.90 |
| 162 | 0.20 | 0.19 | 0.30 | 0.45 | 0.58 | 0.66 | 0.72 | 0.75 | 0.77 | 0.79 | 0.80 | 0.81 | 0.82 | 0.83 | 0.83 | 0.84 |
| 171 | 0.12 | 0.10 | 0.10 | 0.10 | 0.12 | 0.15 | 0.18 | 0.22 | 0.27 | 0.32 | 0.37 | 0.42 | 0.48 | 0.53 | 0.57 | 0.61 |
| 180 | 0.83 | 0.75 | 0.69 | 0.68 | 0.67 | 0.66 | 0.65 | 0.65 | 0.65 | 0.66 | 0.67 | 0.69 | 0.71 | 0.74 | 0.77 | 0.79 |

FIG. 76

2 Cell Normalized Green LED Test

| Angle | Lux | | | | | | | | | | | | | | | |
|---|---|---|---|---|---|---|---|---|---|---|---|---|---|---|---|---|
| | 25 | 75 | 125 | 175 | 225 | 275 | 325 | 375 | 425 | 475 | 525 | 575 | 625 | 675 | 725 | 775 |
| 0 | 0.41 | 0.22 | 0.19 | 0.17 | 0.16 | 0.15 | 0.15 | 0.15 | 0.15 | 0.15 | 0.16 | 0.17 | 0.18 | 0.19 | 0.21 | 0.23 |
| 9 | 0.26 | 0.50 | 0.65 | 0.69 | 0.73 | 0.76 | 0.77 | 0.79 | 0.79 | 0.80 | 0.81 | 0.81 | 0.82 | 0.81 | 0.82 | 0.82 |
| 18 | 0.38 | 0.69 | 0.80 | 0.83 | 0.84 | 0.85 | 0.85 | 0.85 | 0.86 | 0.86 | 0.86 | 0.86 | 0.86 | 0.86 | 0.87 | 0.87 |
| 27 | 0.49 | 0.80 | 0.85 | 0.86 | 0.87 | 0.87 | 0.87 | 0.87 | 0.88 | 0.88 | 0.88 | 0.88 | 0.88 | 0.89 | 0.89 | 0.89 |
| 36 | 0.59 | 0.84 | 0.87 | 0.89 | 0.88 | 0.88 | 0.89 | 0.89 | 0.89 | 0.89 | 0.89 | 0.89 | 0.89 | 0.89 | 0.89 | 0.89 |
| 45 | 0.65 | 0.85 | 0.88 | 0.89 | 0.89 | 0.89 | 0.89 | 0.89 | 0.89 | 0.89 | 0.90 | 0.90 | 0.90 | 0.90 | 0.90 | 0.90 |
| 54 | 0.67 | 0.86 | 0.89 | 0.89 | 0.89 | 0.90 | 0.90 | 0.90 | 0.90 | 0.90 | 0.90 | 0.90 | 0.90 | 0.90 | 0.90 | 0.91 |
| 63 | 0.68 | 0.87 | 0.89 | 0.90 | 0.90 | 0.90 | 0.90 | 0.90 | 0.90 | 0.90 | 0.90 | 0.90 | 0.90 | 0.90 | 0.91 | 0.91 |
| 72 | 0.69 | 0.87 | 0.89 | 0.90 | 0.90 | 0.90 | 0.91 | 0.91 | 0.90 | 0.90 | 0.91 | 0.90 | 0.90 | 0.90 | 0.91 | 0.91 |
| 81 | 0.67 | 0.87 | 0.89 | 0.90 | 0.91 | 0.91 | 0.91 | 0.91 | 0.91 | 0.91 | 0.91 | 0.91 | 0.91 | 0.91 | 0.91 | 0.91 |
| 90 | 0.65 | 0.87 | 0.90 | 0.90 | 0.90 | 0.91 | 0.91 | 0.91 | 0.91 | 0.91 | 0.91 | 0.91 | 0.91 | 0.91 | 0.91 | 0.92 |
| 99 | 0.62 | 0.86 | 0.90 | 0.90 | 0.90 | 0.91 | 0.91 | 0.91 | 0.91 | 0.91 | 0.91 | 0.91 | 0.91 | 0.91 | 0.91 | 0.91 |
| 108 | 0.59 | 0.85 | 0.89 | 0.90 | 0.90 | 0.90 | 0.91 | 0.91 | 0.91 | 0.90 | 0.91 | 0.90 | 0.91 | 0.91 | 0.91 | 0.91 |
| 117 | 0.55 | 0.80 | 0.88 | 0.89 | 0.90 | 0.90 | 0.90 | 0.90 | 0.90 | 0.90 | 0.90 | 0.90 | 0.91 | 0.91 | 0.91 | 0.91 |
| 126 | 0.54 | 0.74 | 0.87 | 0.89 | 0.89 | 0.89 | 0.90 | 0.90 | 0.90 | 0.90 | 0.90 | 0.90 | 0.90 | 0.90 | 0.91 | 0.91 |
| 135 | 0.52 | 0.71 | 0.84 | 0.87 | 0.88 | 0.89 | 0.89 | 0.89 | 0.90 | 0.89 | 0.89 | 0.89 | 0.90 | 0.90 | 0.90 | 0.90 |
| 144 | 0.54 | 0.57 | 0.79 | 0.84 | 0.86 | 0.87 | 0.88 | 0.88 | 0.89 | 0.89 | 0.89 | 0.89 | 0.89 | 0.89 | 0.90 | 0.90 |
| 153 | 0.53 | 0.42 | 0.64 | 0.76 | 0.82 | 0.84 | 0.86 | 0.87 | 0.87 | 0.88 | 0.88 | 0.89 | 0.89 | 0.89 | 0.89 | 0.90 |
| 162 | 0.38 | 0.46 | 0.46 | 0.55 | 0.63 | 0.71 | 0.77 | 0.80 | 0.82 | 0.84 | 0.85 | 0.86 | 0.87 | 0.87 | 0.88 | 0.88 |
| 171 | 0.41 | 0.22 | 0.21 | 0.22 | 0.26 | 0.30 | 0.36 | 0.42 | 0.47 | 0.53 | 0.58 | 0.62 | 0.65 | 0.68 | 0.71 | 0.73 |
| 180 | 0.38 | 0.20 | 0.19 | 0.20 | 0.23 | 0.28 | 0.33 | 0.38 | 0.44 | 0.49 | 0.54 | 0.59 | 0.62 | 0.65 | 0.68 | 0.70 |

FIG. 77

2 Cell Normalized Blue LED Test

| Angle | Lux 25 | 75 | 125 | 175 | 225 | 275 | 325 | 375 | 425 | 475 | 525 | 575 | 625 | 675 | 725 | 775 |
|---|---|---|---|---|---|---|---|---|---|---|---|---|---|---|---|---|
| 0 | 1.15 | 0.96 | 0.89 | 0.84 | 0.82 | 0.80 | 0.79 | 0.79 | 0.79 | 0.79 | 0.79 | 0.81 | 0.82 | 0.82 | 0.83 | 0.83 |
| 9 | 0.38 | 0.60 | 0.73 | 0.76 | 0.77 | 0.78 | 0.79 | 0.79 | 0.80 | 0.80 | 0.80 | 0.81 | 0.81 | 0.81 | 0.81 | 0.82 |
| 18 | 0.57 | 0.76 | 0.80 | 0.80 | 0.81 | 0.82 | 0.82 | 0.82 | 0.83 | 0.83 | 0.83 | 0.83 | 0.84 | 0.84 | 0.84 | 0.85 |
| 27 | 0.69 | 0.81 | 0.83 | 0.84 | 0.84 | 0.84 | 0.85 | 0.85 | 0.85 | 0.86 | 0.86 | 0.86 | 0.86 | 0.86 | 0.87 | 0.87 |
| 36 | 0.77 | 0.84 | 0.85 | 0.86 | 0.86 | 0.86 | 0.87 | 0.87 | 0.88 | 0.88 | 0.88 | 0.88 | 0.89 | 0.89 | 0.89 | 0.89 |
| 45 | 0.82 | 0.87 | 0.88 | 0.88 | 0.89 | 0.89 | 0.89 | 0.89 | 0.89 | 0.90 | 0.90 | 0.90 | 0.90 | 0.90 | 0.91 | 0.91 |
| 54 | 0.86 | 0.89 | 0.90 | 0.90 | 0.91 | 0.90 | 0.91 | 0.91 | 0.91 | 0.91 | 0.92 | 0.92 | 0.92 | 0.92 | 0.92 | 0.92 |
| 63 | 0.88 | 0.91 | 0.91 | 0.91 | 0.92 | 0.92 | 0.93 | 0.93 | 0.93 | 0.93 | 0.93 | 0.93 | 0.93 | 0.94 | 0.94 | 0.94 |
| 72 | 0.89 | 0.92 | 0.92 | 0.93 | 0.93 | 0.93 | 0.93 | 0.93 | 0.93 | 0.93 | 0.94 | 0.94 | 0.94 | 0.94 | 0.94 | 0.94 |
| 81 | 0.90 | 0.93 | 0.93 | 0.93 | 0.94 | 0.94 | 0.94 | 0.94 | 0.94 | 0.94 | 0.95 | 0.94 | 0.95 | 0.95 | 0.95 | 0.95 |
| 90 | 0.92 | 0.94 | 0.94 | 0.94 | 0.94 | 0.95 | 0.95 | 0.95 | 0.95 | 0.95 | 0.95 | 0.95 | 0.95 | 0.96 | 0.96 | 0.96 |
| 99 | 0.93 | 0.95 | 0.95 | 0.95 | 0.96 | 0.96 | 0.96 | 0.96 | 0.96 | 0.96 | 0.96 | 0.96 | 0.96 | 0.96 | 0.97 | 0.97 |
| 108 | 0.93 | 0.96 | 0.96 | 0.96 | 0.96 | 0.96 | 0.96 | 0.97 | 0.96 | 0.97 | 0.97 | 0.97 | 0.97 | 0.97 | 0.97 | 0.97 |
| 117 | 0.93 | 0.96 | 0.96 | 0.96 | 0.96 | 0.96 | 0.97 | 0.97 | 0.97 | 0.97 | 0.97 | 0.97 | 0.97 | 0.97 | 0.98 | 0.98 |
| 126 | 0.93 | 0.96 | 0.96 | 0.97 | 0.97 | 0.97 | 0.97 | 0.97 | 0.97 | 0.97 | 0.97 | 0.97 | 0.97 | 0.97 | 0.97 | 0.98 |
| 135 | 0.96 | 0.96 | 0.97 | 0.97 | 0.97 | 0.97 | 0.97 | 0.97 | 0.97 | 0.97 | 0.97 | 0.98 | 0.98 | 0.98 | 0.98 | 0.98 |
| 144 | 1.04 | 0.96 | 0.97 | 0.98 | 0.98 | 0.98 | 0.98 | 0.98 | 0.98 | 0.98 | 0.98 | 0.98 | 0.98 | 0.99 | 0.99 | 0.99 |
| 153 | 1.23 | 1.01 | 0.99 | 0.99 | 1.00 | 1.00 | 1.00 | 1.00 | 1.00 | 1.00 | 1.00 | 1.00 | 1.00 | 1.00 | 1.00 | 1.00 |
| 162 | 1.93 | 1.46 | 1.25 | 1.12 | 1.08 | 1.06 | 1.05 | 1.05 | 1.04 | 1.04 | 1.04 | 1.03 | 1.04 | 1.03 | 1.03 | 1.04 |
| 171 | 0.85 | 0.69 | 0.67 | 0.70 | 0.77 | 0.84 | 0.88 | 0.90 | 0.92 | 0.93 | 0.94 | 0.95 | 0.95 | 0.96 | 0.96 | 0.97 |
| 180 | 0.72 | 0.58 | 0.57 | 0.63 | 0.69 | 0.76 | 0.82 | 0.85 | 0.88 | 0.90 | 0.91 | 0.92 | 0.93 | 0.93 | 0.94 | 0.94 |

FIG. 78

| Green LED Performance change for Plural Setup | | | | | | | | | | | | | | | | |
|---|---|---|---|---|---|---|---|---|---|---|---|---|---|---|---|---|
| | Lux | | | | | | | | | | | | | | | |
| Angle | 25 | 75 | 125 | 175 | 225 | 275 | 325 | 375 | 425 | 475 | 525 | 575 | 625 | 675 | 725 | 775 |
| 0 | 0.49 | 0.50 | 0.49 | 0.51 | 0.50 | 0.50 | 0.52 | 0.52 | 0.54 | 0.56 | 0.55 | 0.53 | 0.54 | 0.54 | 0.56 | 0.58 |
| 9 | 0.12 | 0.28 | 0.58 | 0.73 | 0.78 | 0.80 | 0.82 | 0.83 | 0.83 | 0.84 | 0.85 | 0.85 | 0.86 | 0.86 | 0.86 | 0.86 |
| 18 | 0.48 | 0.99 | 0.94 | 0.94 | 0.94 | 0.94 | 0.94 | 0.94 | 0.95 | 0.94 | 0.94 | 0.94 | 0.95 | 0.95 | 0.95 | 0.95 |
| 27 | 0.80 | 0.99 | 0.98 | 0.97 | 0.97 | 0.98 | 0.97 | 0.97 | 0.98 | 0.98 | 0.97 | 0.98 | 0.98 | 0.98 | 0.98 | 0.98 |
| 36 | 0.98 | 1.00 | 0.99 | 0.99 | 0.99 | 0.99 | 0.99 | 0.99 | 0.99 | 0.99 | 0.99 | 0.99 | 0.99 | 0.99 | 0.99 | 0.99 |
| 45 | 1.02 | 1.00 | 1.00 | 1.00 | 1.00 | 1.00 | 1.00 | 1.00 | 1.00 | 1.00 | 1.00 | 1.00 | 1.00 | 1.00 | 1.00 | 1.00 |
| 54 | 1.01 | 1.01 | 1.01 | 1.01 | 1.00 | 1.01 | 1.00 | 1.00 | 1.01 | 1.00 | 1.01 | 1.00 | 1.00 | 1.00 | 1.00 | 1.01 |
| 63 | 1.03 | 1.02 | 1.01 | 1.01 | 1.01 | 1.01 | 1.01 | 1.01 | 1.01 | 1.01 | 1.01 | 1.01 | 1.01 | 1.01 | 1.01 | 1.02 |
| 72 | 1.04 | 1.02 | 1.02 | 1.02 | 1.02 | 1.02 | 1.01 | 1.02 | 1.02 | 1.01 | 1.02 | 1.01 | 1.01 | 1.01 | 1.02 | 1.01 |
| 81 | 1.06 | 1.03 | 1.02 | 1.02 | 1.03 | 1.03 | 1.03 | 1.03 | 1.02 | 1.02 | 1.02 | 1.02 | 1.02 | 1.02 | 1.02 | 1.02 |
| 90 | 1.09 | 1.03 | 1.03 | 1.03 | 1.02 | 1.03 | 1.03 | 1.03 | 1.03 | 1.03 | 1.03 | 1.03 | 1.02 | 1.02 | 1.02 | 1.02 |
| 99 | 1.11 | 1.05 | 1.04 | 1.03 | 1.04 | 1.04 | 1.03 | 1.03 | 1.03 | 1.03 | 1.03 | 1.02 | 1.03 | 1.02 | 1.02 | 1.02 |
| 108 | 1.16 | 1.06 | 1.04 | 1.04 | 1.04 | 1.04 | 1.03 | 1.03 | 1.03 | 1.03 | 1.03 | 1.03 | 1.03 | 1.03 | 1.03 | 1.03 |
| 117 | 1.22 | 1.07 | 1.05 | 1.05 | 1.05 | 1.04 | 1.04 | 1.04 | 1.04 | 1.04 | 1.03 | 1.03 | 1.03 | 1.03 | 1.03 | 1.04 |
| 126 | 1.31 | 1.09 | 1.06 | 1.06 | 1.05 | 1.05 | 1.04 | 1.05 | 1.05 | 1.04 | 1.04 | 1.04 | 1.04 | 1.04 | 1.04 | 1.04 |
| 135 | 1.44 | 1.14 | 1.08 | 1.07 | 1.06 | 1.07 | 1.06 | 1.05 | 1.06 | 1.05 | 1.05 | 1.05 | 1.05 | 1.05 | 1.04 | 1.04 |
| 144 | 1.71 | 1.26 | 1.13 | 1.10 | 1.08 | 1.08 | 1.08 | 1.08 | 1.07 | 1.06 | 1.07 | 1.06 | 1.06 | 1.06 | 1.06 | 1.06 |
| 153 | 2.34 | 1.65 | 1.33 | 1.21 | 1.18 | 1.14 | 1.13 | 1.12 | 1.11 | 1.10 | 1.11 | 1.09 | 1.10 | 1.09 | 1.08 | 1.09 |
| 162 | 4.31 | 3.91 | 2.50 | 1.94 | 1.70 | 1.55 | 1.45 | 1.37 | 1.31 | 1.27 | 1.25 | 1.22 | 1.21 | 1.19 | 1.19 | 1.18 |
| 171 | 3.50 | 3.73 | 5.74 | 3.97 | 4.15 | 4.18 | 4.10 | 4.04 | 3.88 | 3.77 | 3.53 | 3.33 | 3.09 | 2.89 | 2.68 | 2.50 |
| 180 | 0.57 | 0.54 | 0.60 | 0.76 | 0.84 | 1.10 | 1.37 | 1.65 | 1.92 | 2.20 | 2.44 | 2.61 | 2.68 | 2.73 | 2.69 | 2.42 |

FIG. 79

Blue LED Performance Change for Plural Setup

| Angle | Lux |||||||||||||||| 
|---|---|---|---|---|---|---|---|---|---|---|---|---|---|---|---|---|
| | 25 | 75 | 125 | 175 | 225 | 275 | 325 | 375 | 425 | 475 | 525 | 575 | 625 | 675 | 725 | 775 |
| 0 | 0.26 | 0.26 | 0.26 | 0.26 | 0.26 | 0.27 | 0.29 | 0.32 | 0.36 | 0.40 | 0.45 | 0.50 | 0.54 | 0.57 | 0.61 | 0.63 |
| 9 | 0.06 | 0.16 | 0.34 | 0.50 | 0.58 | 0.62 | 0.64 | 0.66 | 0.68 | 0.69 | 0.69 | 0.70 | 0.70 | 0.71 | 0.72 | 0.72 |
| 18 | 0.14 | 0.70 | 0.76 | 0.78 | 0.79 | 0.79 | 0.79 | 0.80 | 0.81 | 0.81 | 0.81 | 0.82 | 0.82 | 0.82 | 0.82 | 0.83 |
| 27 | 0.62 | 0.81 | 0.83 | 0.84 | 0.84 | 0.85 | 0.85 | 0.85 | 0.85 | 0.86 | 0.86 | 0.86 | 0.87 | 0.87 | 0.87 | 0.88 |
| 36 | 0.79 | 0.86 | 0.87 | 0.87 | 0.88 | 0.88 | 0.89 | 0.89 | 0.89 | 0.89 | 0.89 | 0.90 | 0.90 | 0.90 | 0.90 | 0.90 |
| 45 | 0.86 | 0.89 | 0.90 | 0.90 | 0.91 | 0.91 | 0.92 | 0.92 | 0.92 | 0.92 | 0.92 | 0.92 | 0.93 | 0.93 | 0.92 | 0.93 |
| 54 | 0.92 | 0.92 | 0.93 | 0.93 | 0.93 | 0.94 | 0.94 | 0.94 | 0.95 | 0.94 | 0.94 | 0.95 | 0.95 | 0.95 | 0.95 | 0.95 |
| 63 | 0.96 | 0.95 | 0.95 | 0.95 | 0.96 | 0.95 | 0.96 | 0.96 | 0.96 | 0.96 | 0.96 | 0.96 | 0.96 | 0.97 | 0.97 | 0.97 |
| 72 | 0.99 | 0.96 | 0.97 | 0.96 | 0.97 | 0.97 | 0.97 | 0.97 | 0.97 | 0.97 | 0.97 | 0.97 | 0.97 | 0.97 | 0.98 | 0.98 |
| 81 | 1.01 | 0.98 | 0.98 | 0.98 | 0.98 | 0.98 | 0.98 | 0.98 | 0.98 | 0.98 | 0.99 | 0.98 | 0.98 | 0.98 | 0.99 | 0.99 |
| 90 | 1.06 | 0.99 | 0.99 | 0.99 | 0.99 | 0.99 | 0.99 | 0.99 | 0.99 | 1.00 | 1.00 | 1.00 | 1.00 | 1.00 | 1.00 | 1.00 |
| 99 | 1.13 | 1.01 | 1.01 | 1.00 | 1.01 | 1.01 | 1.01 | 1.01 | 1.01 | 1.01 | 1.01 | 1.01 | 1.01 | 1.00 | 1.01 | 1.01 |
| 108 | 1.23 | 1.03 | 1.02 | 1.02 | 1.02 | 1.02 | 1.02 | 1.02 | 1.02 | 1.02 | 1.02 | 1.02 | 1.02 | 1.02 | 1.02 | 1.02 |
| 117 | 1.34 | 1.05 | 1.04 | 1.03 | 1.03 | 1.03 | 1.03 | 1.03 | 1.03 | 1.03 | 1.03 | 1.03 | 1.03 | 1.03 | 1.03 | 1.03 |
| 126 | 1.52 | 1.08 | 1.05 | 1.05 | 1.05 | 1.04 | 1.04 | 1.04 | 1.04 | 1.03 | 1.04 | 1.04 | 1.03 | 1.04 | 1.03 | 1.03 |
| 135 | 1.82 | 1.13 | 1.08 | 1.07 | 1.06 | 1.06 | 1.06 | 1.05 | 1.05 | 1.05 | 1.05 | 1.05 | 1.05 | 1.05 | 1.05 | 1.05 |
| 144 | 2.36 | 1.30 | 1.14 | 1.11 | 1.10 | 1.09 | 1.09 | 1.08 | 1.08 | 1.07 | 1.08 | 1.07 | 1.07 | 1.07 | 1.07 | 1.07 |
| 153 | 3.71 | 2.13 | 1.38 | 1.24 | 1.19 | 1.17 | 1.15 | 1.15 | 1.13 | 1.13 | 1.13 | 1.12 | 1.12 | 1.11 | 1.11 | 1.11 |
| 162 | 9.41 | 7.78 | 4.17 | 2.49 | 1.85 | 1.60 | 1.47 | 1.40 | 1.35 | 1.32 | 1.29 | 1.27 | 1.26 | 1.24 | 1.24 | 1.23 |
| 171 | 7.25 | 7.00 | 6.86 | 6.77 | 6.39 | 5.68 | 4.81 | 4.05 | 3.39 | 2.90 | 2.51 | 2.23 | 1.99 | 1.81 | 1.68 | 1.59 |
| 180 | 0.87 | 0.77 | 0.82 | 0.88 | 1.01 | 1.16 | 1.26 | 1.31 | 1.35 | 1.36 | 1.36 | 1.33 | 1.30 | 1.26 | 1.22 | 1.19 |

FIG. 80

ELECTROMAGNETIC ENERGY CONVERTER

CROSS-REFERENCE TO RELATED APPLICATIONS

This application is a continuation-in-part of International Application No. PCT/US2018/049880, filed on Sep. 7, 2018, which claims the benefit of U.S. Provisional Application No. 62/555,686, filed Sep. 8, 2017. The entire disclosure of the above application is incorporated herein by reference.

FIELD

The present disclosure relates to a device and method to improve energy conversion to power mobile or stationary devices.

BACKGROUND AND SUMMARY

This section provides background information related to the present disclosure which is not necessarily prior art. This section also provides a general summary of the disclosure, and is not a comprehensive disclosure of its full scope or all of its features.

Photovoltaic solar panels are commonly used for conversion of light energy into electricity for mobile objects may it be ground-based or air/space-based. Electromagnetic (EM) energy is widely used for powering and propelling satellites (i.e. solar sail).

With electronic circuits shrinking, energy delivery and storage are becoming more challenging. Laser communication/power delivery has been proposed as a way to create more compact and, in the case of the present teachings, 3D structures. Current solutions include monochromatic laser-illuminated flat cells, which provide lower power density output than that provided in accordance with the principles of the present teachings.

Laser power beaming uses a laser to deliver concentrated light to a remote receiver. The receiver then converts the light to electricity, much like solar powered photovoltaic (PV) cells convert sunlight into electricity.

Key differences between laser and solar illuminations are i) laser can be much more intense than the sun, ii) laser light can be directed to any place using adaptive optics, iii) laser can operate continuously and/or controlled pulses, and iv) photovoltaics can be optimized to operate with monochromatic laser emission.

Power beaming technologies receive energy from a transmitter. The transmitter power is supplied from an electrical outlet, generator, a light concentrator, and/or a power storage unit (e.g., batteries and fuel cells). The wavelength and the shape of the beam are defined by a set of optics. This light then propagates through air, the vacuum of space, and/or through fiber optic cable until it reaches the receiver. The receiver then converts the light back into electricity/heat/etc.

Wireless power delivery requires physical installations at only the transmitting and receiving points, therefore, lowering the cost while enhancing the reliability of the system. Consequently, laser power beaming has numerous advantages over solar power.

In some embodiments, the present teachings provide a device that is more efficient (power per surface area), less expensive, compact, lightweight, portable, advanced (uses the state-of-the-art technologies to increase efficiency, lower the size and weight of machines by replacing traditional energy storage/delivery by wireless compact devices), etc. than traditional converters.

Previous proposed devices and methods have addressed the technologies, materials, and fabrication processes and the cost analysis needed to achieve wireless energy delivery; however, electromagnetic energy converter and method of the present teachings aim to assemble together the existing, well-researched building blocks to enable a more affordable, more efficient and sustainable solution to the energy conversion/harvest problem.

The present teachings also provide methods for fabricating multi-dimensional solar structures that can be easily manufactured using off-the-shelf solar cells and cheap casting materials such as epoxy resin. The resulting solar structures are found to generate several times the power output of conventional solar panels per occupied surface area. The ease of manufacturing and compact nature of these structures make them particularly attractive for urban settings where available surface areas to mount large solar structures are limited and, therefore, expensive. We also find that the weight and the aerodynamics of these multi-dimensional solar structures can be modified for transportation applications. Presently, bulky conventional solar panels are rarely used aboard mobile vehicles.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Figure 20:
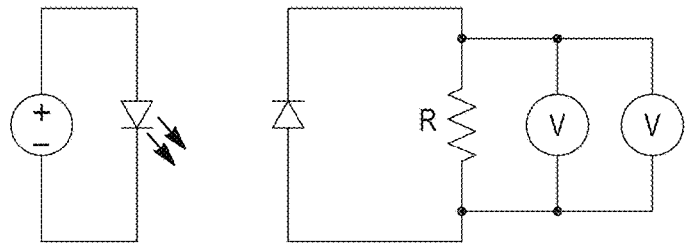

FIG. 20 is the circuit diagram for Experiment 1. The solar cell is represented by a diode and two voltmeters measure across the resistor in parallel. The two voltmeters represent that Ni USB 6009 and a handheld digital voltmeter.

Figure 21:
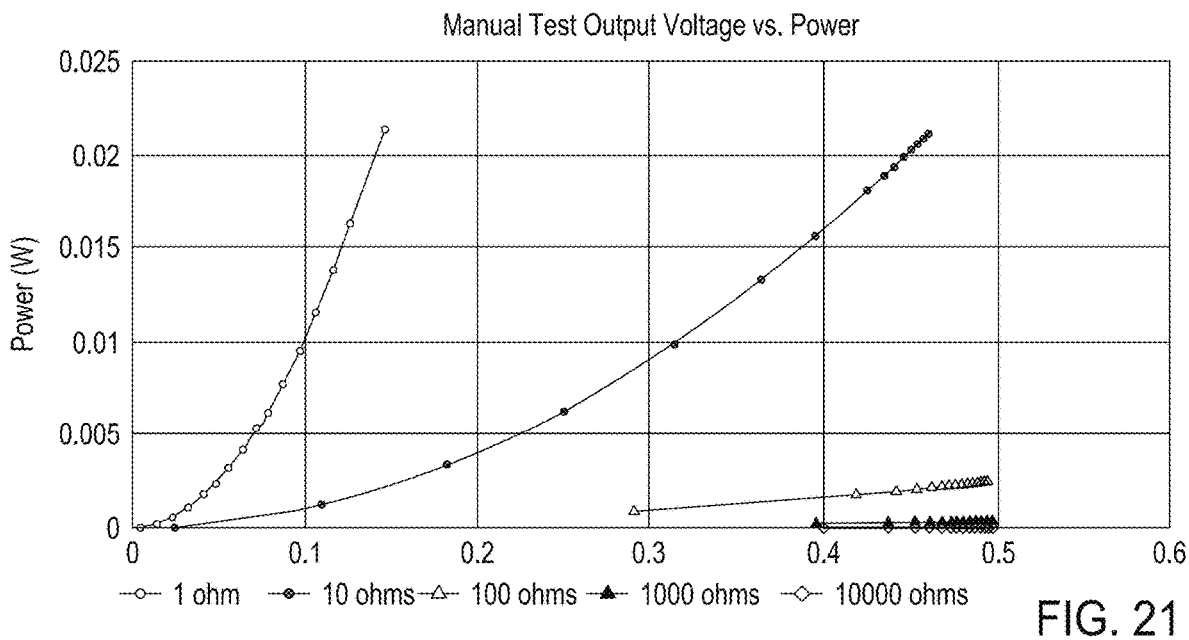

FIG. 21 shows the manual output measurements graphed as voltages vs. power. The power was calculated using the equation P=V2/R. This power equation was used because the automatic system could not measure current at the time.

Figure 22:
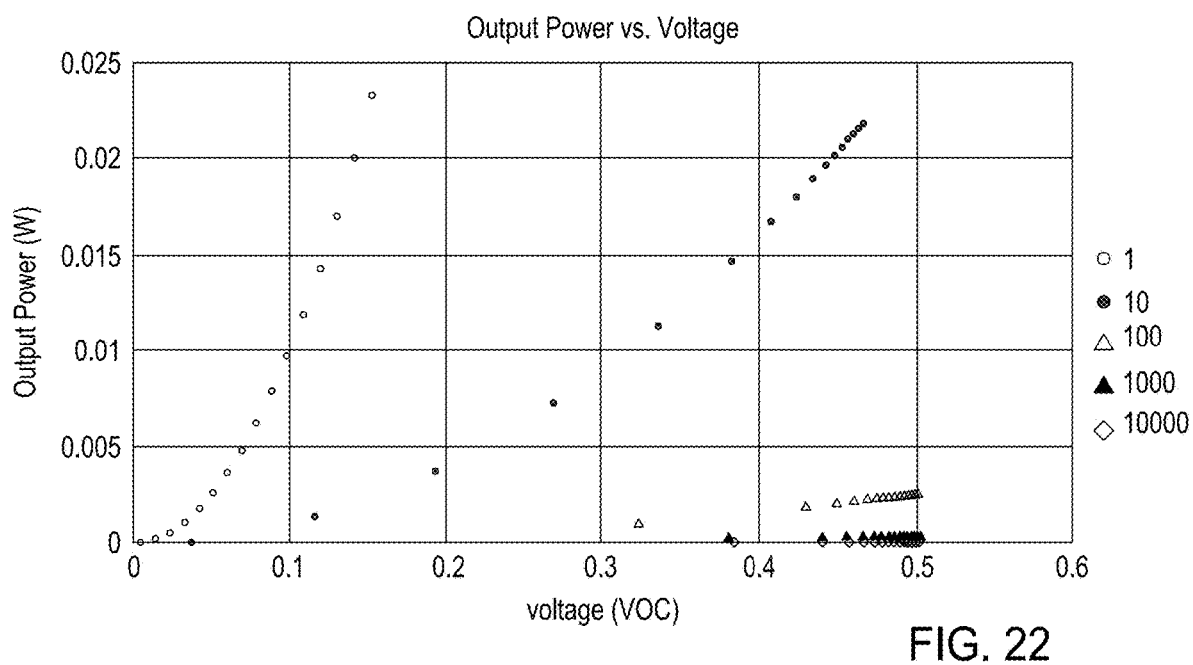

FIG. 22 shows the automatic output measurements graphed as voltage vs. power.

Figure 23:
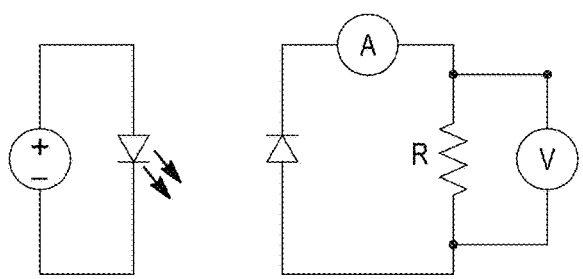

FIG. 23 is the circuit diagram for Experiment 2.

Figure 24:
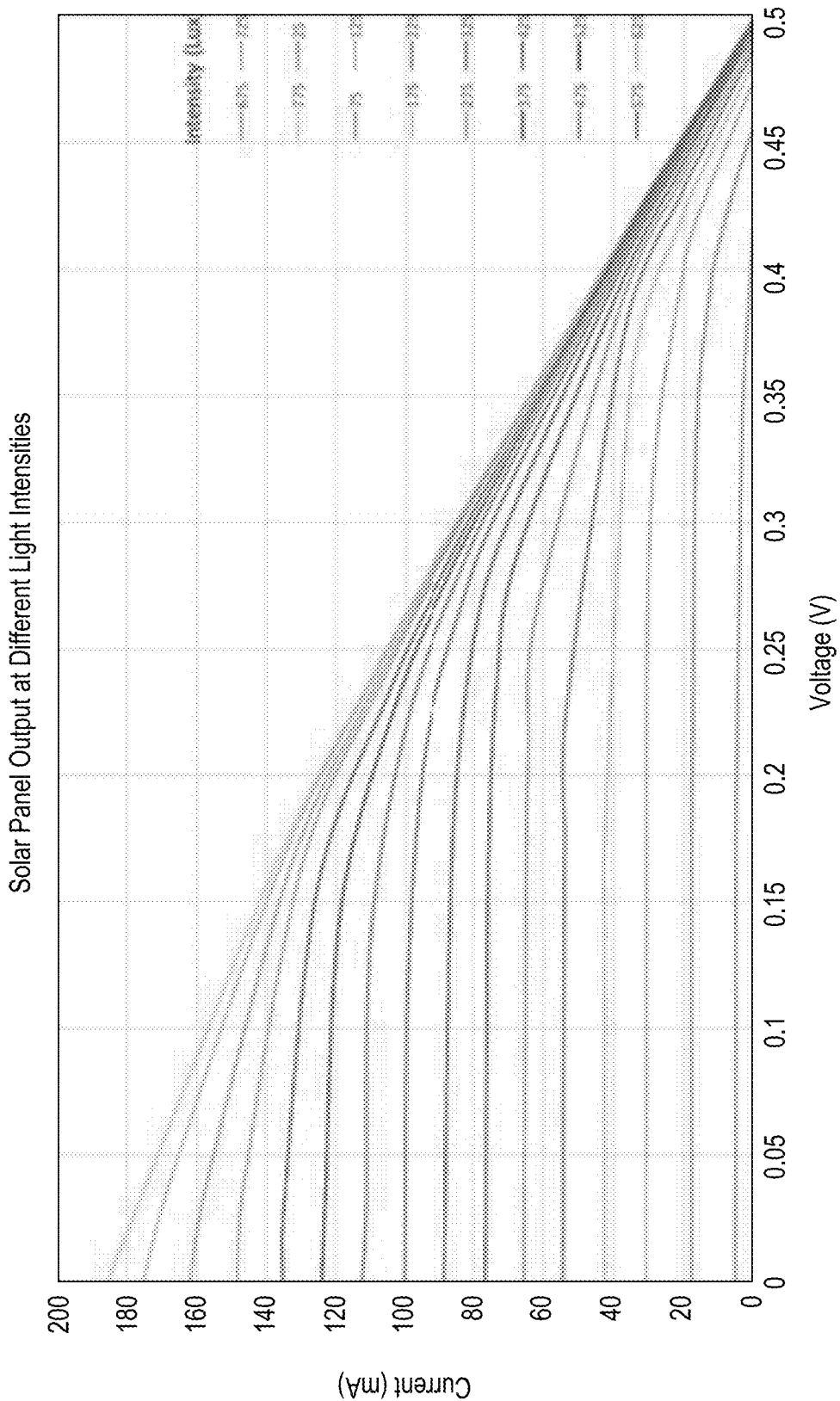

FIG. 24 is the solar panel behavior and various light intensities.

Figure 25:
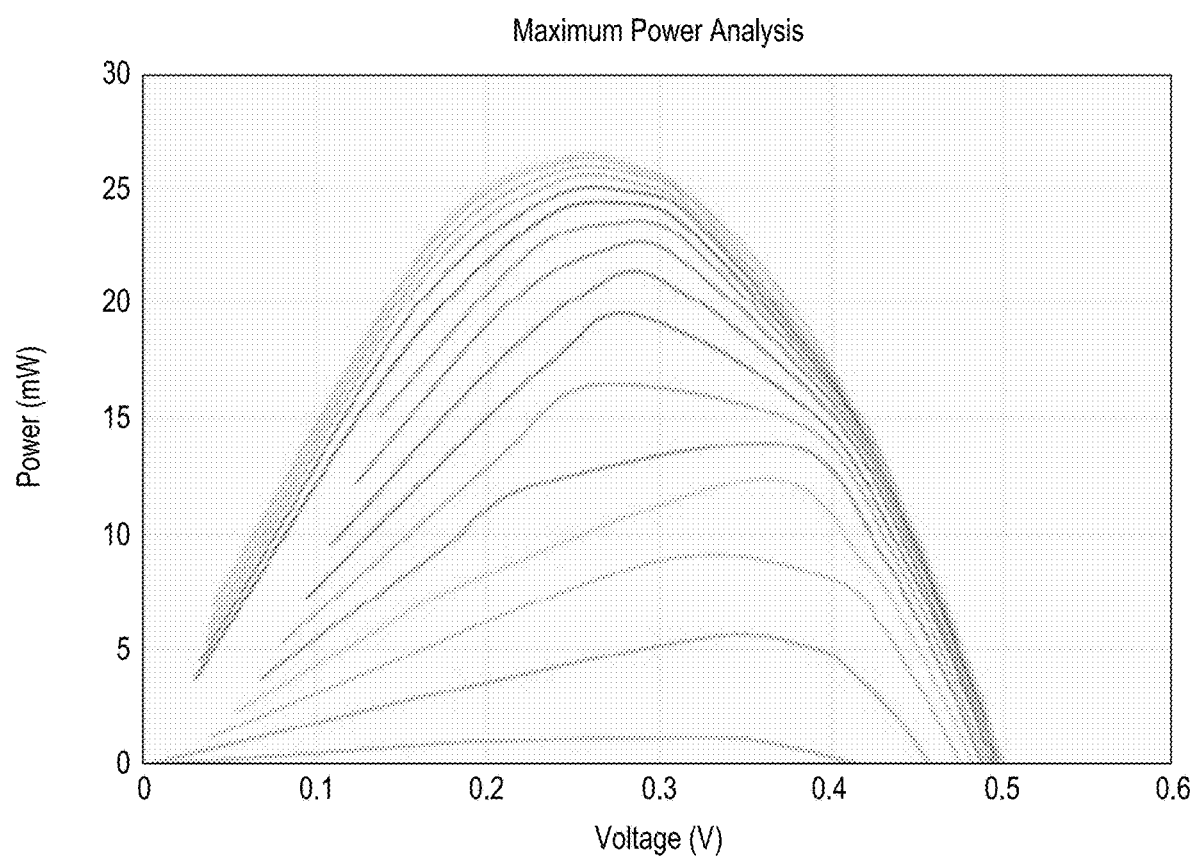

FIG. 25 is the maximum power point analysis for various light intensities. The points on the graph were created by multiplying the current and voltage ordered pair to get power and then graphed against voltage.

Figure 26:
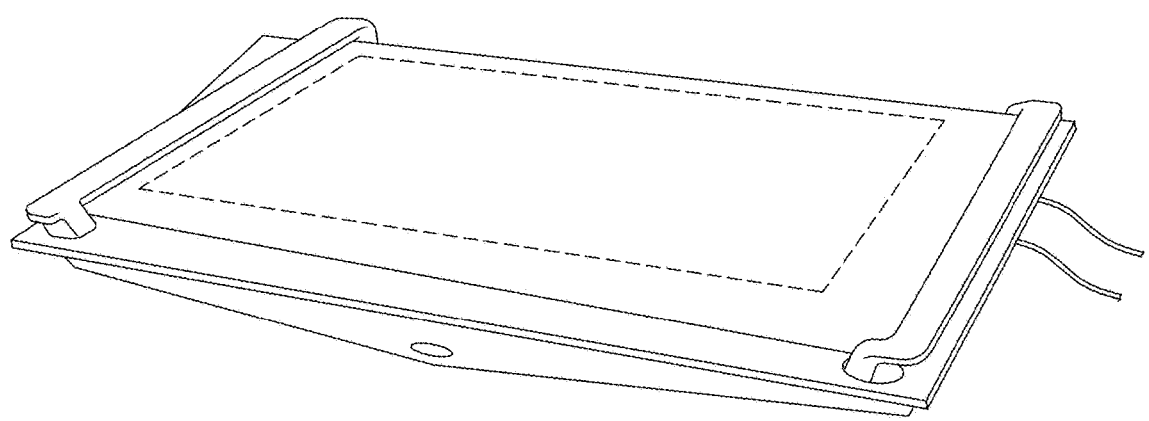

FIG. 26 is a cell holder with a PV cell with a diffuser over the cell.

Figure 27:
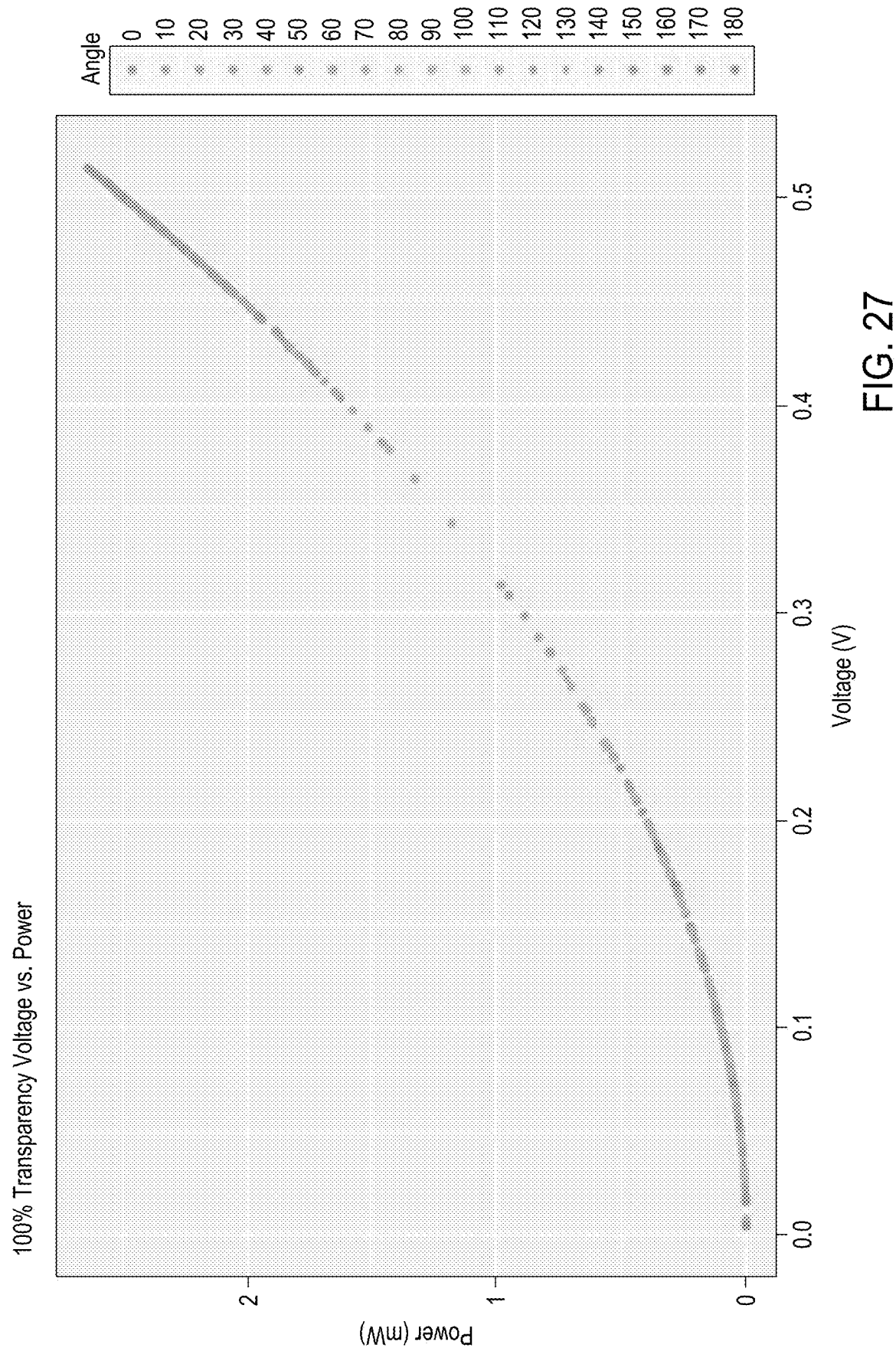

FIG. 27 is Voltage vs. Power Output colored by degrees away from normal light.

Figure 28:
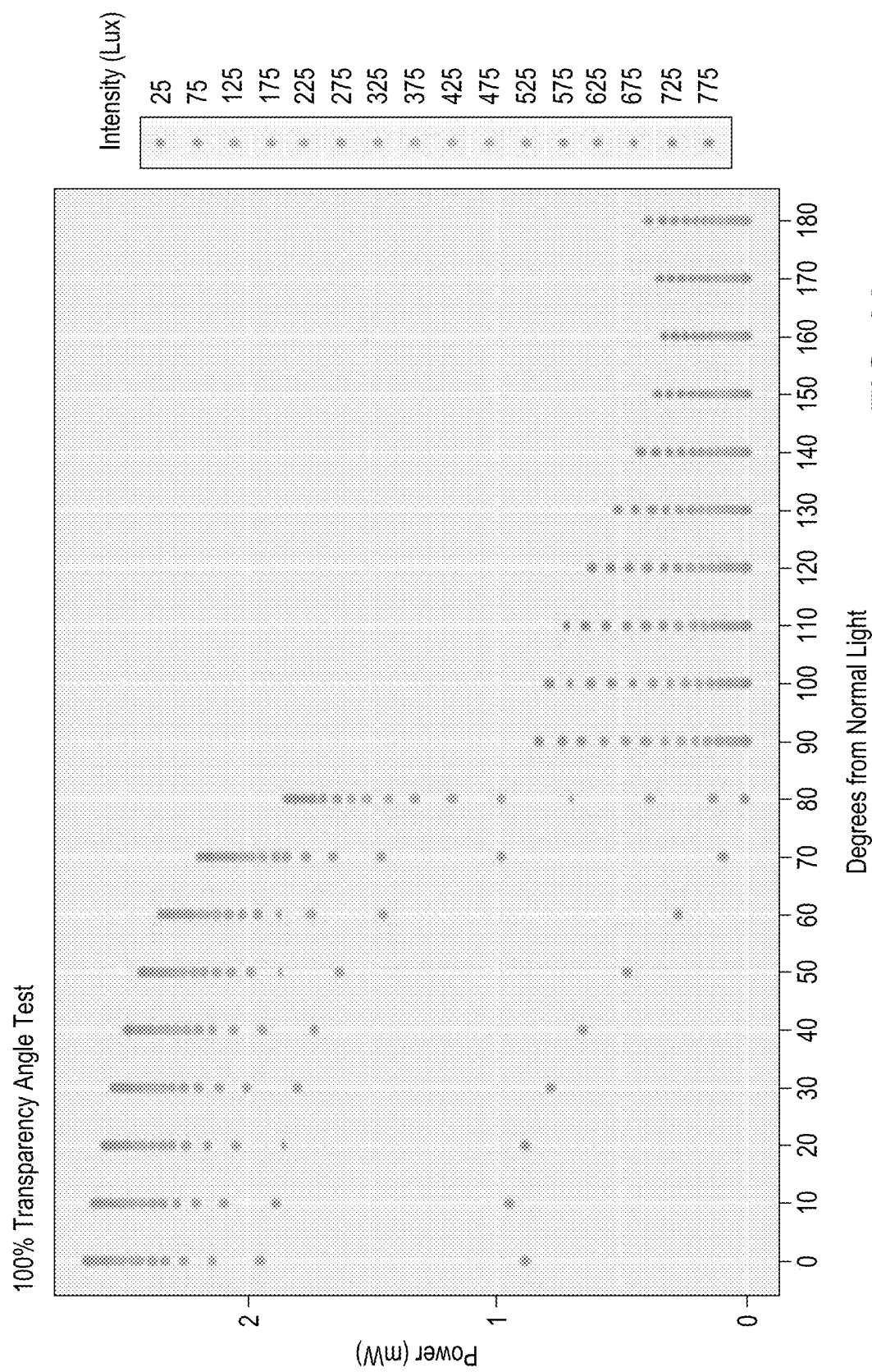

FIG. 28 shows Power Output by degrees from normal light. This test was with no diffuser to determine how power changes by changing angle.

Figure 29:
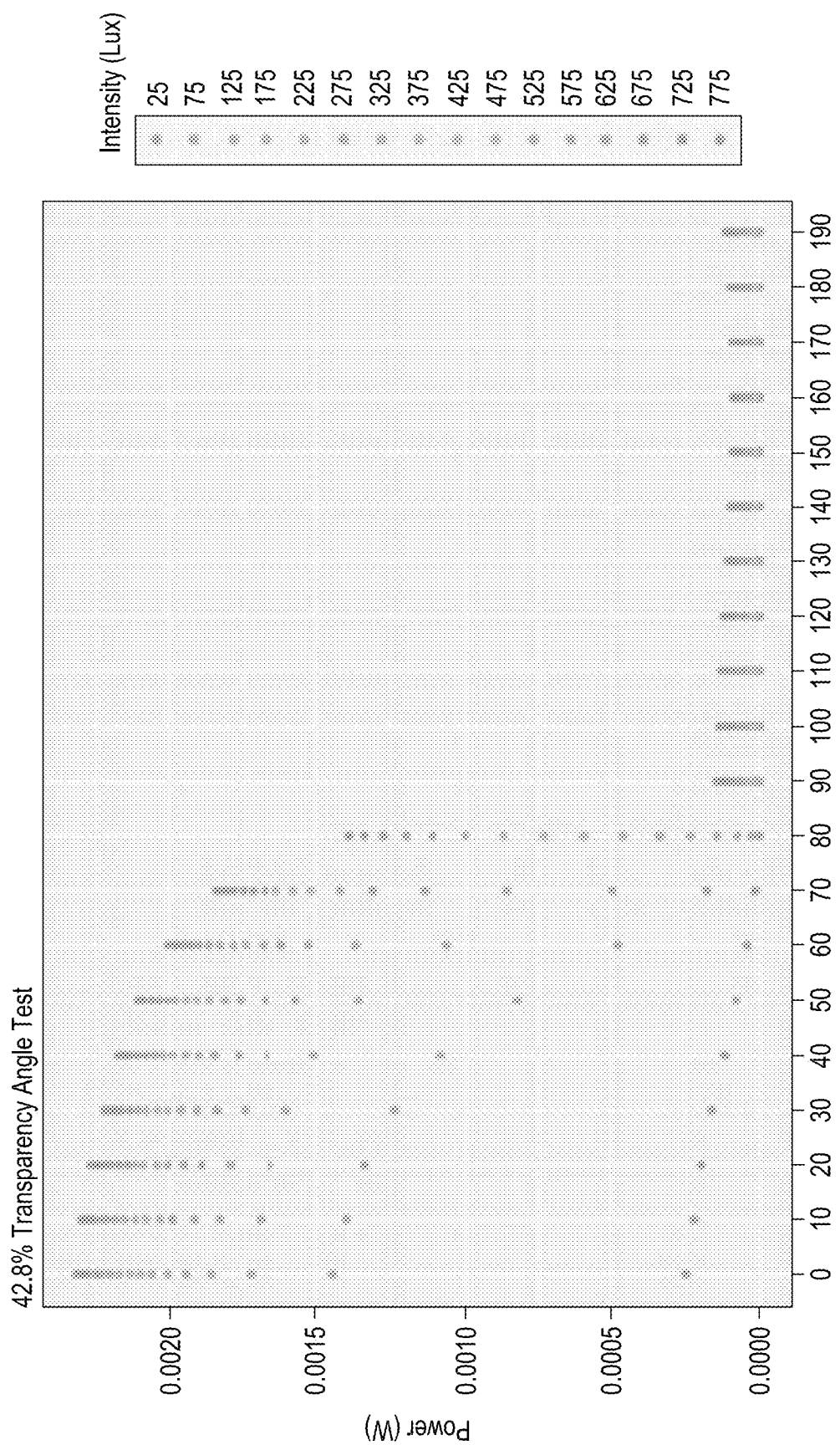

FIG. 29 shows Power Output by degrees from normal light. This test was with a 42.8% transparent diffuser to see how changing the power is affected by transparency of the diffuser. This is the diffuser with the lowest transparency that was tested.

FIG. 30 shows the characteristic curves of different colored LEDs on a PV cell at 425 (×100 lux).

FIG. 31 shows maximum power point analysis for various light sources. The points on the graph were created by multiplying the current and voltage ordered pair to get power and then graphed against voltage.

FIG. 32A provides a schematic for three parameters: layers' angles from incoming electromagnetic radiation θ, layers' relative angle α, and layers' relative distance D. The layers A and B are selected from a list consisting at least of photovoltaic cells and optical layers such as mirrors.

FIG. 32B is the setup for the plural PV cell tests.

Figure 33:
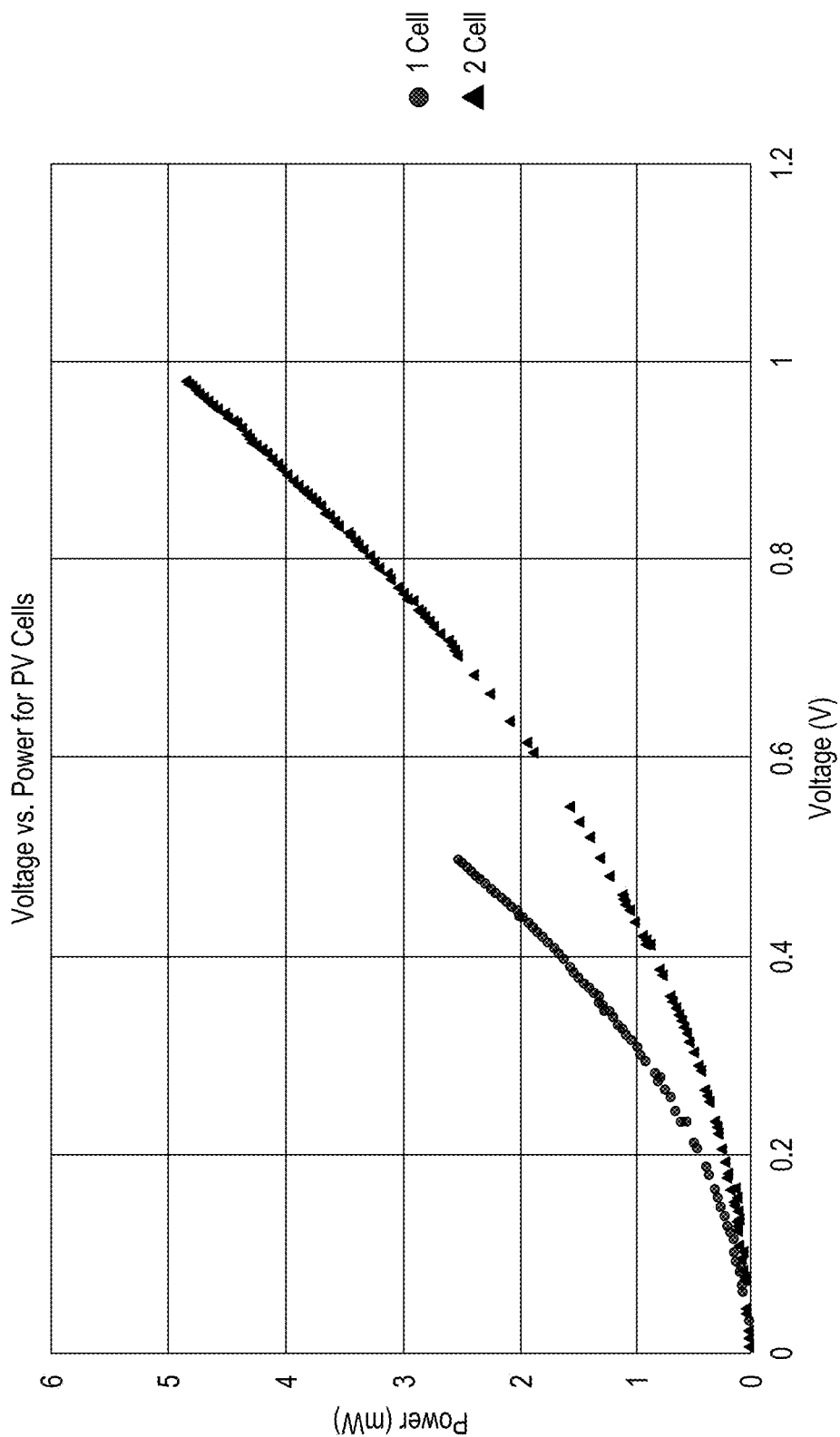

FIG. 33 shows voltage vs. power for one and two PV cells.

Figure 34:
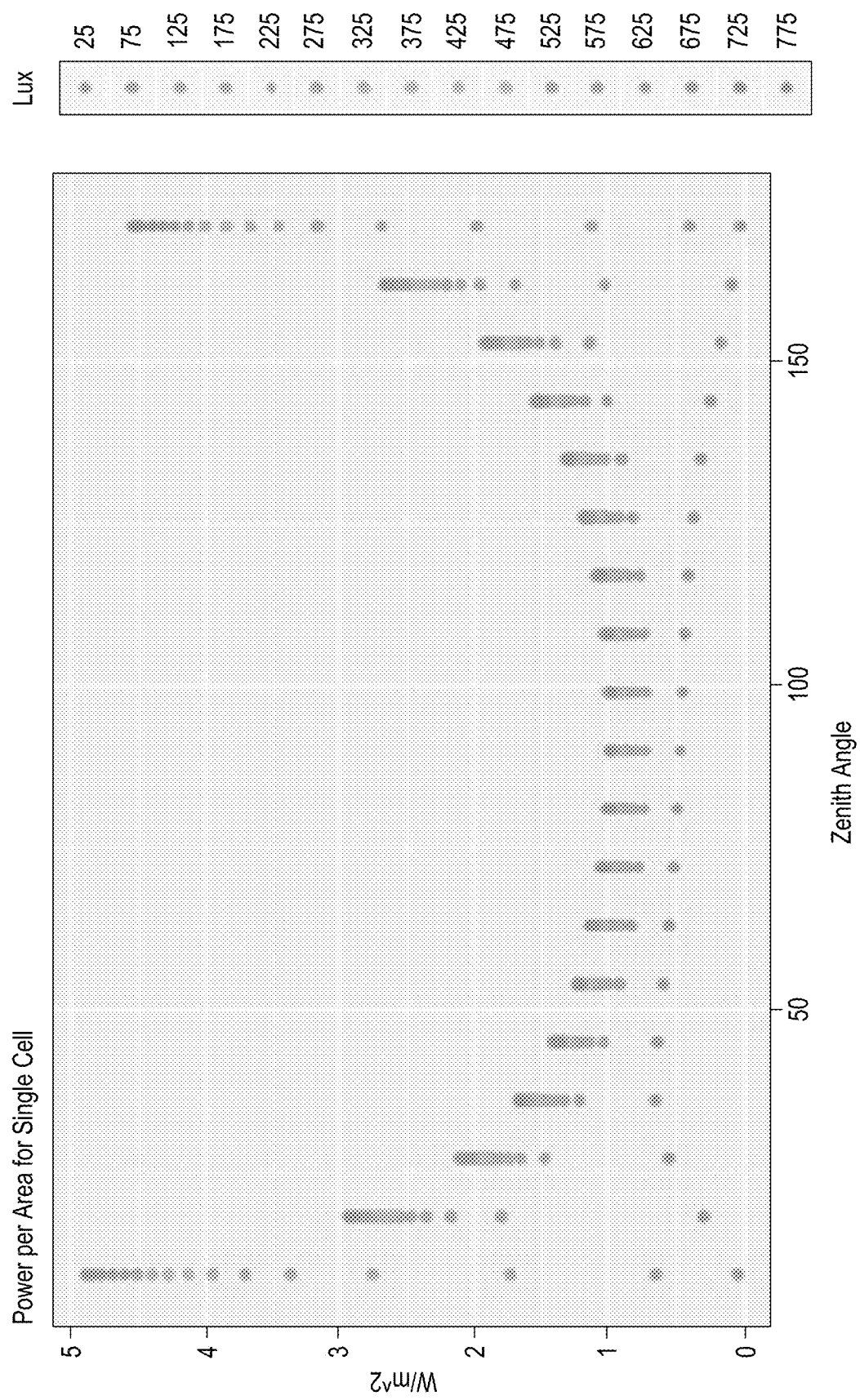

FIG. 34 is the power per surface area exposed to the LED for one PV cell in the dual PV setup. The power per surface area is for each cell.

Figure 35:
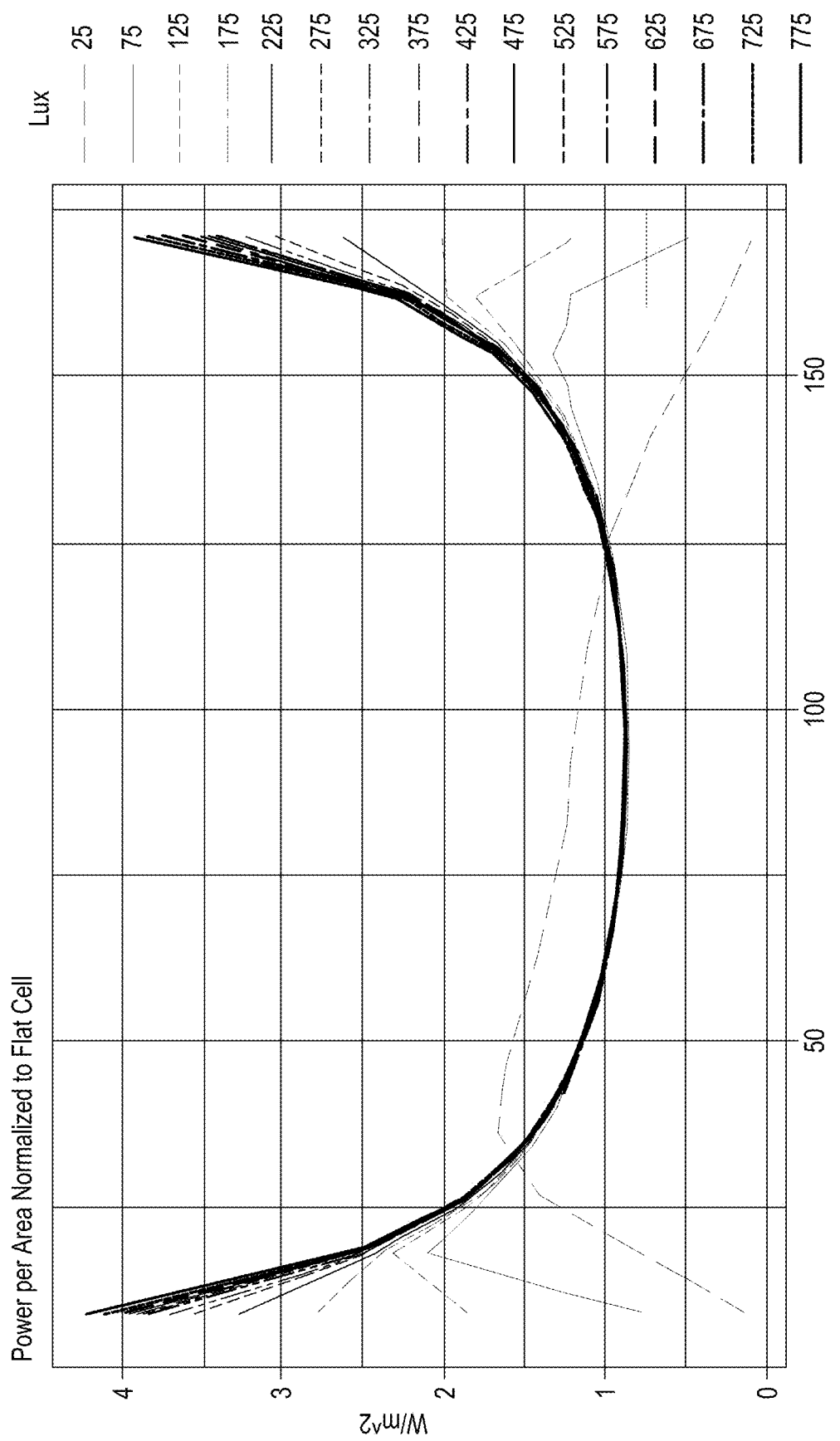

FIG. 35 shows power per surface area exposed to the LED for one PV cell divided by the power per surface area of a single, flat PV cell.

Figure 36:
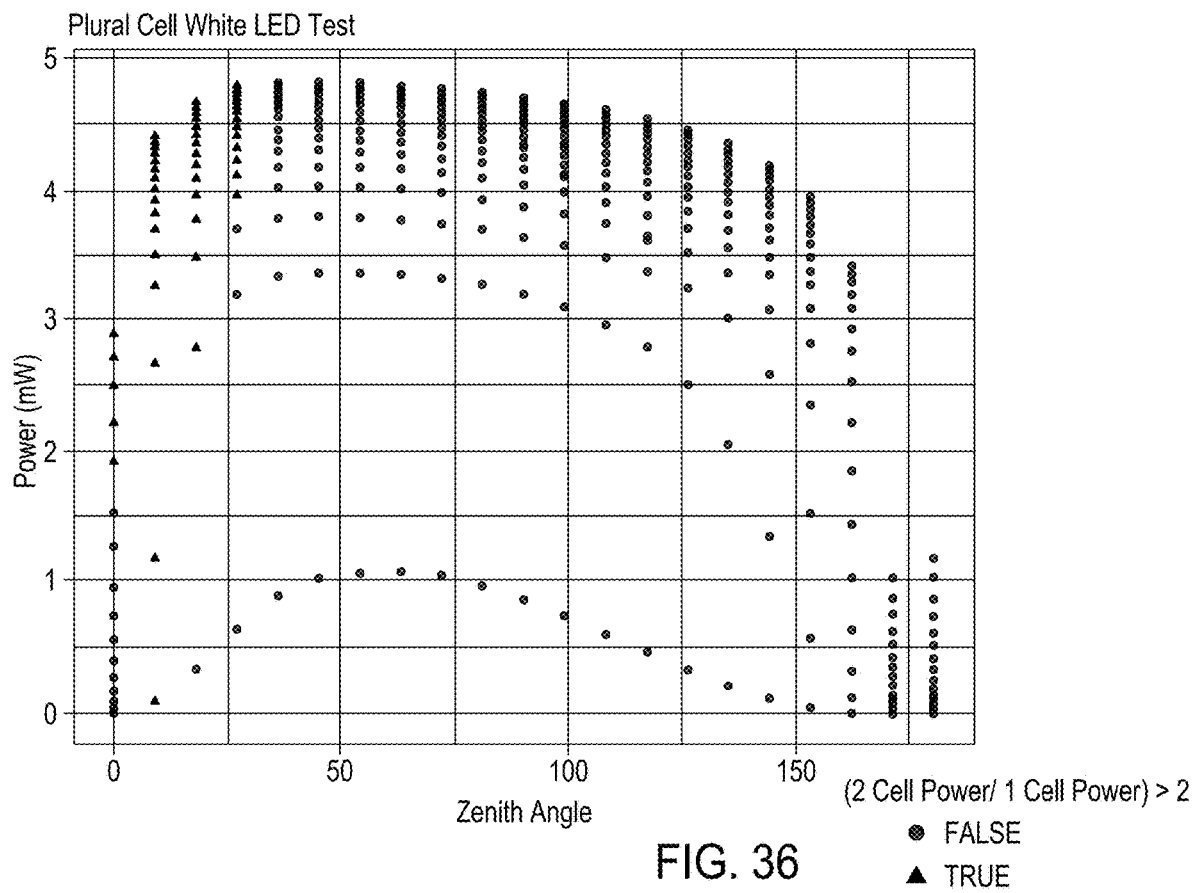

FIG. 36 shows the zenith angle vs. power for the two PV cell setup. This test had no reflective material over any of the cells. The points are colored blue if the ratio of 2 cell power over 1 cell power is greater than 2 and red if it is less than 2.

Figure 37:
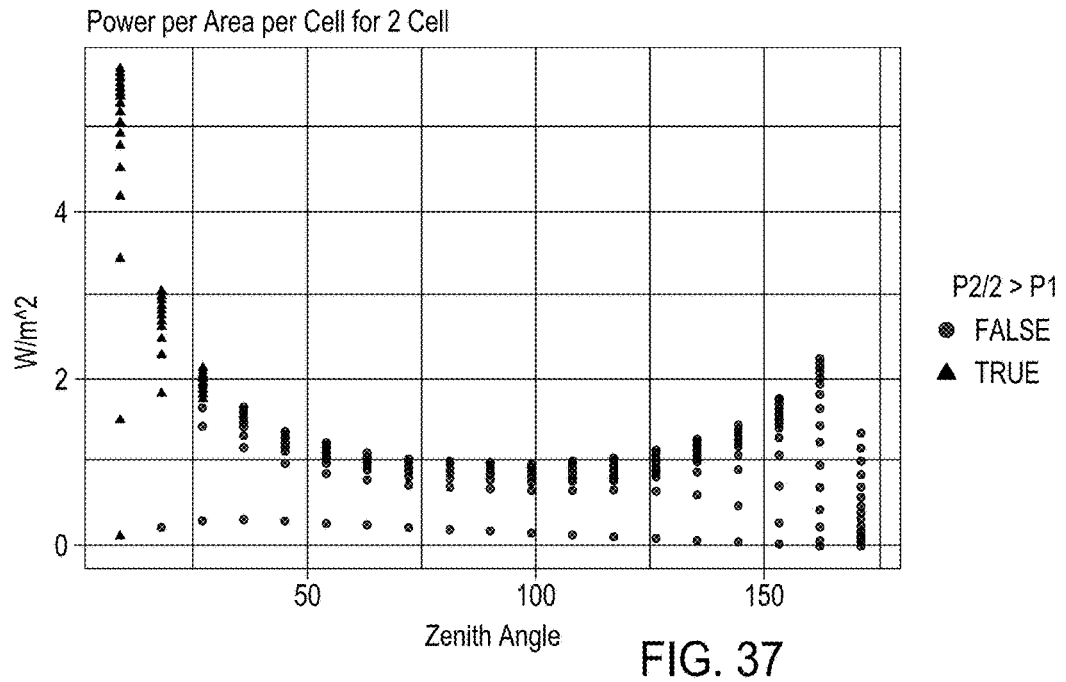

FIG. 37 shows the zenith angle vs. power for the two PV cell setup. Each power per area measurement is of a single cell in the two cell setup. The points are colored blue if the performance of a single cell in the two cell test is greater than the performance if the single cell test.

FIG. 38 is the setup of the resin tests. The power is measured across both PV cells for each test.

Figure 39:
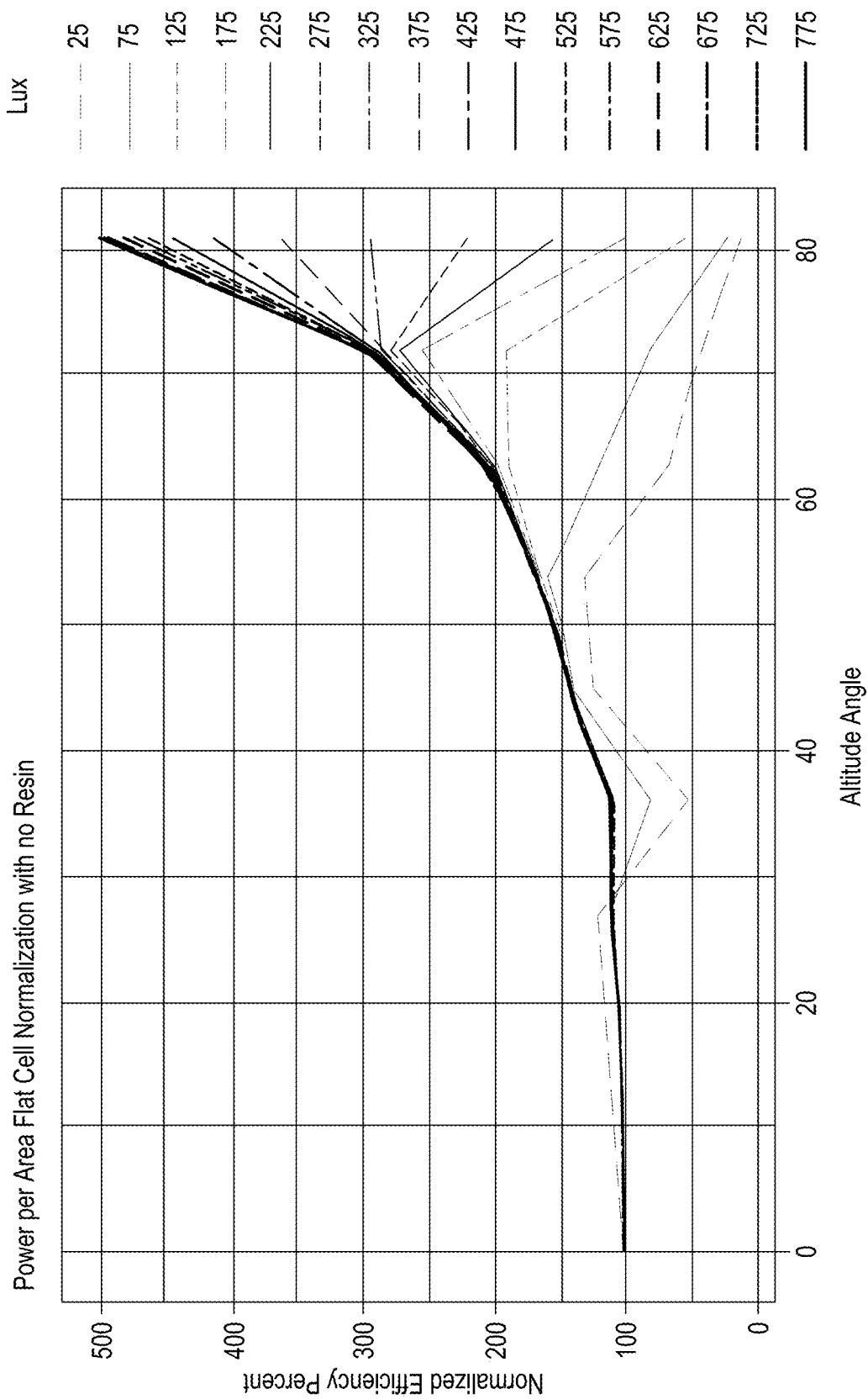

FIG. 39 shows the normalized power per area for a flat, single cell in the resin cell setup. This test has no resin in the container.

Figure 40:
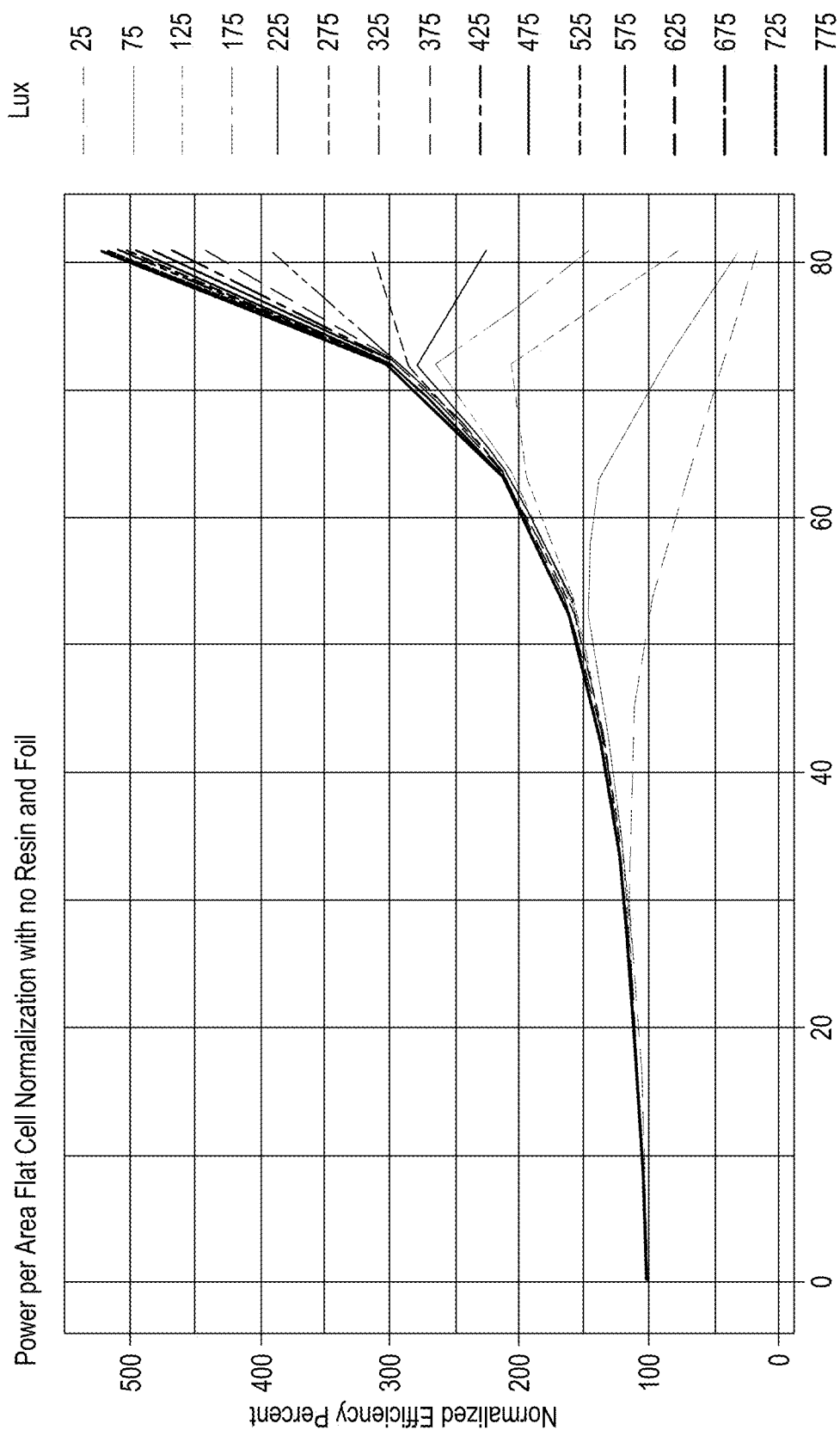

FIG. 40 shows the normalized power per area for a flat, single cell in the resin cell in the resin cell setup with foil. This test has no resin in the container and the container in covered in reflective aluminum foil.

Figure 41:
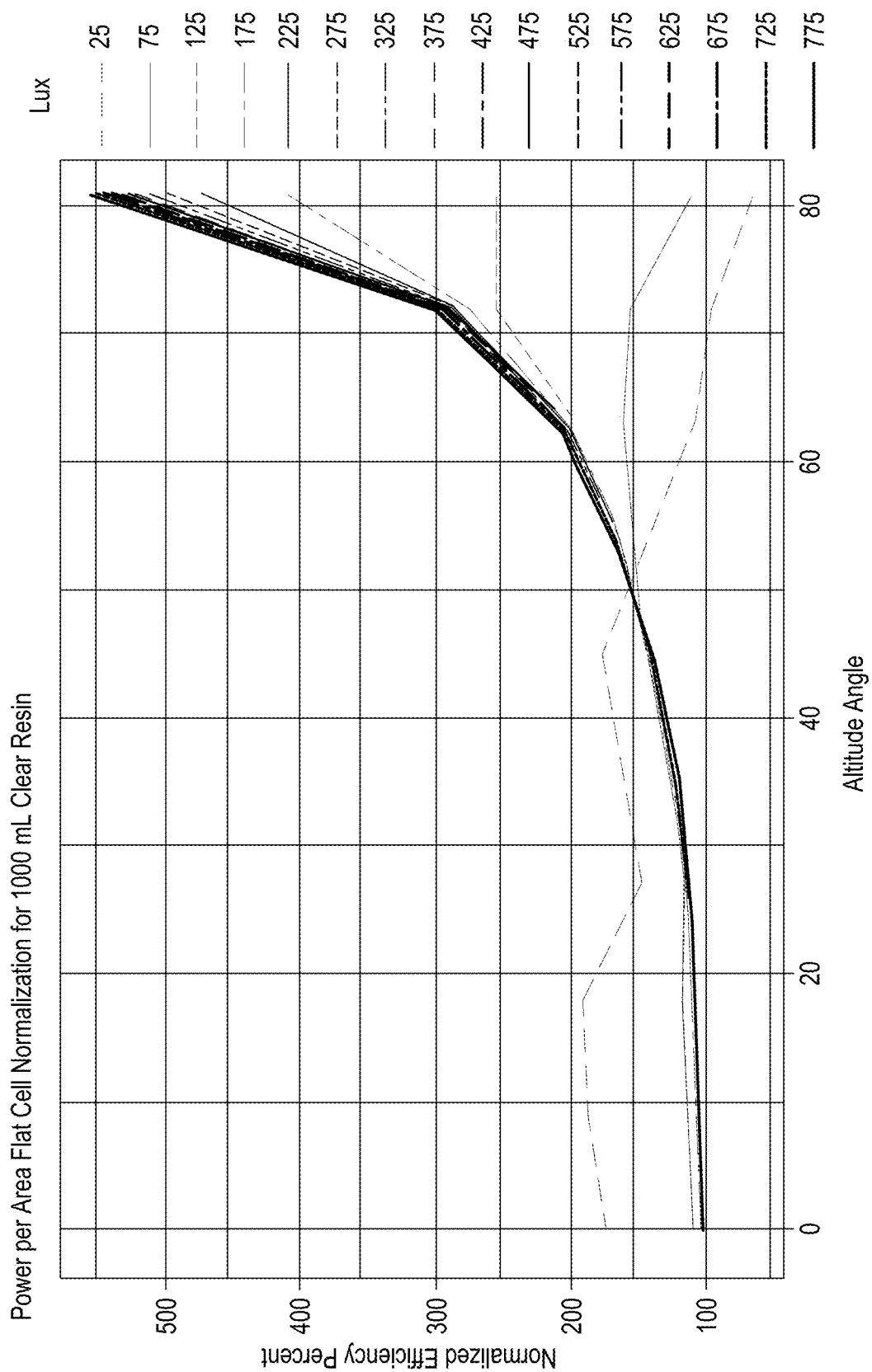

FIG. 41 is the normalized power per area (PPA) for 1000 mL Clear Resin.

Figure 42:
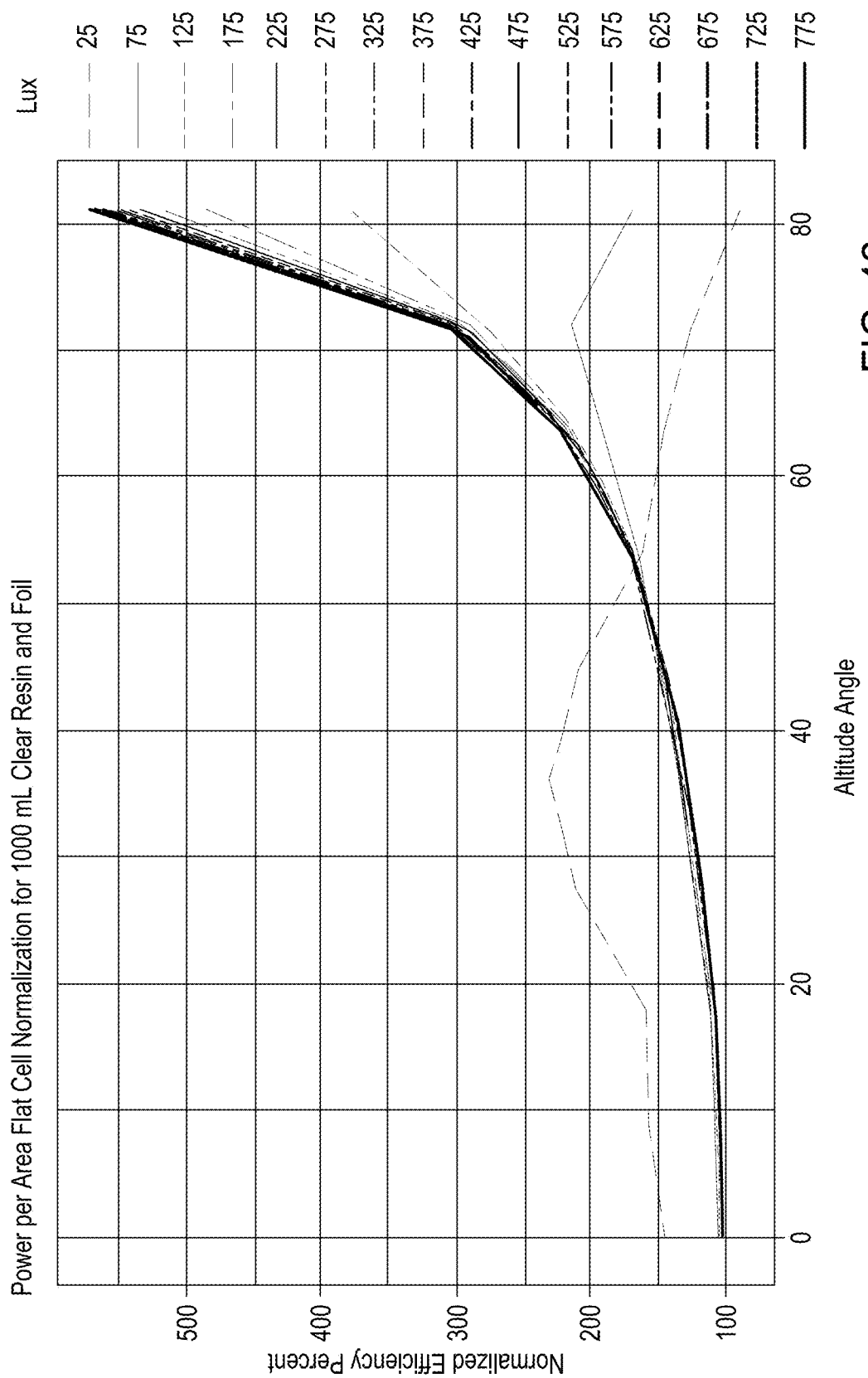

FIG. 42 is the normalized power per area (PPA) for 1000 mL Clear Resin and foil.

Figure 43:
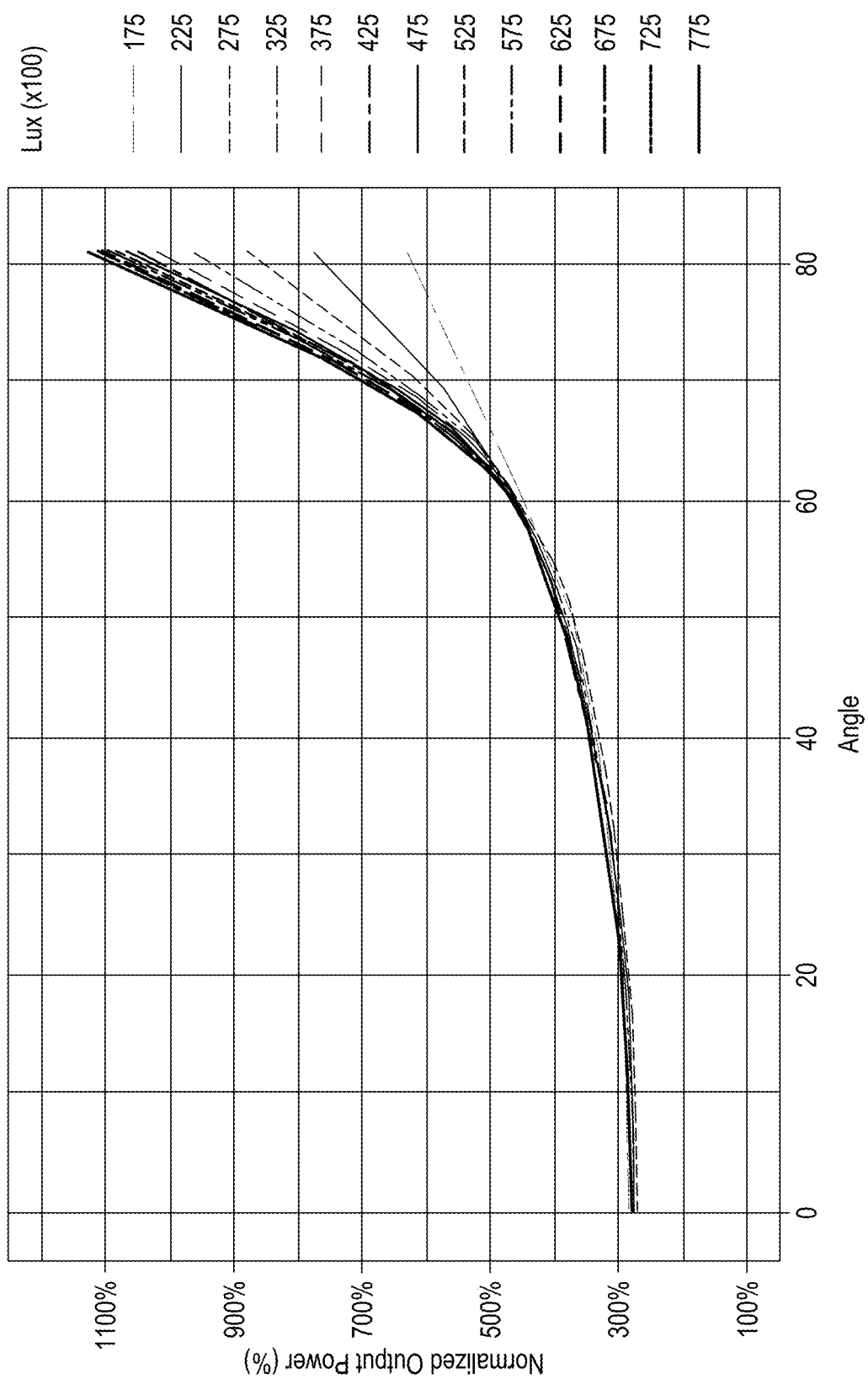

FIG. 43 shows the normalized output power of the three tests added together, i.e., cumulative power per area (PPA).

Figure 44:
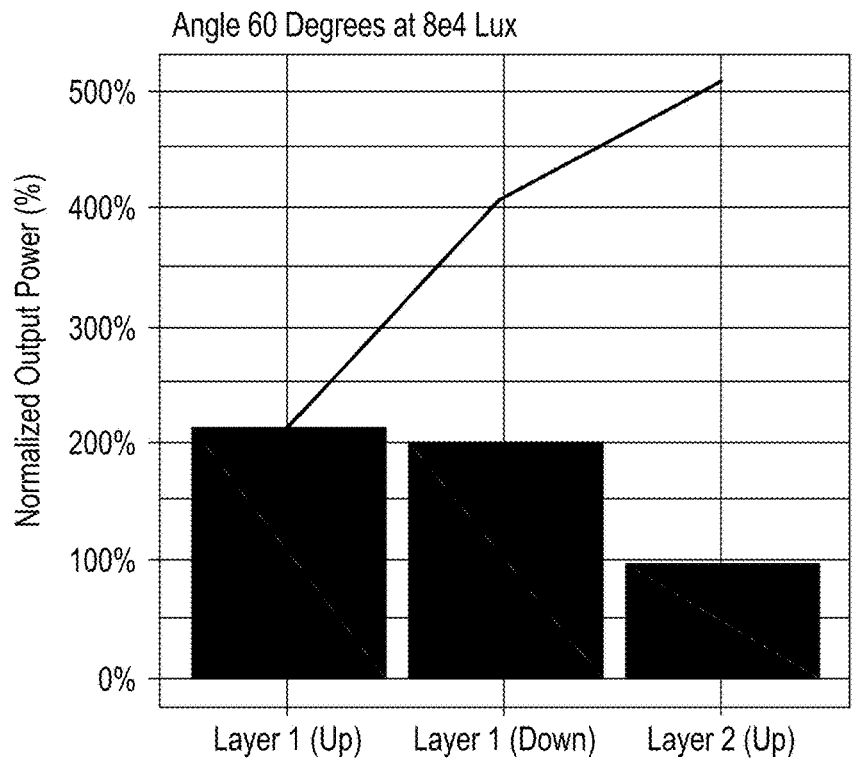

FIG. 44 shows the individual normalized output power percent for each layer in the resin bath at 60 degrees. The line shows the cumulative sum of power for all three layers, i.e., cumulative power per area (PPA).

Figure 45:
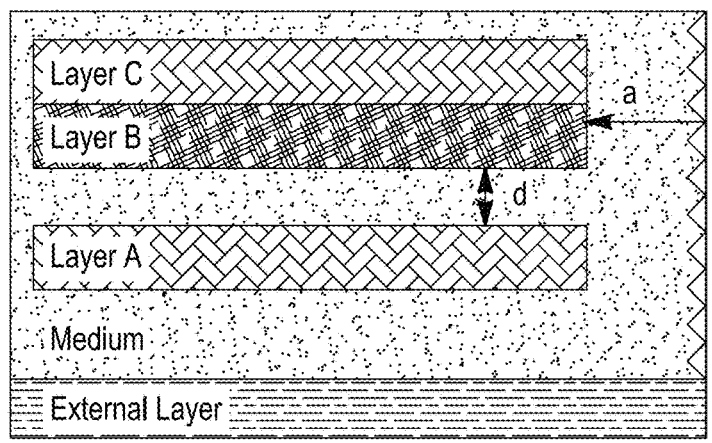

FIG. 45 shows a schematic of three layers (Layer A, B, and C) selected from a list of PV cells, dielectric material, and reflective material. The layers can be separated by a spacing d to allow for the propagation of electromagnetic energy between layers. The layers are disposed in a medium. In some embodiments, the internal surface of the EMEC is coated by a reflective material.

Figure 46:
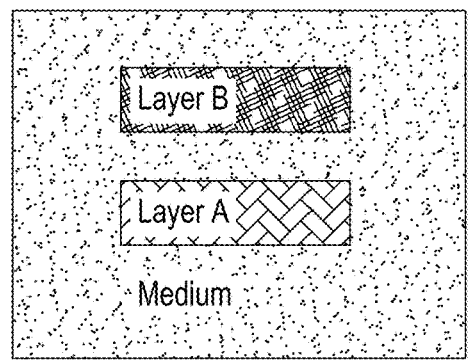

FIG. 46 shows a schematic view of an EMEC wherein the transparent body is a dispersive material whose diffusivity varies distally along the structure. The diffusivity gradient can be adjusted to insure that the PV cells, denoted as Layer A and Layer B, generate similar power output. Similar output cells can be connected in parallel or in series for reduced power waste and reduced cost of electronics to harvest the cells.

Figure 47:
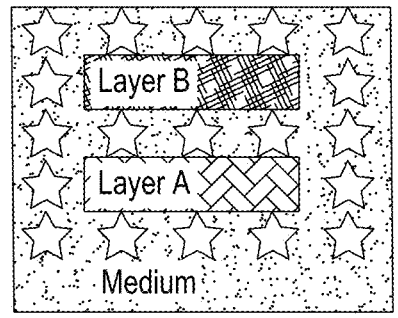

FIG. 47 provides a schematic view of two layers, PV cell, reflective sheet, etc. stacked in a transparent body of diffusive material, the layers labelled Layer A and Layer B. Spacers and/or fillers, shown as starts, can serve three immediate purposes: 1) to fill the medium to reduce the amount of diffusive material needed to reduce weight and/or cost, 2) to use as spacers such that they hold the layers at a constant distance from each other, and 3) to serve as diffusive and/or reflective surfaces. The spacers can be rods, sheets, or particles. They can be composed of dielectric or conductive materials.

Figure 48:
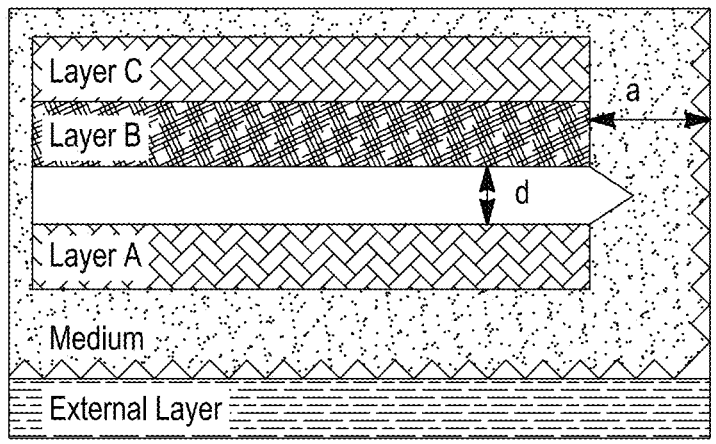

FIG. 48 shows a schematic consisting of three PV layers, Layer A, B, and C. The layers are disposed in a transparent medium. The housing encasing the layers and the medium, labelled as External Layer, is either reflective to trap the electromagnetic energy inside the EMEC until it is converted and/or a diffusive layer to disperse the incoming electromagnetic energy for a diffused radiation and to avoid shading across the EMEC. In the case of reflective external layer, the reflectors can be a combination of surfaces, as shown with black triangles positioned from the layers at distance a, to control the propagation of electromagnetic radiation inside the EMEC. The Layers A and B are separated and/or filled with a layer, shown in grey shading, with a layer of thickness d whose distal cross section is at an angle with the propagating electromagnetic radiation. The layer serves to bring the radiation into the void between Layers A and B until it is converted.

Figure 49:
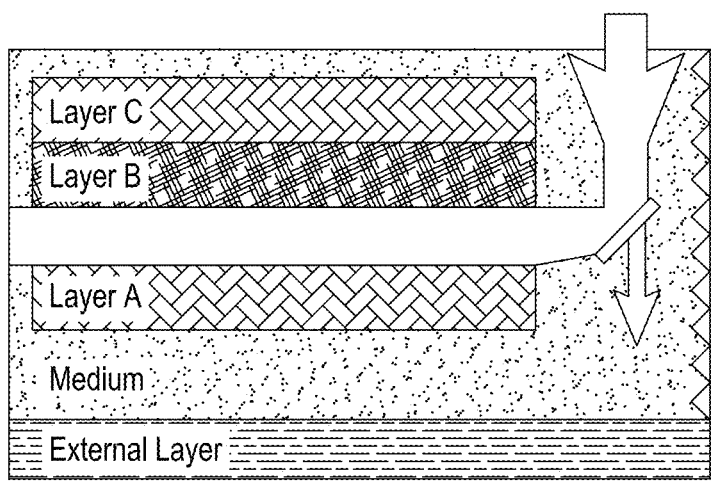

FIG. 49 shows a schematic consisting of three PV layers, Layer A, B, and C. An optical surface, i.e., a semi-reflective mirror, a lens, or a wave guide, is positioned at angle with respect to the propagating electromagnetic radiation. The optical surface deflects a fraction of the incoming electromagnetic radiation toward the space between PV cells Layer A and Layer B to convert to electricity. The remaining fraction of the electromagnetic radiation propagates through the optical surface. The optical surface can be processed after the EMEC production, such as bubblegram methods.

Figure 50:
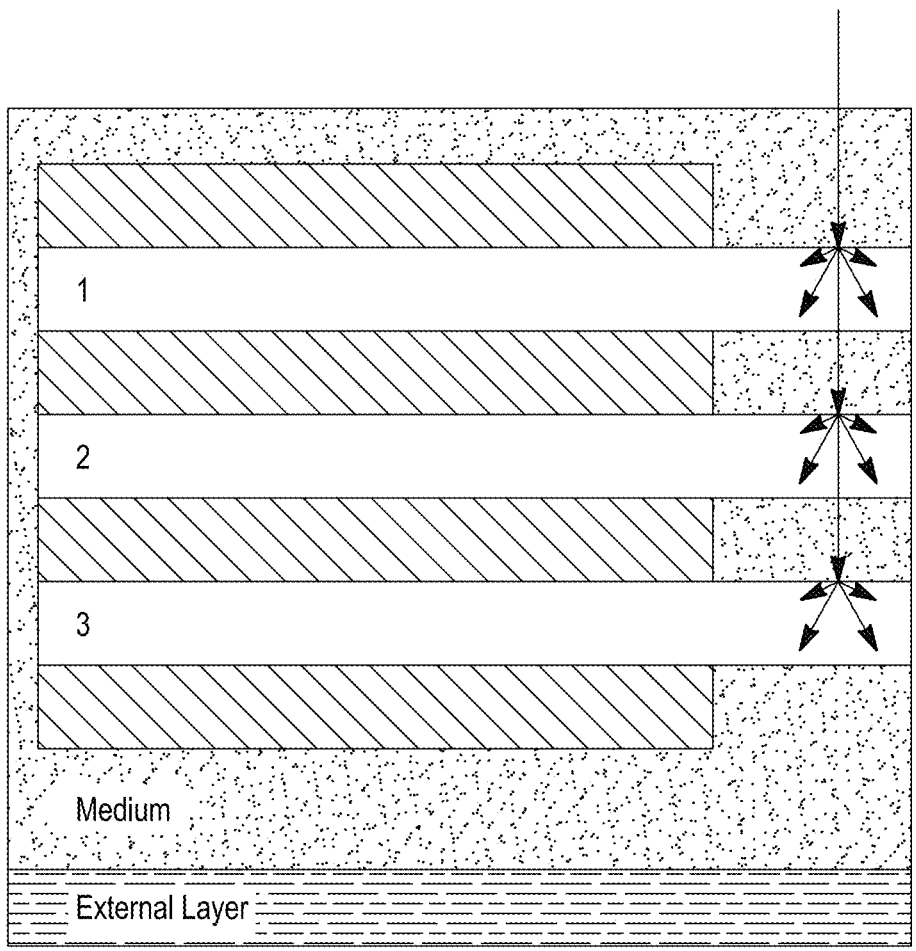

FIG. 50 shows a schematic consisting of four layers, shown as white rectangles, separated by diffusive layers, shown as grey shaded rectangles. The diffusive layers serve to also guide the incoming electromagnetic radiation toward in between the white layers.

Figure 51:
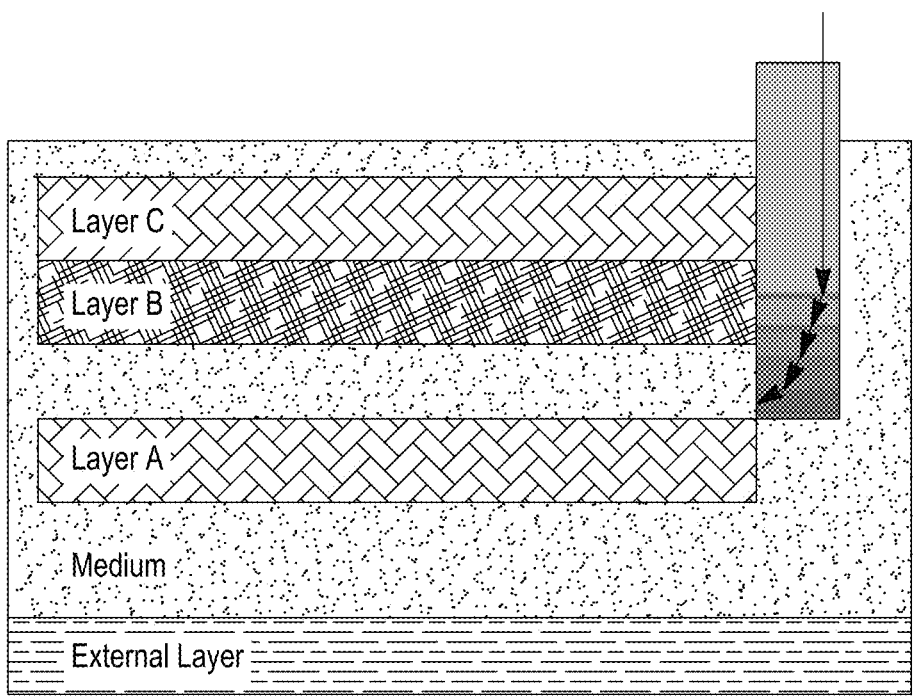

FIG. 51 shows a schematic consisting of three layers, Layer A is a PV cell, Layer B is a reflective surface, and Layer C is a PV cell. In some embodiments, Layers A and C are transparent and/or diffusive photovoltaics. The gradient grey material illustrates a body of, in this case, 5 layers of transparent diffusive material of different refractive indices to guide the incoming electromagnetic radiation, as shown with bending arrows, toward the spacing between the Layers A and B. Individual layers can be addressed using a matrix of wave guides that direct the incoming electromagnetic radiation independently. In some embodiments, the different wave guides are fiber optics, while in other embodiments, the wave guides are covered with reflective material to avoid cross-propagation. In some embodiments, the transparent material layer is an Indium tin oxide (ITO) coated glass, where the glass serves to guide and/or diffuse light, while the conductive material, in this case ITO, serves to conduct electricity and/or heat.

Figure 52:
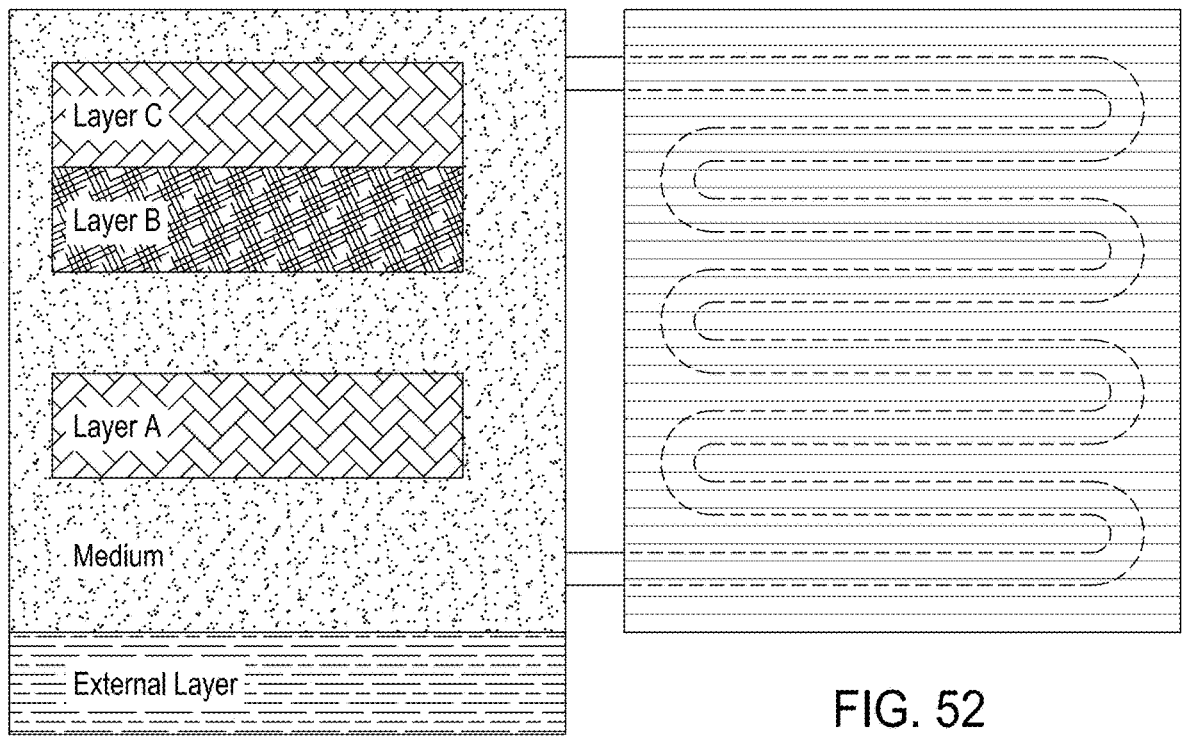

FIG. 52 shows a schematic consisting of three PV layers, Layer A, B, and C disposed fully in a transparent body of material, labelled as 'Medium'. The medium is circulated inside the EMEC and is extracted to cool and/or heat in a heat transfer system, depicted as a coil encased in a radiating array to conduct heat between the medium and the ambient environment. The heat transfer system may be packaged with the EMEC or coupled as an independent device. In some embodiments, the EMEC structure floats above water while the water is further used to cool the system. In some embodiments, the temperature regulation is done using a geothermal method.

Figure 53:
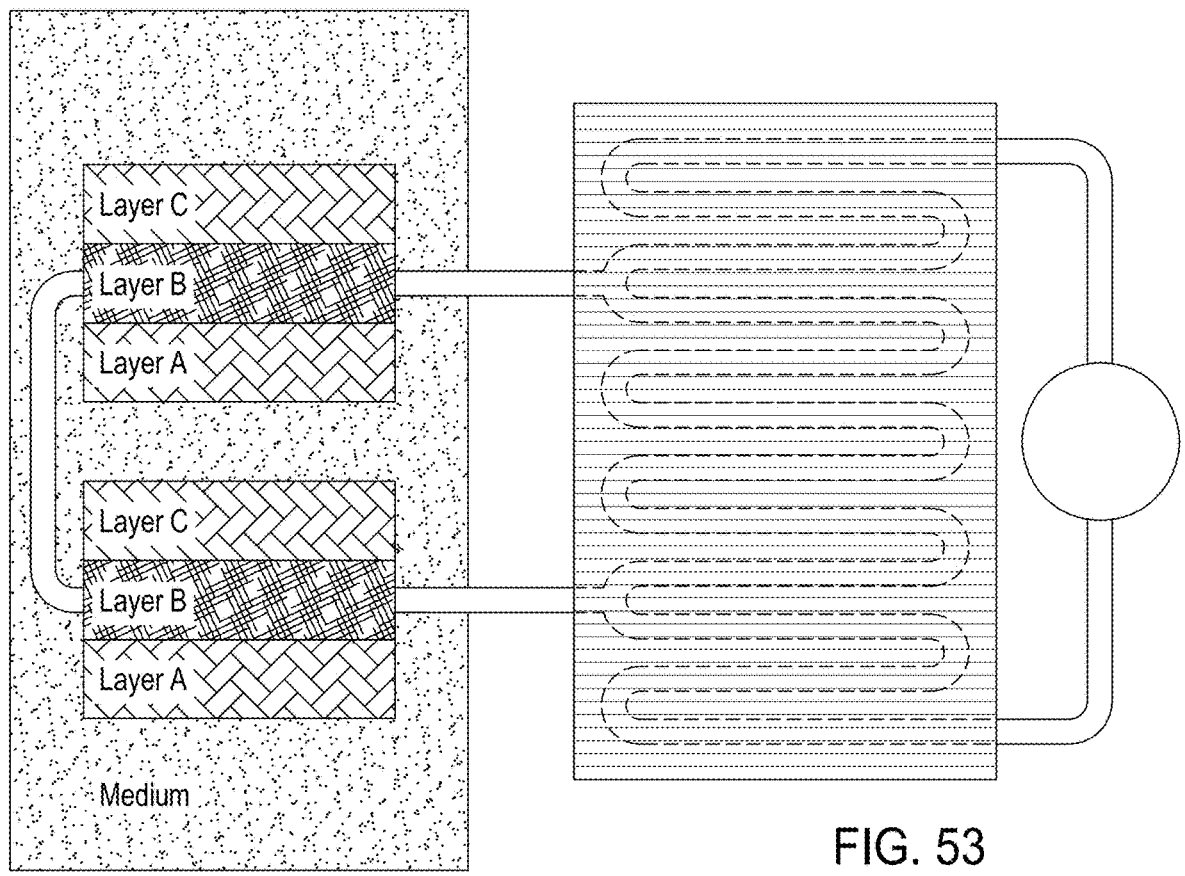

FIG. 53 shows a schematic consisting of four PV layers, Layer A and and C disposed fully in a transparent body of material, labelled as 'Medium'. Layers A and C are positioned back to back. Between the two layers, there exists a layer, Labelled as Layer B, such as a pipe, a sheet or a heat coil. Layers B are filled with heat transferring liquid and/or pressurized vapor, shown in solid grey. The purpose of these layers is to transfer the heat associated with the energy conversion process and/or to regulate the temperature of Layers A and C for optimum performance efficiency. In some embodiments, the heat transfer is active and is done with the help of a pump, motor, and/or an air compressor, as shown with the grey circle.

Figure 54:
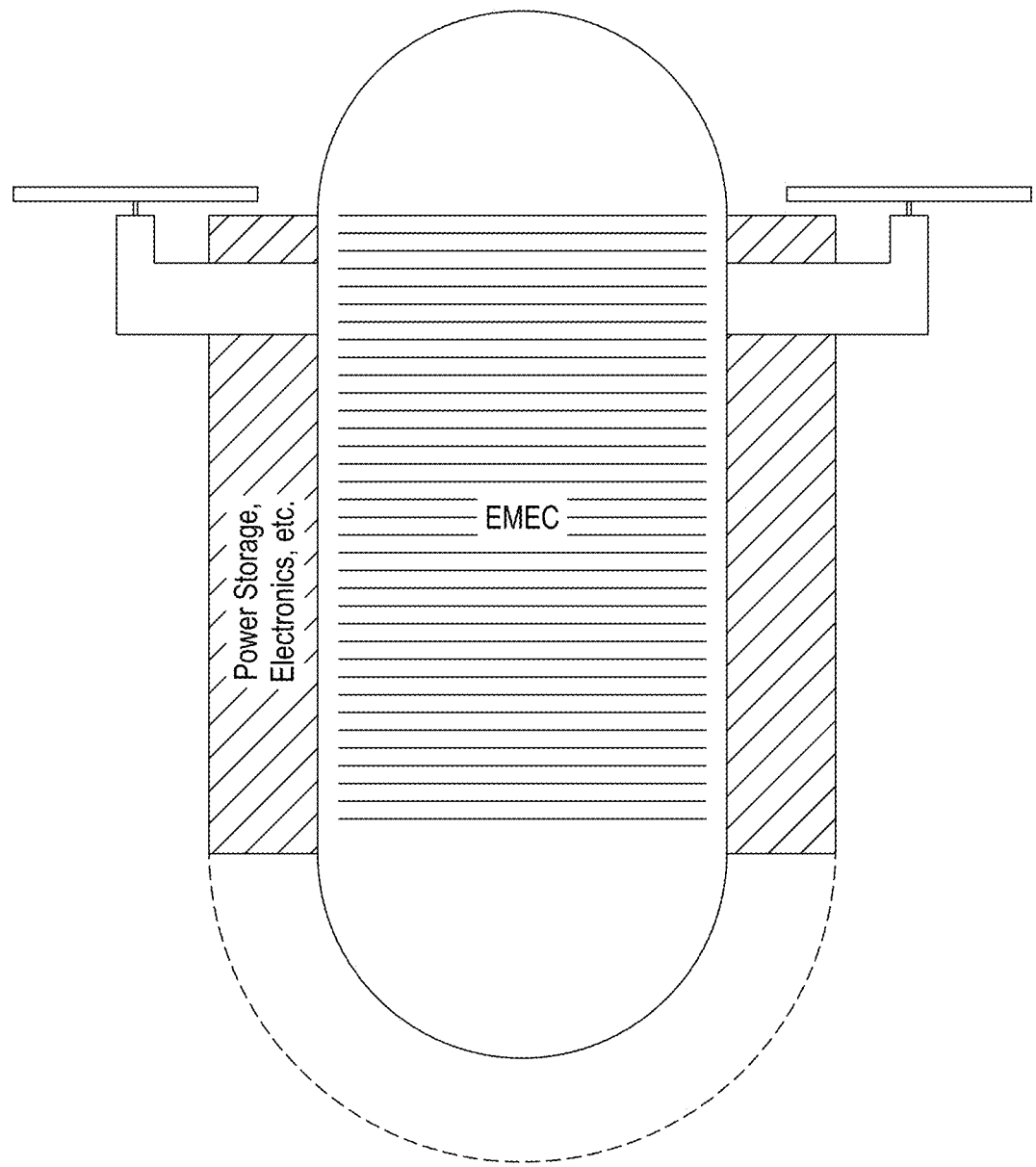

FIG. 54 shows a schematic view of an example application of the EMEC. The UAV carries an onboard EMEC, consists of a plurality of PV cells disposed in a diffusive, transparent body of insulating material. In some embodiments, the EMEC is enclosed within a reflective housing which further encloses the onboard power storage and control systems. The EMEC is, in some embodiments, power by the solar radiation from above where the dome-like lens serves to concentrates the incoming light and to enhance the angle at which the light comes in, in this case, spanning ~90 degree from the UAV's axis of symmetry. In some other embodiments, the UAV can be further powered by a concentrated source of electromagnetic radiation from below, such as monochromatic laser light, concentrated solar radiation, or medium-cross section (e.g., 5-inch) polychromatic light beam, such as a focused flash light.

Figure 55:
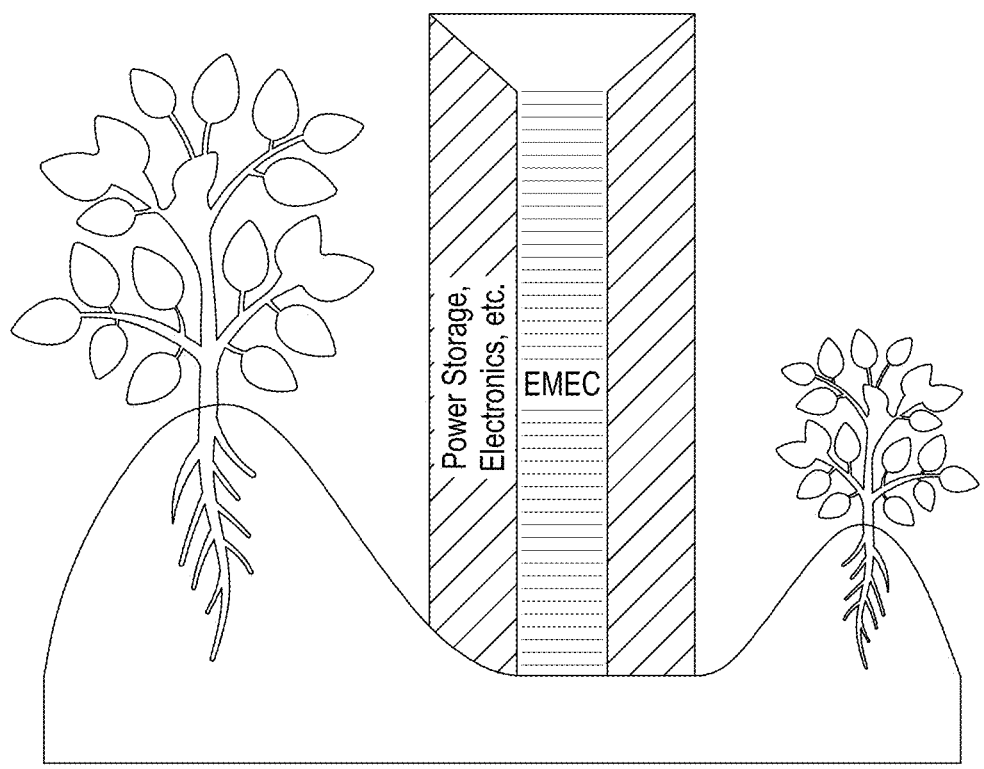

FIG. 55 shows a schematic view of an example application of the EMEC. The compact EMEC which consists of a plurality of PV cells disposed in a diffusive, transparent body of insulating material is installed on an orchard between plants. The co-habitability enables saving on the soft costs associated with dedicating large pieces of land, i.e., real estate, to conventional solar panels, solely.

Figure 56:
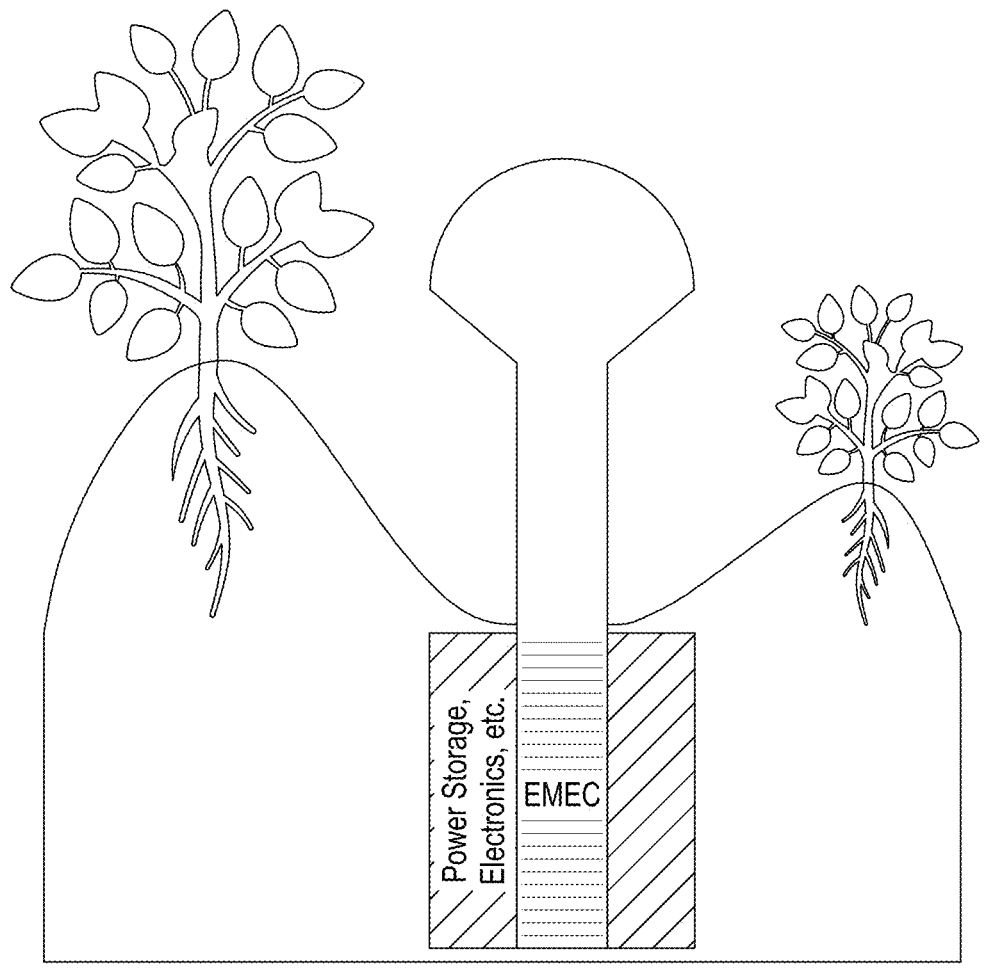

FIG. 56 shows a schematic view of an example application of the EMEC. The compact EMEC which consists of a plurality of PV cells disposed in a diffusive, transparent body of insulating material is installed beneath the farming grounds and/or in an apartment basement in an urban setting. In some embodiments, the EMEC medium extends above ground to collect light. In other embodiments, a wave guide is used to collect and bring in light from above the ground and/or an apartment rooftop. The EMEC structures may also contain power storage and control systems onboard or can be connected to other neighboring EMEC structures and to a local power grid. In some embodiments, the wave guide can also serve as a shade for plants or a greenhouse. In some embodiments, the EMEC structure is under water which can further help with cooling the structure. In some embodiments, the heat transfer is radiative, such as in space applications.

Figures 57, 58:
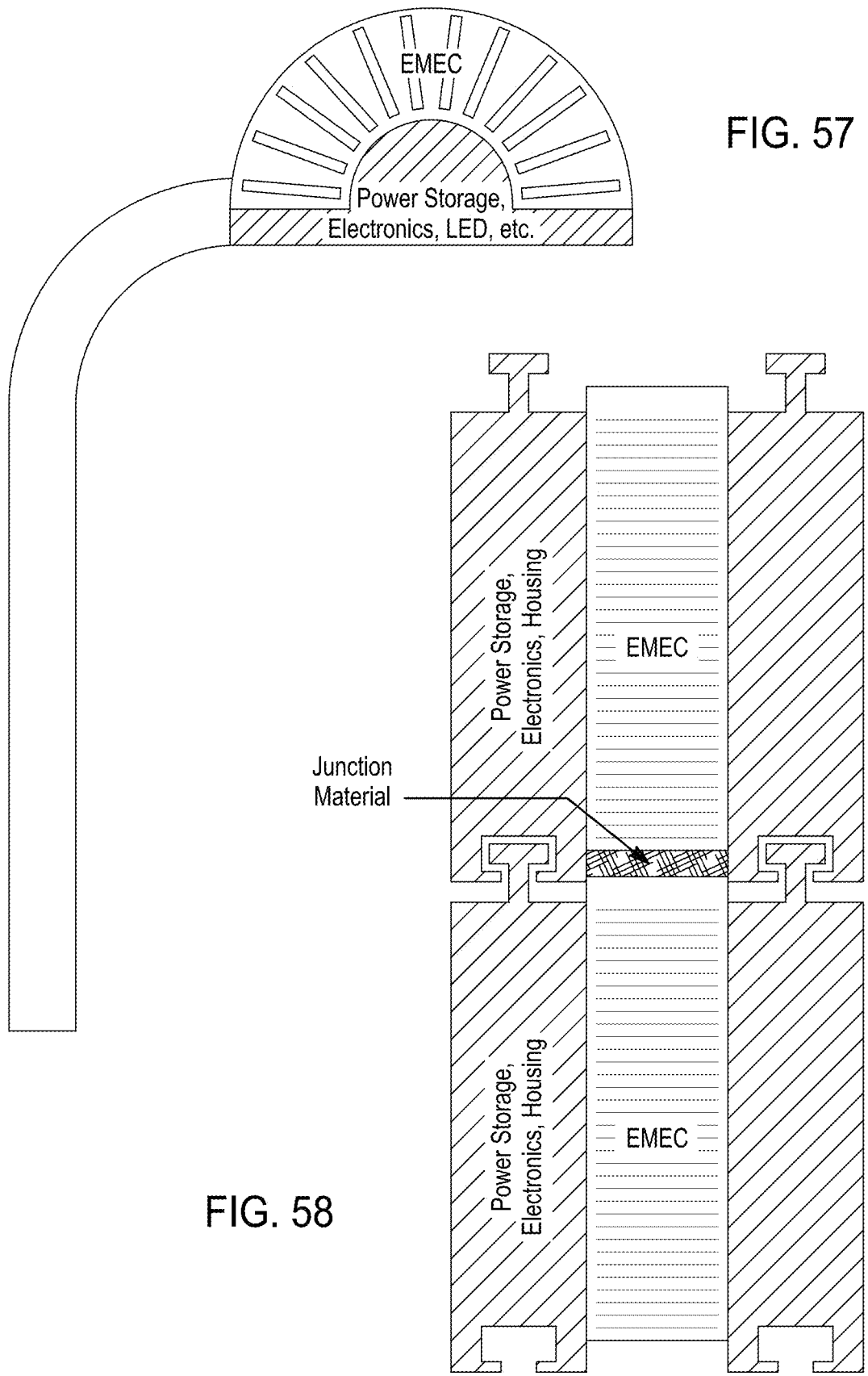

FIG. 57 shows a schematic view of an example application of the EMEC. The compact EMEC which consists of a plurality of PV cells disposed in a diffusive, transparent body of insulating material is installed above a light post. The EMEC converts ambient light, such as solar radiation in an outdoor setting, into electricity. The electricity can be stored by charging onboard power storage and control systems. The converted light can also be used to power an onboard lighting system. In some embodiments, the plurality of PV cells are oriented at similar angles from each other, such as the configuration shown in the drawing. In some other embodiments, the PV cells are positioned such that the opening cross section is identical between cells to insure that all cells receive the same amount of light and, therefore, generate similar power outputs. This will allow for simple electrical circuits and help to reduce manufacturing and maintenance costs.

FIG. 58 shows a schematic view of an example application of the EMEC. The EMEC structures are independent devices. Multiple independent EMEC devices can be connected such that an incoming electromagnetic radiation is shared between devices. In some embodiments, the transparent medium of the EMEC devices are in contact such that they enable the propagation of the electromagnetic radiation between EMEC devices. In some embodiments, the light propagation is improved by the application of a junction material with refractive properties that optimize the crossing of the electromagnetic radiation between different media. In some embodiments, the junction/connection between EMEC devices is made by wave guides, such as fiber optics.

Figure 59:
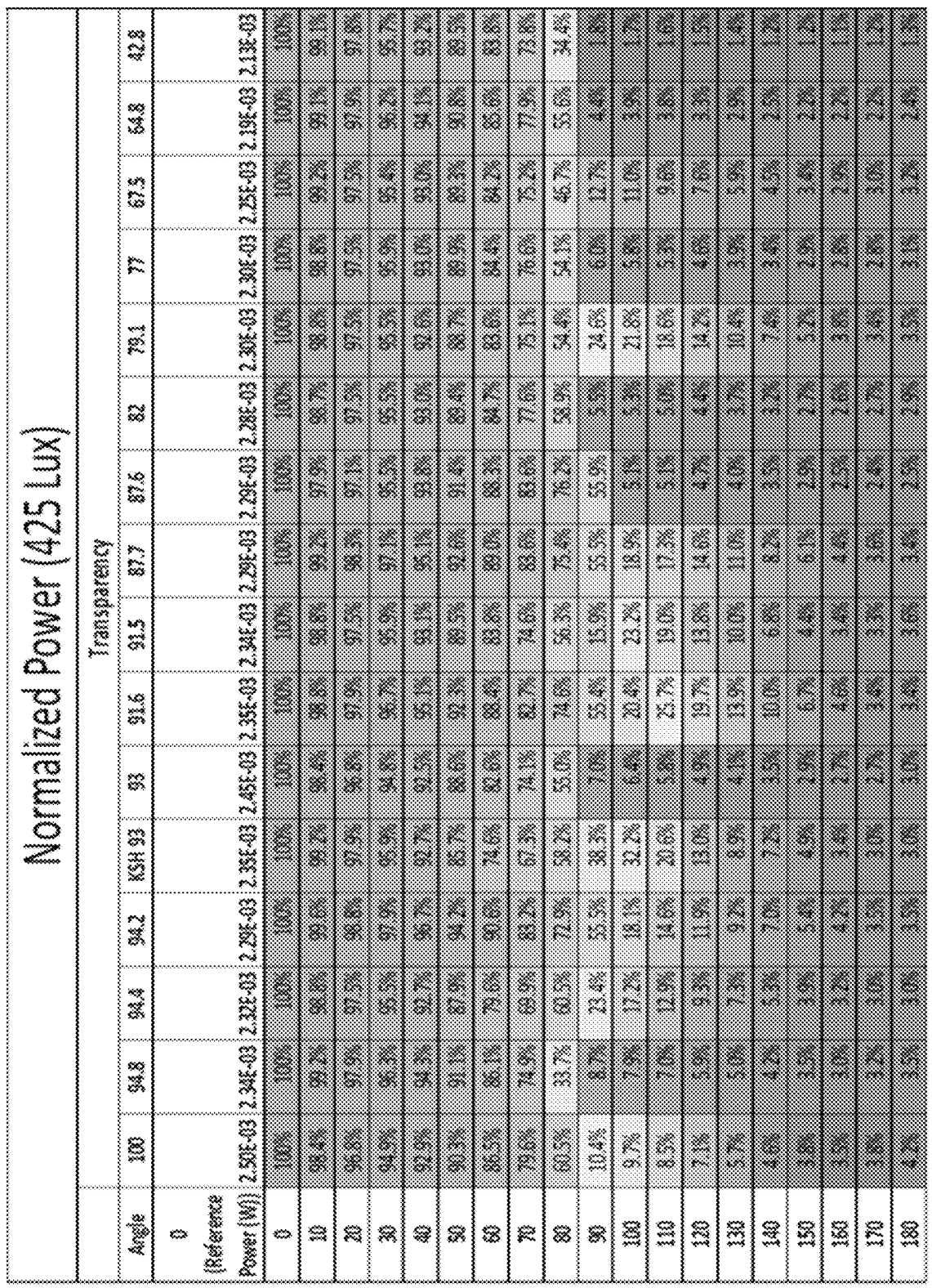

FIG. 59 is a normalized power drop as the angle from normal is increased for the polycarbonate film and acrylic diffusers. This table is for 425 lux and shows how the total power of the system drops at different rates for different diffusers-425 was chosen as a baseline as it is a median value. The standard deviation of the 100% transparency test is 1.017.

FIG. 60 is a normalized power drop as the angle from normal is increased for the polycarbonate diffusers.

FIG. 61 shows normalized power drop relative to no diffuser on the PV cell as the angle from normal is increased for the polycarbonate film and acrylic diffusers. This table is for 425 lux and shows how the total power of the system is influenced by the use of each diffuser. 425 was chosen as a baseline as it is a median value.

FIG. 62 shows normalized power drop relative to no diffuser on the PV cell as the angle from normal is increased for the polycarbonate diffusers.

Figure 63:
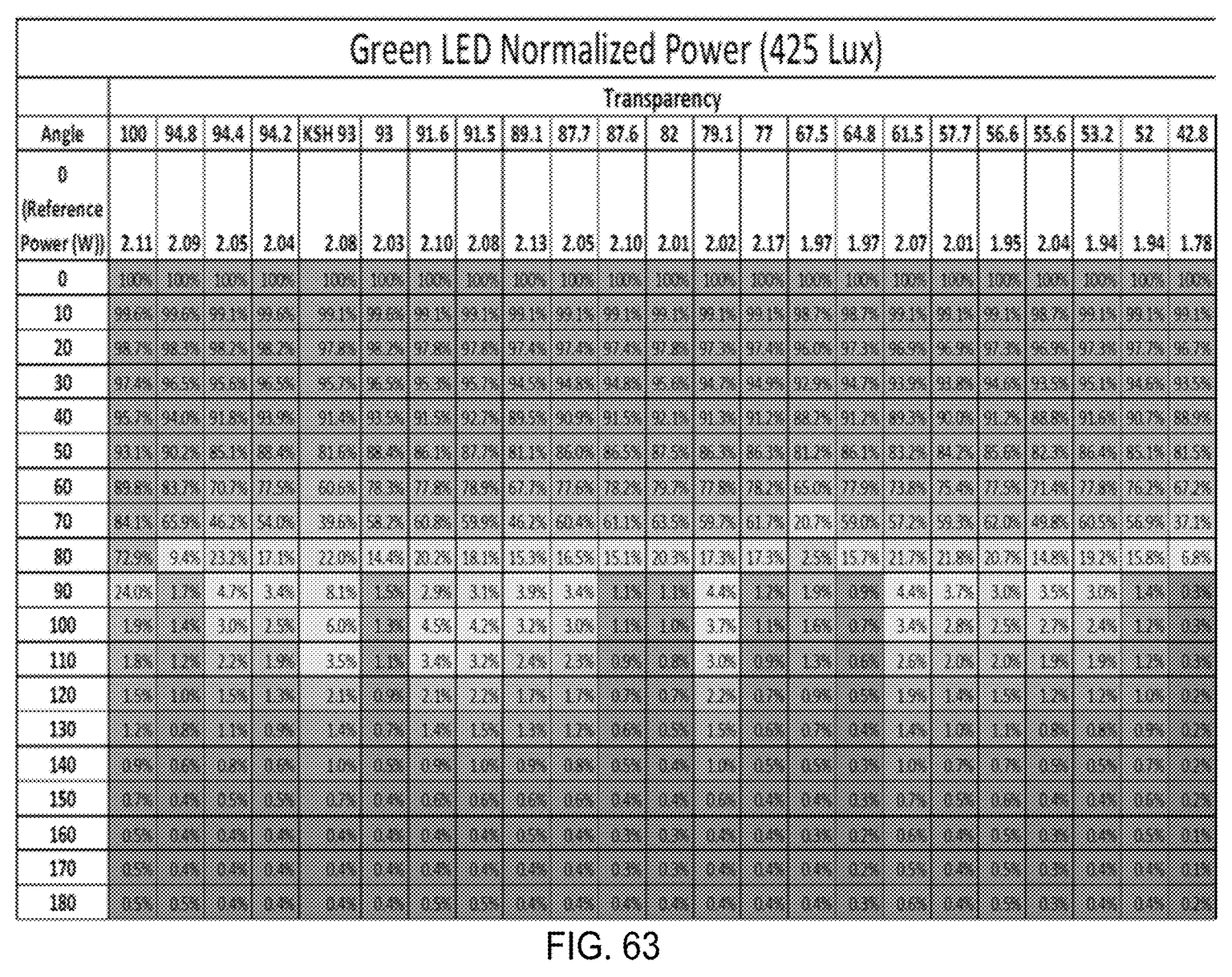

FIG. 63 shows a normalized power drop as the angle from normal is increased for different LED colors.

Figure 65:
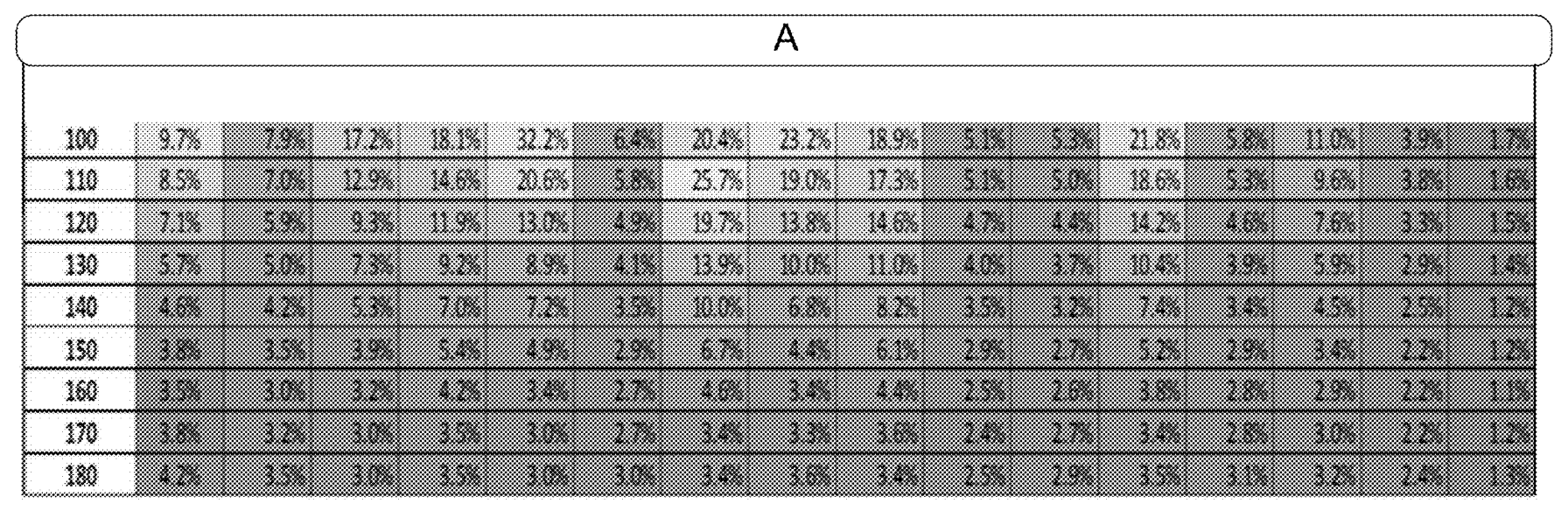

FIG. 64 and FIG. 65 together show a normalized power drop as the angle from normal is increased for different LED colors.

Figure 66:
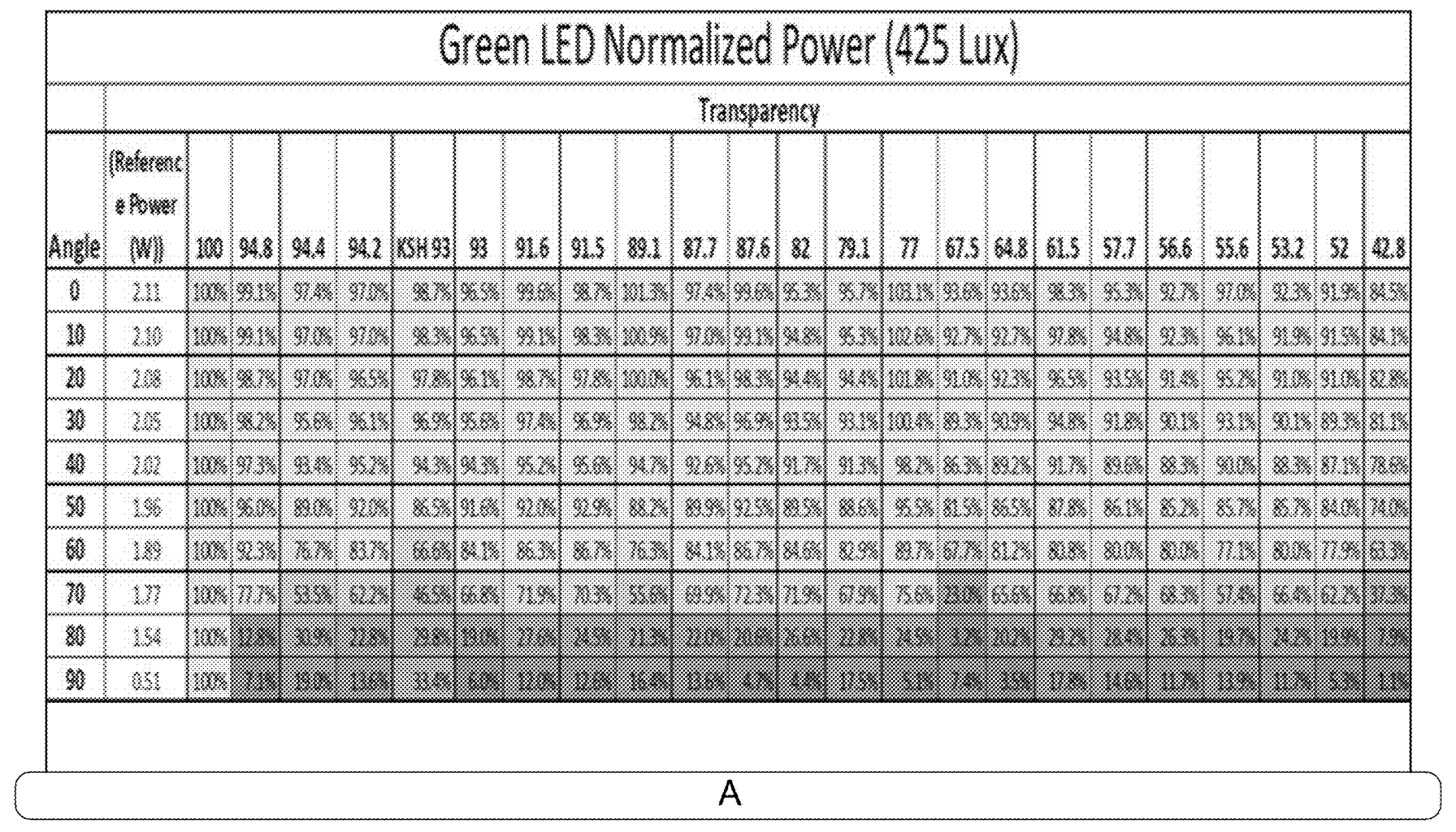
Figure 67:
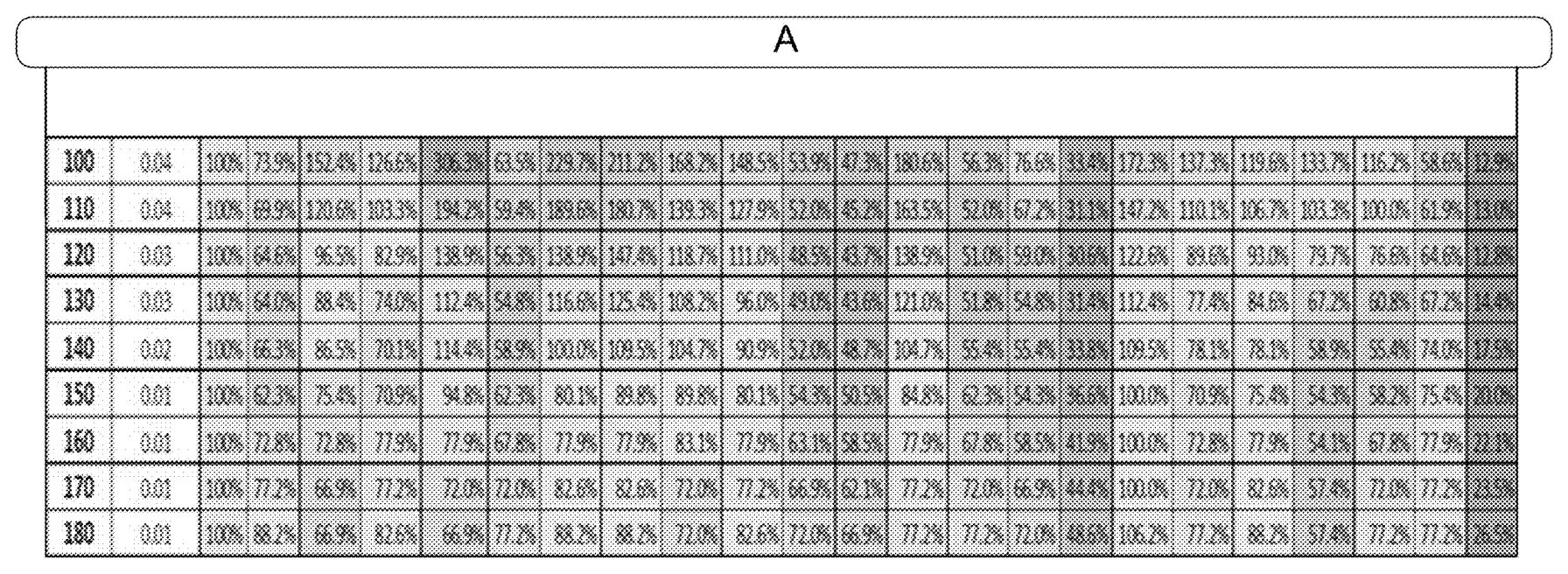

FIG. 66 and FIG. 67 together show a normalized power drop to a cell with no diffuser as the angle from normal is increased for different LED colors.

Figure 69:
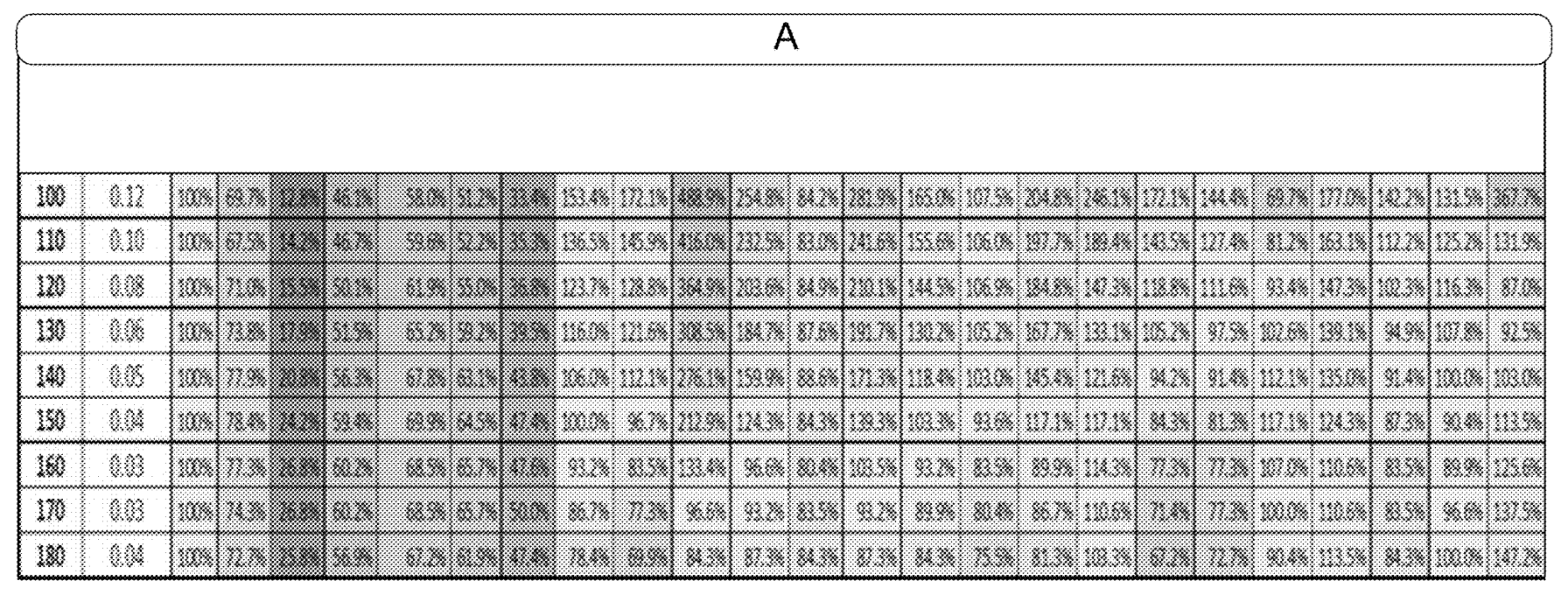

FIG. 68 and FIG. 69 together show a normalized power drop to a cell with no diffuser as the angle from normal is increased for different LED colors.

FIG. 70 is the power ratio between two and one cell setups. The green cells are where 2 cell power (P2) over 1 cell power (P1) is greater than 2. Red cells are where P2/P1 is less than 1.

FIG. 71 is a single PV cell in the dual PV configuration with a reflective surface over the other holder.

FIG. 72 is the power ratio between one cell with a reflective surface and one cell setup.

FIG. 73 is the power ratio between two cells with a reflective surface on one cell and two cells with no reflective surfaces.

FIG. 74 is the power ratio between two cells with a reflective surface on one cell and two cells with no reflective surfaces.

FIG. 75 is a plural colored test for 1-Cell Normalized Green LED Test for the single cell measurement divided by the white LED's power output for each cell in the table.

FIG. 76 is a plural colored test for 1-Cell Normalized Blue LED Test for the single cell measurement divided by the white LED's power output for each cell in the table.

FIG. 77 is a plural colored test for 2-Cell Normalized Green LED Test measuring across a single cell normalized to white LED tests under the same conditions as FIG. 75 and FIG. 76.

FIG. 78 is a plural colored test for 2-Cell Normalized Blue LED Test measuring across a single cell normalized to white LED tests under the same conditions as FIG. 75 and FIG. 76.

FIG. 79 is a plural colored test made by taking the values from FIG. 77 over the values from FIG. 75.

FIG. 80 is a plural colored test made by taking the values from FIG. 78 over the values from FIG. 76.

Corresponding reference numerals indicate corresponding parts throughout the several views of the drawings.

DETAILED DESCRIPTION

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of electromagnetic energy converter 14 in use or operation in addition to the orientation depicted in the figures. For example, if electromagnetic energy converter 14 in the figures is turned over, elements described as "below" or "beneath" other elements or features would then be oriented "above" the other elements or features. Thus, the example term "below" can encompass both an orientation of above and below. Electromagnetic energy converter 14 may be otherwise oriented (rotated 90 degrees or at other orientations) and the spatially relative descriptors used herein interpreted accordingly.

Various projects have investigated in depth the applications of wireless energy conversion/harvest technology. The present teachings address the unmet need for converting wave/particle energy of varying intensities to power electronic/thermal/mechanical devices without the need for physical connections (e.g., wires).

With particular reference to FIGS. 1-18, in some embodiments, the present teachings provide an electromagnetic energy converter system 10 (see FIGS. 2 and 18) having an energy source 12 and an electromagnetic (EM) energy converter 14 to convert mono and/or polychromatic wave and/or particle energy from energy source 12 to electricity and/or heat in electromagnetic energy converter 14. In particular, the present teachings incorporate a third dimension to traditional energy conversion devices to increase conversion efficiency (i.e. watts per square meter).

In some embodiments, energy source 12 can comprise high-power lasers, particle accelerometers, or other synthetic electromagnetic energy sources radiating waves such as but not limited to radio waves, microwaves, infrared emission, visible emission, ultraviolet emission, X-rays, and Gamma rays to illuminate electromagnetic energy converter 14. In some embodiments, energy source 12 can be a naturally-occurring source, such as but not limited to the sun, luminescence, thermal radiation, plasma radiation, radioactive radiation, and vibration. Moreover, energy source 12, in some embodiments, is ground-based, air-based, and/or space-based. The electromagnetic energy used in the present teachings can be of various waveforms including but not limited to short pulses, sine waves, modified sine waves, square waves, and arbitrary waves. The electromagnetic energy used in the present teachings is also selected from a list of monochromatic, polychromatic, polar, non-polar, coherent, non-coherent, collimated, and divergent waveforms.

In some embodiments, electromagnetic energy converter 14 comprises an enclosure case or housing 16 having one or more cells 18 (e.g., a photovoltaic cell, a thermophotovoltaic cell, a thermionic converter, a thermoelectric converter, a piezoelectric converter, an electrochemical converter, or a bio-electrochemical converter) disposed at least partially within housing 16. In some embodiments, cells 18 can comprise, but not limited to, inorganic cells, organic cells, amorphous cells, polycrystalline cells, monocrystalline cells, organic light emitting diodes (OLEDs), quantum dots, perovskite cells, thermophotovoltaic cells and the like. In some embodiments, cells 18 are comprised of materials in gas, liquid, or solid phases or a combination thereof. In some embodiments, cells 18 are in the form of films, slabs, sheets, rods, particles, solution, mixture or the like. These substances are used to convert (monochromatic and polychromatic) EM energy to electricity. It should be understood that electromagnetic energy converter 14 can comprise a plurality of cells 18 being of different types or of similar types with different bandwidths or operational and physical characteristics.

In some embodiments, electromagnetic energy converter 14 can comprise one or more lenses or optical inputs 20 for receiving and manipulating mono and/or polychromatic wave and/or particle energy from energy source 12. In some embodiments, housing 16 can be substantially rectangular shaped having opposing end faces 22 and side faces 24. In some embodiments, one or both end faces 22 can include one or more lenses 20. It should be understood that lenses or optical inputs 20 are optional in some embodiments and thus wave and/or particles can be introduced in alternative ways, such as but not limited to through holes, or non-transforming mediums (such as non-optical material).

In some embodiments, electromagnetic energy converter 14 can comprise a plurality of internal layers or materials 26 disposed along one or more (e.g. all) internal surfaces of housing 16 to direct or manipulate the wave or particle energy within the housing 16 to enhance contact with cells 18. In other words, in some embodiments, electromagnetic energy converter 14 can comprise an internal layer 26 disposed on an interior facing surface of one or more of end faces 22 and side faces 24. In some embodiments, internal layer 26 is a diffusive and/or dispersive and/or luminescent medium. For example, in some embodiments, internal layer 26 can comprise a diffusive material/composite, such as but not limited to polymers including acrylic resin, polycarbonate, and polymethyl methacrylate, curable polymers, casting polymers, and reinforced polymers. In some embodiments, internal layer 26 can comprise a dispersive medium, preferably a transparent matrix into which a dispersing material is placed. Each dispersing medium has distinct dispersive powers and is comprised of dispersive material such as but not limited to small light-scattering particles such as titanium dioxide crystals and metallic mirrors. In some embodiments, internal layer 26 can comprise a luminescent material, such as but not limited to inorganic luminescent materials such as quantum dots, light-emitting dopants and organic and fluorescent Dyes. Luminescent materials can be used to convert the incoming wave and/or particle from one type and/or wavelength to one compatible with electromagnetic energy converter 14 and, specifically, cells 18. It should be understood that internal layer 26 can include a combination of transparent, refractive, diffusive, dispersive, and luminescent characteristics. In some embodiments, internal layer 26 comprises one or more highly-reflective and/or non-absorbing materials to increase conversion efficiency of electromagnetic energy converter 14. It should be understood that electromagnetic energy converter 14 can comprise a plurality of layers or materials 26 being of different types or of similar types with different operational characteristics.

Figure 1:
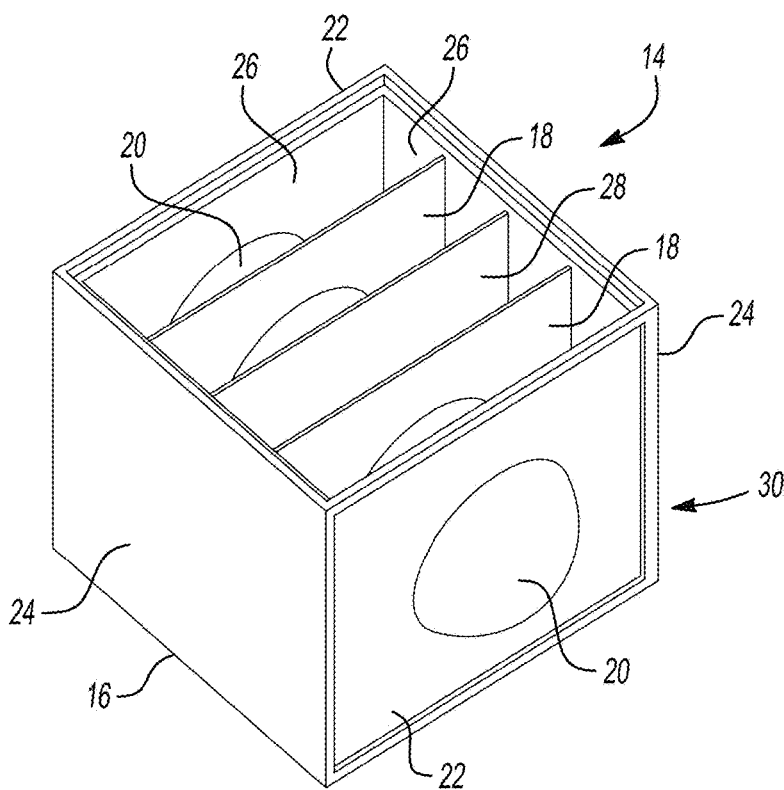
FIG. 1 illustrates a perspective view of an enclosed electromagnetic (EM) energy converter according to the principles of the present teachings.

In some embodiments, electromagnetic energy converter 14 can comprise one or more active, adaptive, and/or optoelectronic optical systems, generally referenced as 30. Such systems can comprise lenses or waveguides 20 and/or additional one or more optical layers 28 disposed within or outside housing 16. In some embodiments, optical layer 28 can be disposed between adjacent cells 18 as illustrated in FIG. 1. Optical layer 28 can comprise diffusive and/or dispersive and/or luminescent medium material, such as but not limited to metallic mirrors. In some embodiments, optical system 30 is an active system that actively manages transmission and/or reflection of EM wave and/or particle into electromagnetic energy converter 14 and to cells 18. In some embodiments, optical system 30 is housed outside the convertor and is comprised of active and/or adaptive optics 46 to prevent deformation due to external influences such as wind, temperature, mechanical stress or to compensate for atmospheric effects.

Figure 2:
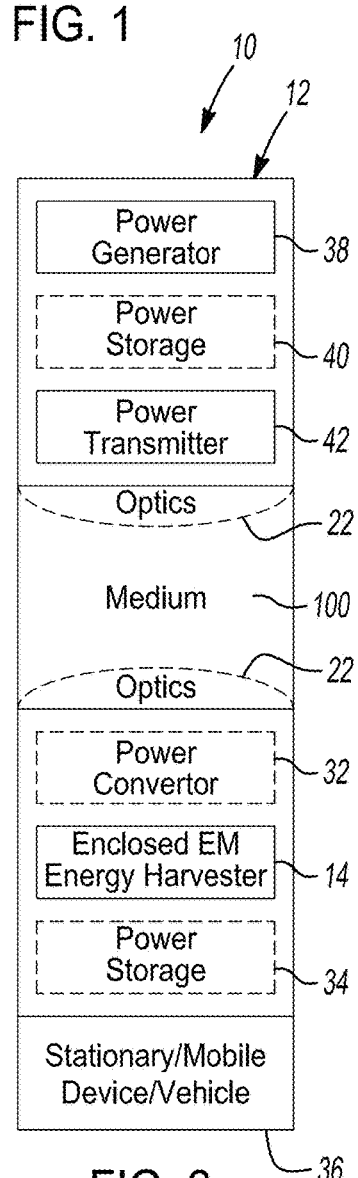
FIG. 2 is a schematic view illustrating the principles of operation of the present teachings.
Figure 16:
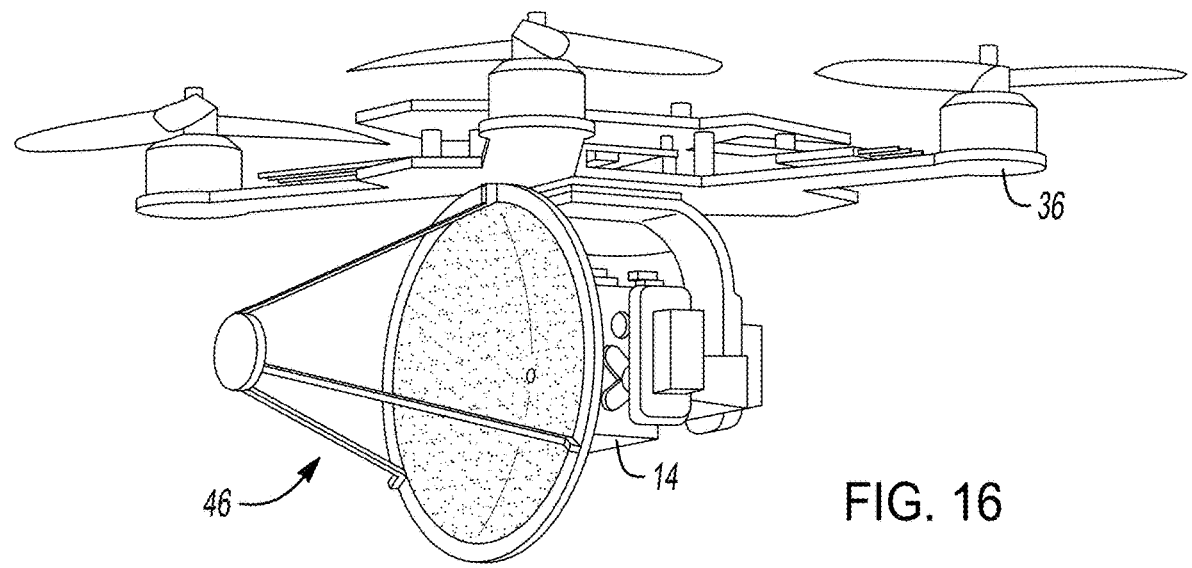
FIG. 16 illustrates a perspective view of an electromagnetic (EM) energy converter mounted to an unmanned aerial vehicle (UAV) according to the principles of the present teachings.
Figure 17:
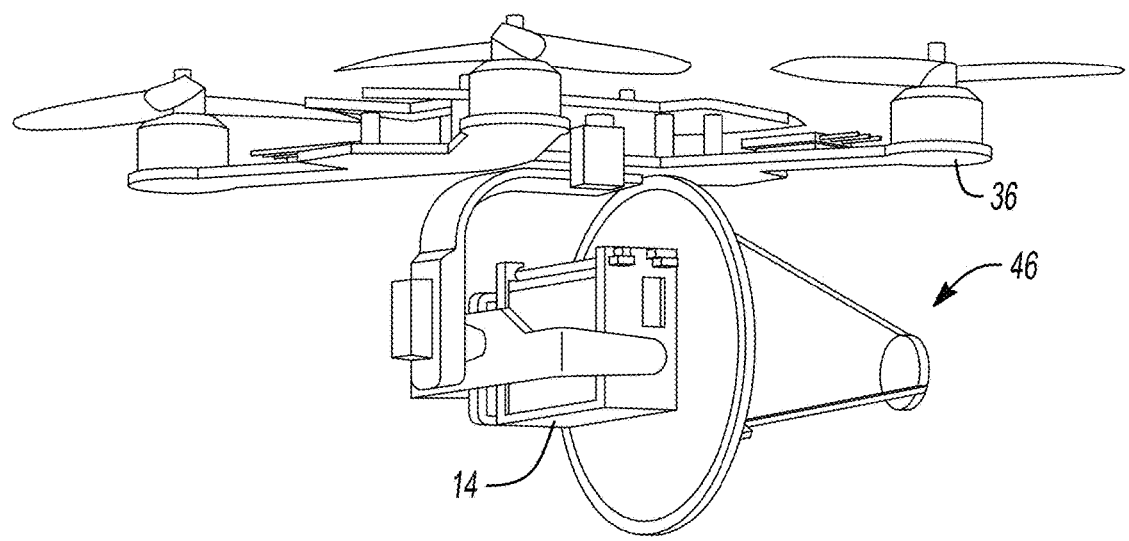
FIG. 17 illustrates a perspective view of an electromagnetic (EM) energy converter of FIG. 16 mounted to an unmanned aerial vehicle (UAV) according to the principles of the present teachings.
Figure 18:
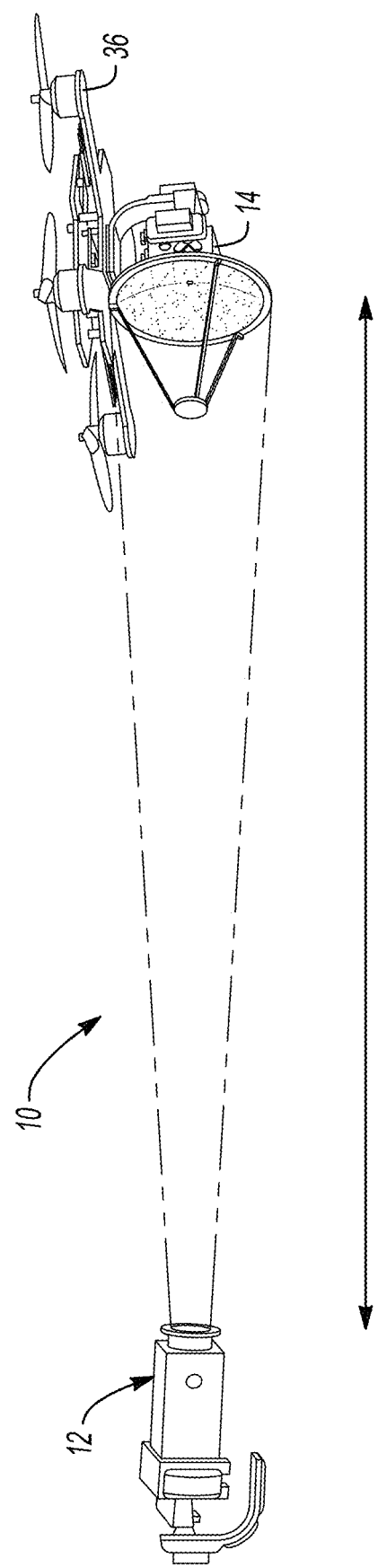
FIG. 18 illustrates a perspective view of an electromagnetic (EM) energy converter and the principles of operation of the present teachings.

With particular reference to the schematic of FIG. 2, electromagnetic energy converter system 10 is shown having energy source 12 and an electromagnetic (EM) energy converter 14 operably coupled across a medium 100. It should be understood that medium 100 can comprise any medium operable to transmit wave and/or particle energy, such as but not limited to air, gas, liquid, solid, vacuum, fiber optic, and the like. As illustrated in FIG. 2, electromagnetic energy converter system 10 can comprise an optional power converter 32 and a power storage system 34. In some embodiments, power converter 32 is configured to convert and/or filter wave and/or particle energy to another form, frequency, and/or type. In this way, power converter 32 can be used to specifically convert ultraviolet beam to, for example, visible beam or other useable form. In some embodiments, optical filters are used to alter the wave into a uniform waveform such as polar or collimated waveforms. In some embodiments, a diffraction medium (e.g., diffraction grating or prism) is used to selectively choose a narrow bandwidth. In some embodiments, shutters control EM radiation intervals for improved safety and also to enable short-duration pulses of EM radiation. Additionally, it should be understood that power storage 34 can be operably coupled to electromagnetic energy converter 14 to store and/or otherwise manage the use of the produced electricity output from electromagnetic energy converter 14. In some embodiments, electromagnetic energy converter 14 and optional power converter 32 and/or power storage 34 can be carried or otherwise supported by a stationary member (i.e. physical support or foundation) and/or a mobile device (e.g. unmanned aerial vehicle (UAV), aircraft, boat, vessel, vehicle, train, satellite, or any structure requiring or benefit from energy usage, or storage, and/or retransmission), collectively referenced at 36. It should be noted that particular application in a UAV is illustrated in FIGS. 16-18.

With continued reference to FIG. 2, likewise, energy source 12 can comprise a power generator 38, an optional power storage system 40, and a power transmitter 42. In some embodiments, energy source 12 comprises, but is not limited to, a diffuse laser 12.

Figure 3:
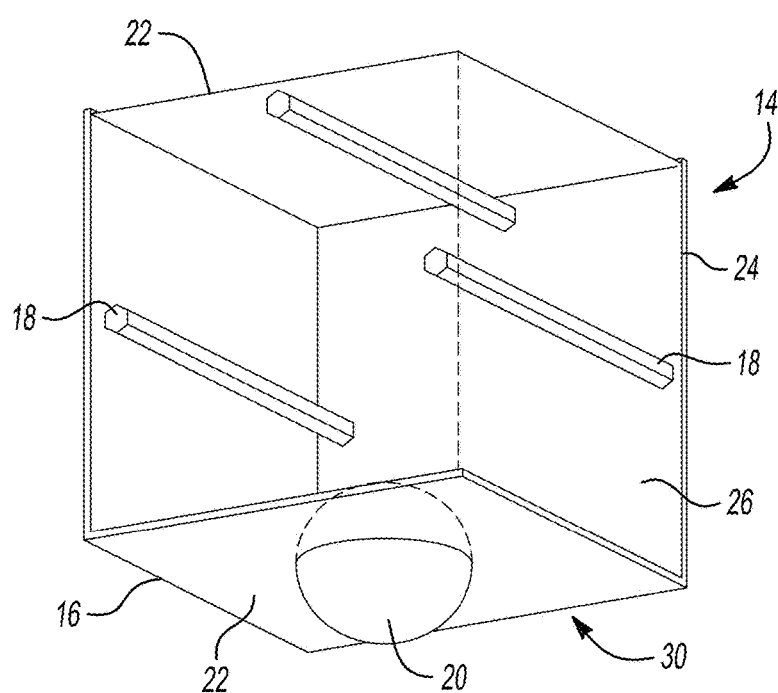
FIG. 3 illustrates a perspective view of an open-face electromagnetic (EM) energy converter according to the principles of the present teachings having a liquid or solid converter.

With reference to FIG. 3, in some embodiments, electromagnetic energy converter system 10 can comprise a gas, liquid or solid electromagnetic energy converter 14 disposed through a part or an entirety of the internal volume of housing 16. In this regard, gas, liquid or solid electromagnetic energy converter 14 generally fills a remaining volume within housing 16 unoccupied by associated structure. In some embodiments, as illustrated in FIG. 3, cells 18 can comprise rod-shaped elements to conduct the EM energy converted into electric current, such as but not limited to reflective rod elements.

Figure 4:
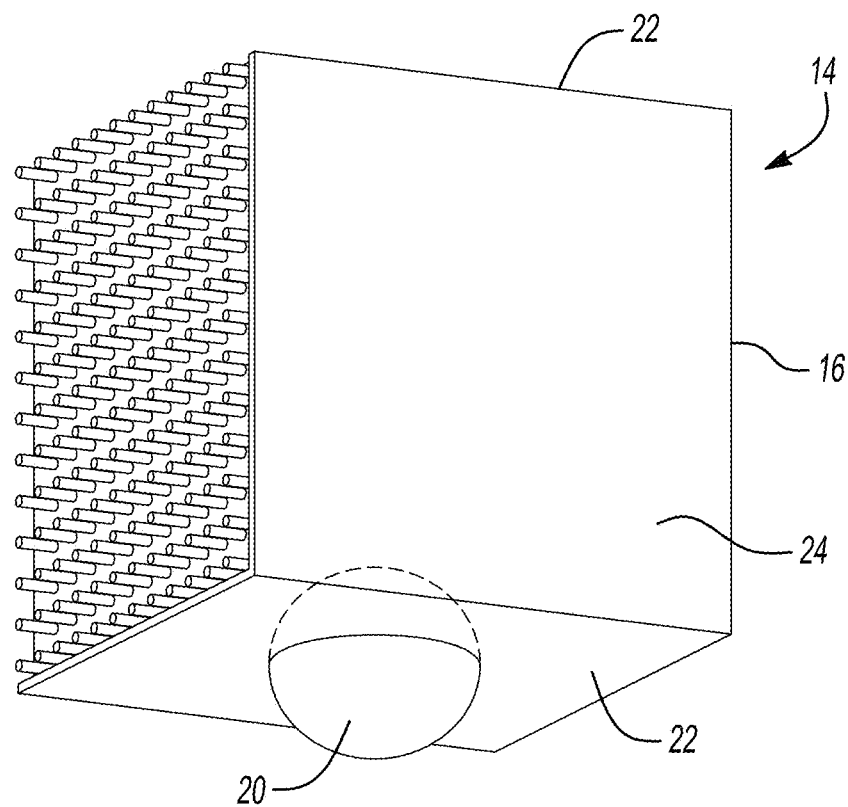
FIG. 4 illustrates a perspective view of an electromagnetic (EM) energy converter according to the principles of the present teachings having a matrix of electric poles that conducts converted EM energy.
Figure 5:
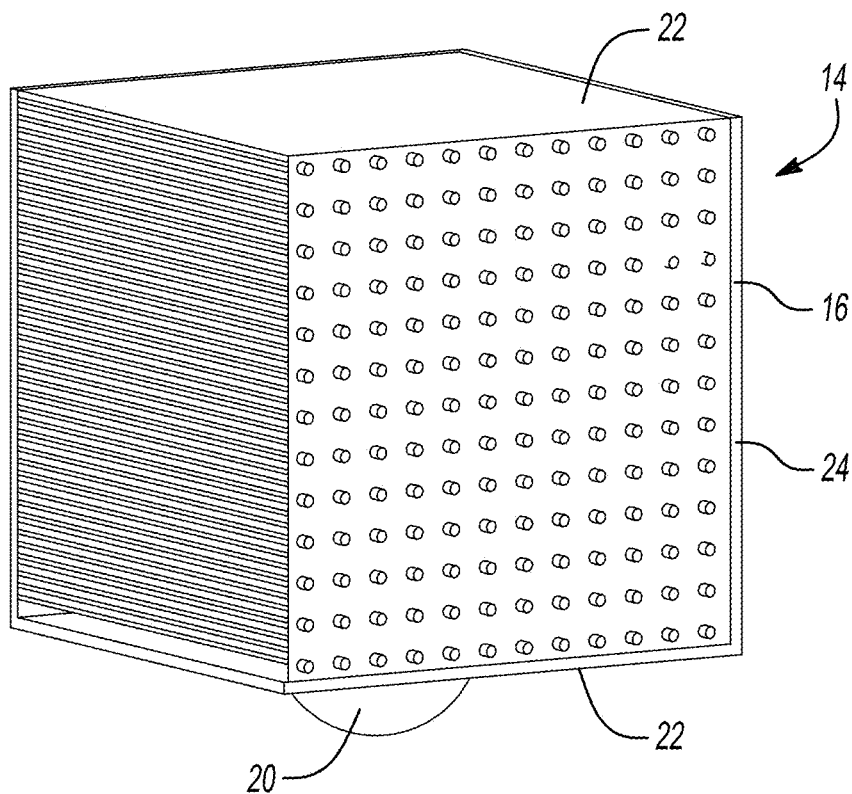
FIG. 5 illustrates a perspective view of the electromagnetic (EM) energy converter of FIG. 4.

In some embodiments, as illustrated in FIGS. 4 and 5, electromagnetic energy converter 14 can comprise a matrix of electric poles that conducts the converted EM energy. An electric circuit, such as schematically illustrated in FIG. 2, can comprise diodes, capacitors, and other electric components to regulate, store, and/or consume the EM energy converted into electric current.

Figure 6:
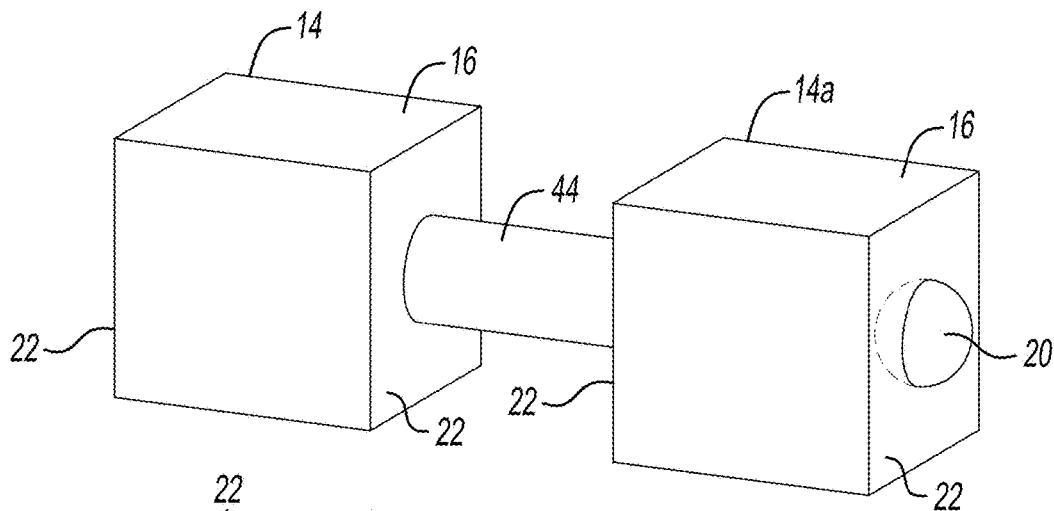
FIG. 6 illustrates a perspective view of a pair of electromagnetic (EM) energy converters coupled in series according to the principles of the present teachings.
Figure 7A:
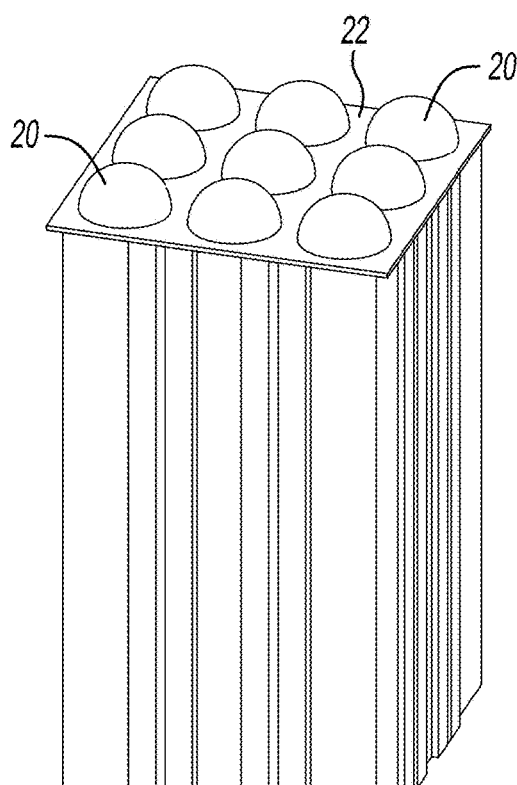
FIG. 7A illustrates a perspective view of a plurality of electromagnetic (EM) energy converter coupled in parallel according to the principles of the present teachings.

With particular reference to FIGS. 6 and 7A, in some embodiments, electromagnetic energy converter system 10 can comprise a plurality of electromagnetic energy converters 14, 14a, . . . 14n to enhance the degree to which the EM beam is converted to electricity. In such embodiments, electromagnetic energy converters 14, 14a may be coupled in in series (FIG. 6) and/or in parallel (FIG. 7A). With reference to FIG. 6, electromagnetic energy converters 14, 14a can be operably and physically coupled via an optical interface or waveguide 44 to permit and facilitate the transmission and communication of waves and/or particles between electromagnetic energy converters 14, 14a. In some embodiments, optical interface 44 can be part of optical system 30 and can comprise, but is not limited to, a fiber optic cable. It should be understood that waves and/or particles can travel uni-directionally or multi-directionally between electromagnetic energy converters 14, 14a. With reference to FIG. 7A, in some embodiments, electromagnetic energy converters 14, 14n can be arranged such that each of electromagnetic energy converters 14, 14a, 14n is parallel to an adjacent electromagnetic energy converter and each may include an individual lens 20 or a common lens. Moreover, in some embodiments, each electromagnetic energy converter 14, 14a, 14n can remain self-contained, thereby preventing sharing of wave and/or particle input energy, or may permit transmission of wave and/or particle input energy to adjacent converts.

Figure 7B:
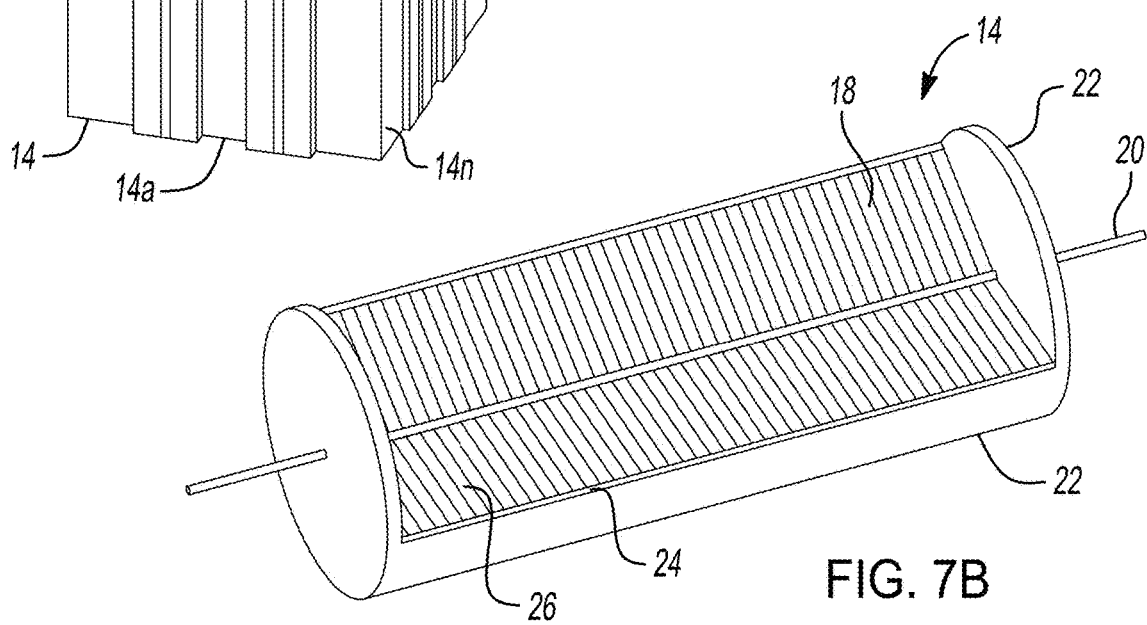
FIG. 7B illustrates a perspective view of an electromagnetic (EM) energy converter mounted around a fiber optic transmitting EM energy and information.

With reference to FIG. 7B, in some embodiments, electromagnetic energy converter 14 can comprise a combination of cells 18, different concentrations (radial gradient) of EM energy-dispersive material within a light-transmissive medium 26 enclosed within a housing 22, conductive film, reflective surfaces to reflect the EM energy back into the EM energy-dispersive material within a light-transmissive medium. The EM energy transmits into EM energy convertor through a fiber optic 20. The fiber optic can be stripped of its cladding over a distal length. A fraction of the EM energy enters the EM energy converter while scattering and propagating in the radially-gradient EM energy-dispersive medium. The EM energy is reflected off the reflective end faces 22 and side faces 24 back into the dispersive medium. In some embodiments, multiple refractive layers with different refraction indexes are used to selectively guide EM-waves. In general, with the combination of the above elements the directionality and intensity distribution of the EM wave entering the EM convertor may be controlled. The remaining fraction of EM energy propagates through the fiber optic out of the EM convertor on the other end. The outgoing fraction of EM wave may be used to communicate information.

Figure 8:
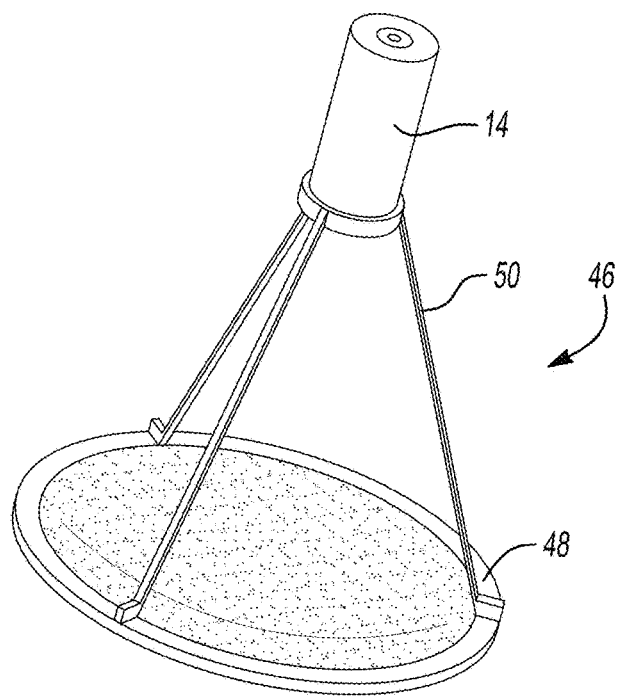
FIG. 8 illustrates a perspective view of an electromagnetic (EM) energy converter mounted to an EM receiver dish according to the principles of the present teachings.
Figure 9:
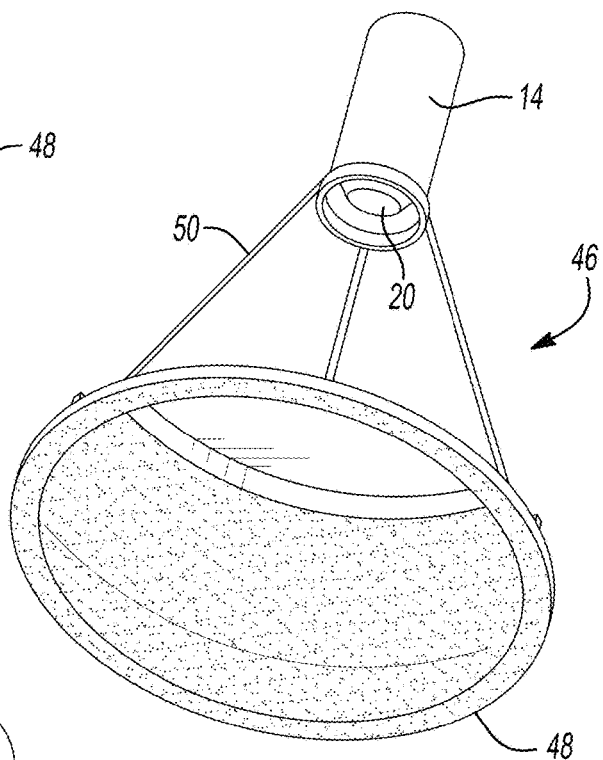
FIG. 9 illustrates a second perspective view of the electromagnetic (EM) energy converter of FIG. 8 mounted to the EM receiver dish according to the principles of the present teachings.
Figure 10:
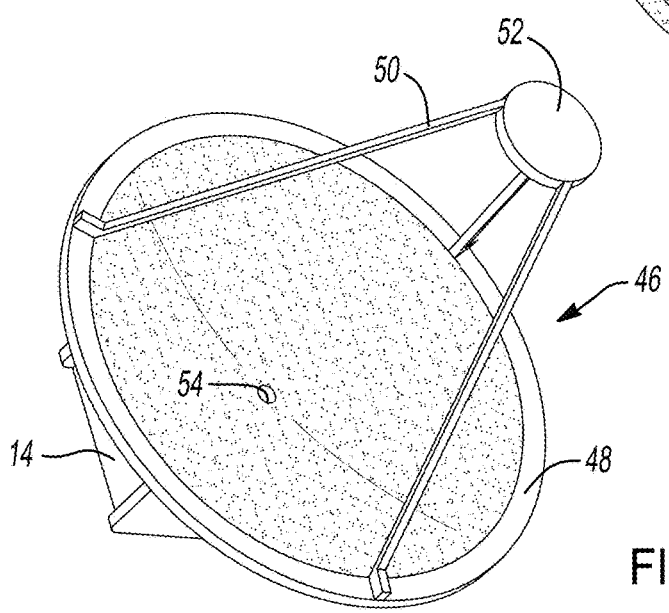
FIG. 10 illustrates a perspective view of an electromagnetic (EM) energy converter mounted to an EM receiver dish according to the principles of the present teachings.
Figure 11:
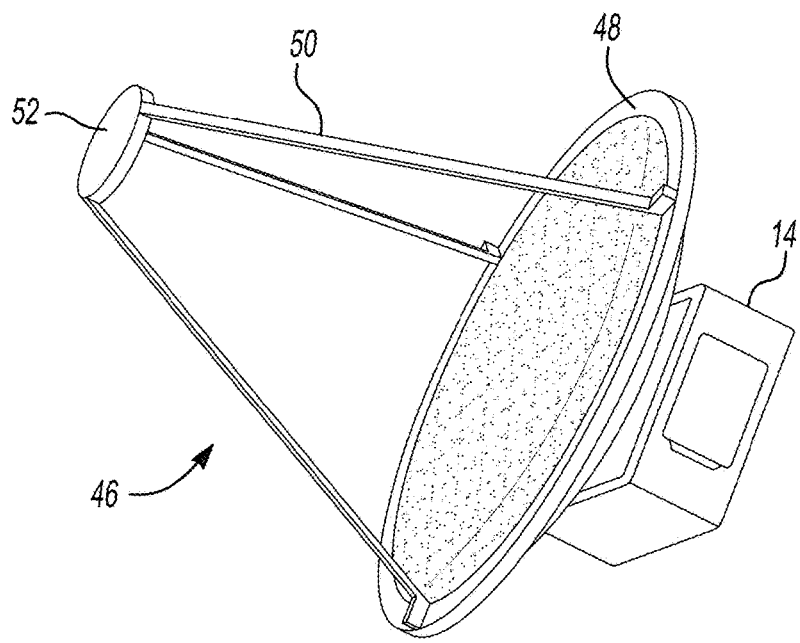
FIG. 11 illustrates a second perspective view of the electromagnetic (EM) energy converter of FIG. 10 mounted to the EM receiver dish according to the principles of the present teachings.

With reference to FIGS. 8 and 9, in some embodiments, electromagnetic energy converter 14 can be mounted on or supported by an EM receiver dish 46. EM receiver dish 46 can comprise a dish member 48 for receiving energy transmitted from energy source 12 or other source (i.e. naturally occurring source). In some embodiments, dish member 48 is a parabolic dish supporting electromagnetic energy converter 14 via legs 50 configured to focus the received energy directly to an input (e.g. lens 20) of electromagnetic energy converter 14. In some embodiments, to minimize loss of energy, a single-bounce configuration of EM receiver dish 46 can be used (i.e. energy received is bounced a single time before focused into electromagnetic energy converter 14). Similarly, with reference to FIGS. 10 and 11, in some embodiments, EM receiver dish 48 can comprise electromagnetic energy converter 14 mounted behind dish member 48 and a supplemental active and/or adaptive optics 30 such as a concentrator dish 52 supported by legs 50 is used to focus the energy transmitted to electromagnetic energy converter 14 to a through hole 54 formed in dish member 48 coupled to lens 20 of electromagnetic energy converter 14. In this way, energy can be focused, albeit via two bounces, to electromagnetic energy converter 14. As seen in FIGS. 16-18, in some embodiments, electromagnetic energy converter 14 (singly or with EM receiver dish 48) may be mounted, supported, and carried by vehicles, such as UAVs and the like. In some embodiments, electromagnetic energy converter system 10 can comprise an accurate and precise tracking and feedback system 62 for high-precision and reliable energy delivery. In some embodiments, adaptive optics 30 can be employed to compensate for potential environmental turbulences.

Figure 12:
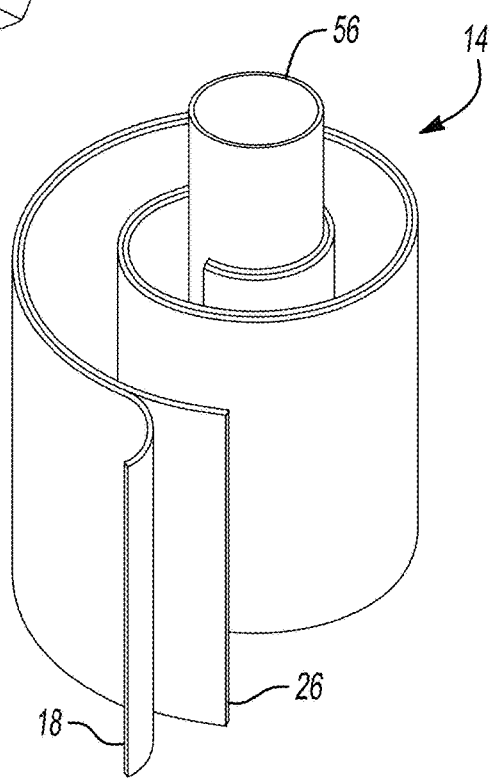
FIG. 12 illustrates a perspective view of an electromagnetic (EM) energy converter having a roll-able construction according to the principles of the present teachings.
Figure 13:
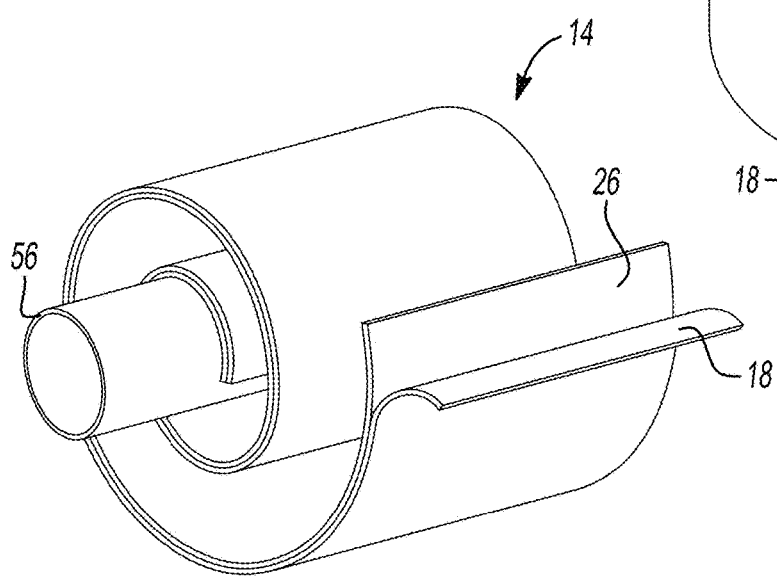
FIG. 13 illustrates a perspective view of the electromagnetic (EM) energy converter of FIG. 12 having a roll-able construction according to the principles of the present teachings.

With reference to FIGS. 12 and 13, in some embodiments, electromagnetic energy converter 14 can comprise a ribbon architecture comprising a centrally disposed fiber optic 56 having a ribbon of cells 18' and conductive material (e.g., film), together with a reflective or diffusive layer 26. In other words, in some embodiments, electromagnetic energy converter 14 can comprise roll-able sheets including a photovoltaic material, dispersive medium, reflective medium, conductive (and, in some embodiments, dielectric) material, and waveguides (i.e., refractive medium). The EM energy propagates through the waveguide and can be stripped of its cladding over a distal length. The EM energy is introduced into the converter while scattering and propagating in a dispersive medium. The EM beam is reflected off the reflective surfaces.

Figure 14:
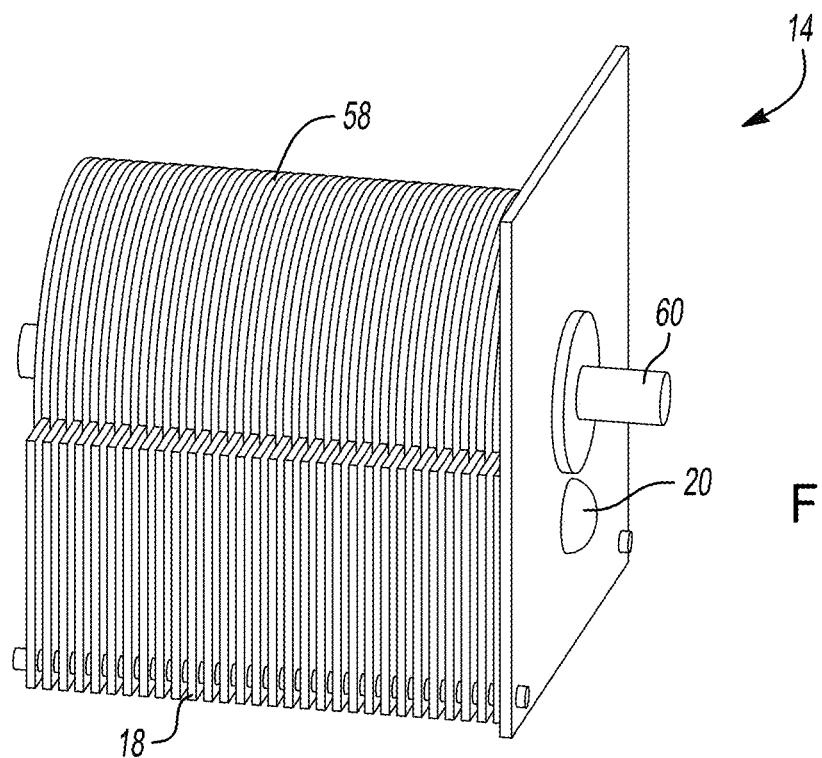
FIG. 14 illustrates a perspective view of an adjustable electromagnetic (EM) energy converter according to the principles of the present teachings.
Figure 15:
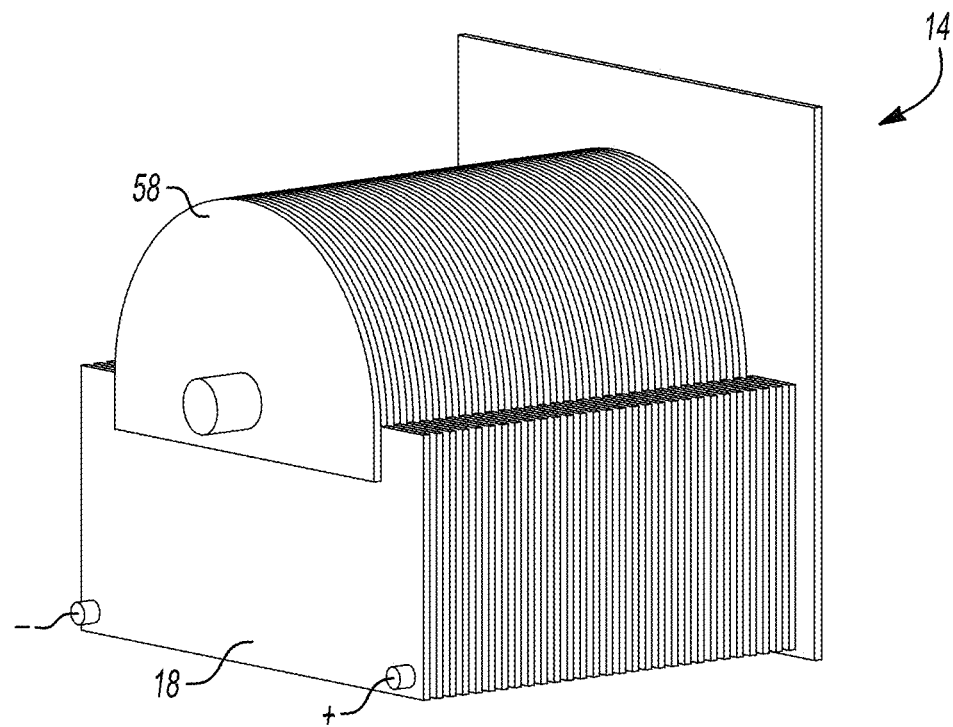
FIG. 15 illustrates a perspective view of the adjustable electromagnetic (EM) energy converter of FIG. 14 according to the principles of the present teachings.

In some embodiments, as illustrated in FIGS. 14 and 15, a generally adjustable electromagnetic energy converter 14'. The output of adjustable electromagnetic energy converter 14' is a function of the relative positions of an array of disks 58 interspersed within cells 18 (disposed in parallel). The output of electromagnetic energy converter 14' is changed via rotation of disks 58 to obstruct or otherwise reveal cells 18 to incoming EM wave and/or particles. The relative position of the array of disks is changed by rotating a pin member 60 operably coupled to disks 58 that selective, partially, and/or completely obstructs or otherwise reveals cells 18 to EM wave and/or particles entering lens 20. In some embodiments, the array of disks 58 is coated with refractive and/or reflective materials.

Figure 19A:
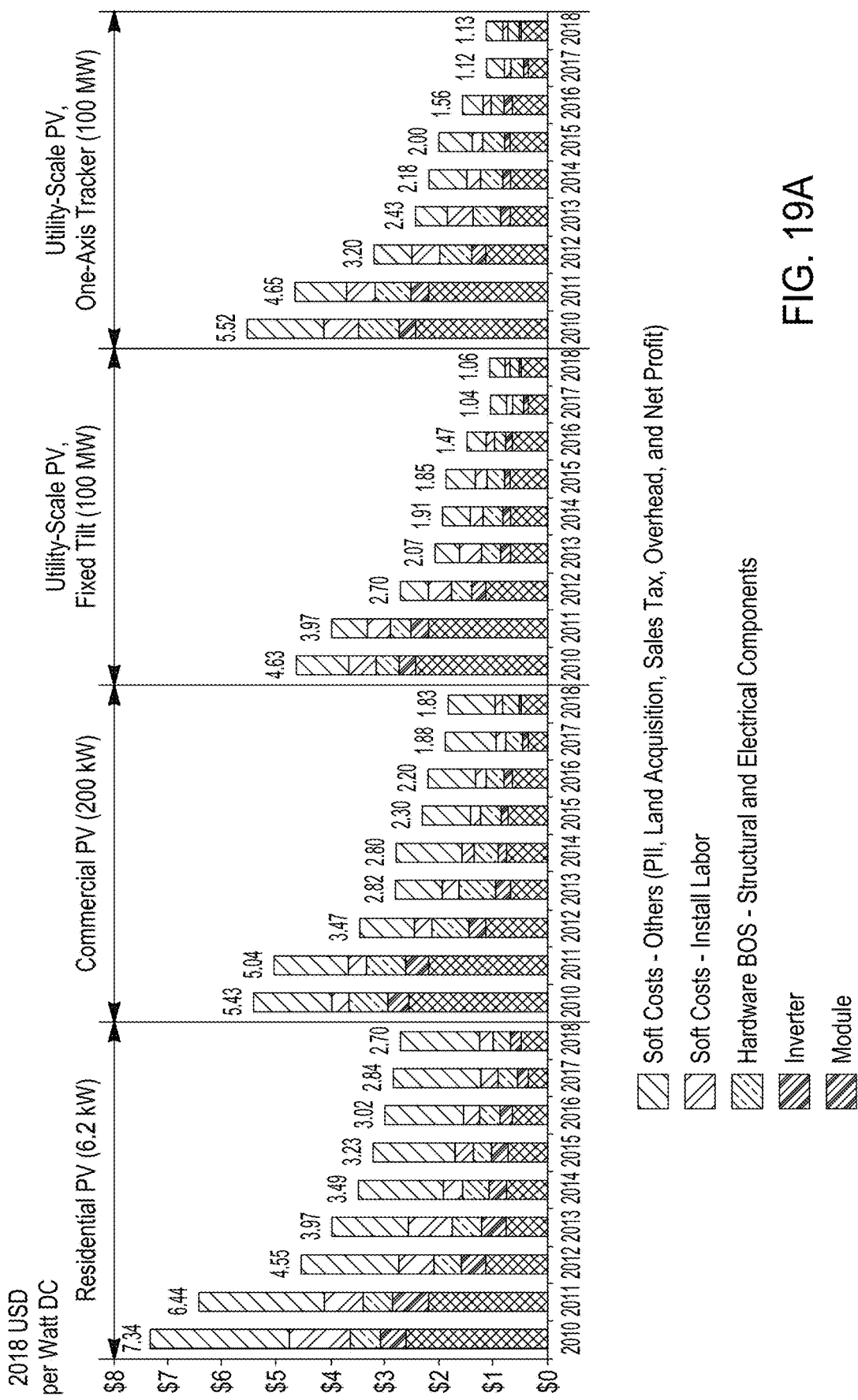
FIG. 19A is an NREL PV system cost benchmark summary (inflation adjusted), 2010-2018.

According to the National Renewable Energy Laboratory (NREL), the overall cost of solar modules has been reducing in the United States and across the world over the past decade. As indicated in FIG. 19A, the overall cost of Residential PV arrays has reduced from $7.34/watt in year 2010 to $2.70/watt in year 2018. The cost reduction is mainly due to the decreasing cost of solar modules, thanks to automation.

Figure 19B:
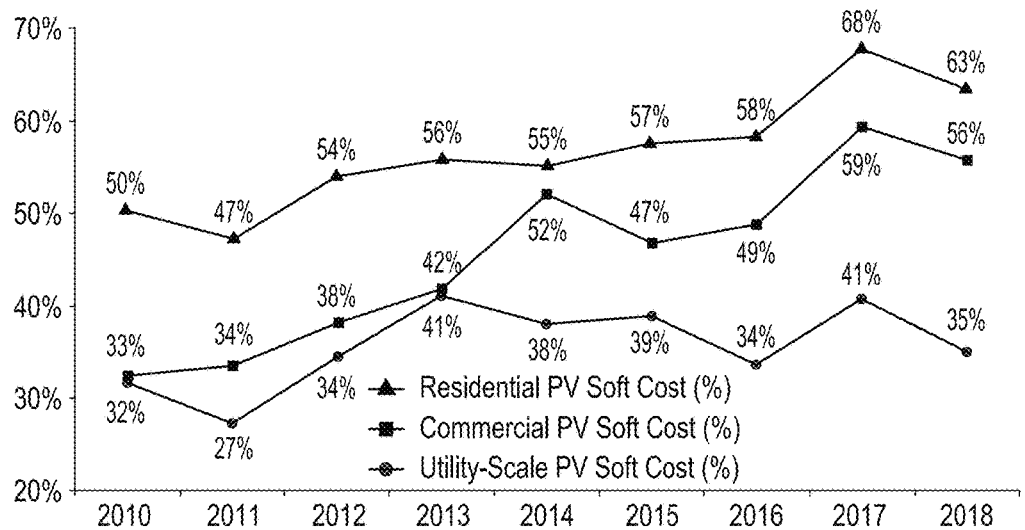
FIG. 19B is a modeled trend of soft cost as a proportion of total cost by sector, 2010-2018.

On the other hand, the soft costs, which include expenses such as land acquisition, install labor, and overhead costs have remained steadily high throughout the past decade. In fact, as FIG. 19B suggests, the overall contribution of soft costs, especially the cost of the real estate atop which solar modules are installed, has been slowly rising. The soft costs accounted for nearly >60% of the overall cost of solar modules. Therefore, it is concluded that future improvements to solar modules must address the unmet need for compact (small footprint) and highly efficient solar modules whose high power density will reduce the amount of land required to generate electricity. The soft cost is also believed to impact the cost of hardware, such that module efficiency improvements will reduce hardware cost of reducing the number of modules per occupied land size.

One of the main contributors to the relatively high module cost per energy density of existing solar modules are: 1) costly tracking systems, and 2) module shadowing. Tracking systems allow solar modules to track the Sun throughout the day, hence, maximizing the power output of solar modules per day. Solar modules will need to be installed with large separation to avoid shading. Shading causes an overall reduction in system performance. In addition, shading is responsible for heating of solar module components and lowering their expected lifetime. Future solar modules will achieve lower costs, and therefore greater adoption, by designing compact and relatively high power density solar modules without the need for expensive solar tracking systems. These compact and highly efficient solar modules will need to be further immune to shadowing.

Experimental Section

An electromagnetic energy convertor (EMEC) device is optimized via adjusting three main system characteristics: 1) number of photovoltaic (PV) cells, 2) relative PV cell angle, 3) medium transparency diffusion coefficients. Other adjustable parameters include: PV cell stacking density, light intensity, light frequency, load resistance, medium dielectric constant (i.e., refractive index), EMEC weight, and light collection aperture.

In some embodiments, the PV cell is an off-the-shelf silicon-based material. In other embodiments, the PV cell comprises an organic material (e.g., OLED and perovskite material) to convert electromagnetic energy to electrical current. In some other embodiments, the PV cell is not opaque. In some embodiments, the PV cell is coated with a reflective layer to reduce light absorption. In some embodiments, the PV cell is specifically selected to operate within a narrow range of wavelengths. In other embodiments, the PV cell operates within one (or more) range of EM frequencies. In some embodiments, the PV cell is coated in a dielectric material to avoid short-circuit between cell terminals (or discharging). In some embodiments, the dielectric-coated PV cell is submerged in a high-specific heat fluid, such as deionized water.

In some embodiments, the fluid medium circulates and can exchange heat. In some embodiments, the medium within which the PV cells are at least partially deposited is a gas mixture. In some embodiments, the medium is an insulating material and is a mixture of materials of more than one state of matter. For instance, in some embodiments, air packets are introduced with in a solid matrix of resin to reduce system weight. In the following experiments, a photovoltaic cell is first characterized. The cell is then used in combination with other cells while the 3 main system characteristics are adjusted. The EMEC overall output is compared with a cell of the same occupied surface area. Therefore, relative performance is defined as the ratio of the power output of the EMEC per occupied surface area and the power output of flat cells occupying the same surface area.

Experiment 1: Cell Power Output Characterization

In order to determine the EMEC efficiency, i.e., η=P_out/P_in×100%, knowledge of the input electromagnetic power and the output electric power is essential. The EMEC device's power output was measured using P=IV to ensure consistency. The voltage was measured across a single resistor in series with the LED using the automatic measurement algorithm and manually using a multimeter. The voltage was measured for resistor values from 1Ω to 10 kΩ. Various loads were tested to again ensure that the power dissipated behaved predictably for calibrating the measurement algorithm.

Methods:

The USB microcontroller used for the measurement algorithm was the NI USB-6009. The light source was a Chanzon 100 W LED and emitted illuminance from (25-775)×100 lux of natural white (4000 K) light. As shown in FIG. 20, the Chanzon LED is connected to a DC power source. The power source is controlled by an Arduino. In order to calibrate the NI instrument voltage reading, V1, voltages across a resistor connected in series with the photovoltaic (PV) cell were also measured using a manual voltmeter, V2.

The solar cell tests were consistent in automated measurements using the automatic measurement algorithm and manual measurements using a multimeter. The tests were run 3 separate times and averages were calculated for error analysis purposes. Both measurements could not exceed 0.5 V for output voltage because of the characteristics of the solar cell.

The similar results indicate that the automated measurements using the automatic measurement algorithm are accurate and, thus, will be used for all future experiments of similar configuration. The graphs of voltage vs. power simply state that the automatic measurements are consistent with a standard voltmeter. The current of the system was not measured using the multimeter, but was calculated using the Ohm's Law (V=RI). Both the voltage and current will need to be measured across the EMEC device in order to find the max power dissipated for further experiments.

Experiment 2: Solar Panel Output Specifications

The purpose of this experiment was to measure the outputs for the solar panel and various light intensities in order to find maximum output for the solar panel. The power of the solar panel is given by P=IV. The maximum power point or $P_{Max}$, is given by the highest product of current and voltage points as $P_{Max}$=max(IV).

The maximum power point (MPP) will give the voltage needed to create the greatest power possible. From this point, the optimal load resistor can be chosen to achieve the greatest power output.

Both the current and output voltage were calculated manually using two multimeters, as shown in FIG. 23. Light intensity was measured from 25-775×100 lux in intervals of 75×100 lux. The resistor values were measured from 0Ω to 4 kΩ. This range was chosen to ensure that open circuit voltage, $V_{OC}$, and short circuit voltage, $I_{SC}$, were recorded. $V_{OC}$ is a characteristic of the solar panel that is the voltage difference across the panel with no current flowing. This is important to characterize because it tells us the highest potential difference across the solar panel's terminals. $V_{OC}$ was measured by hooking up the panel across a voltmeter. A 4 kΩ resistor gets us accurately close to $V_{OC}$ with no current flow. $I_{SC}$ is a characteristic that occurs when there is no voltage drop across the terminals. $I_{SC}$ is important to measure because it tells us the highest current that can flow in the circuit for various light intensities. Taking out the resistor and connecting the panel wires will result in $I_{SC}$. This is equivalent to having the 0Ω resistor. These behaviors of the solar panel will be useful to know for further test.

Results and Discussion

The current and voltage measurements of the cell behaved consistently. The max voltage of the solar cell is 0.5V and none of the tests reached above it. This confirms that the $V_{OC}$ of the cell is 0.5 V. The short circuit current values ranged from 4 mA to 185 mA. The lower the light intensity, the longer the constant current portion of the graph is. The knee of the graph is at lower voltages and higher currents for higher light intensities and vice versa for lower light intensity. This can be seen in FIG. 25.

FIG. 24 indicates that the short circuit current of this particular photovoltaic cell will not exceed 200 mA for light intensities less than 775 lux. This can help us categorize the types of equipment to use. If a multimeter cannot take over 200 mA for a certain reading, we know that it will be safe to use for a single cell. The voltage will range from 0.4-0.5 V open circuit and will never pass 0.5 V. This can help us in the same way as the current.

FIG. 25 provides a voltage vs. power profile for the particular cell. The profile can help with efficient use of the photovoltaic cell. A single cell can produce around 26 mW. As the light intensity grows, the additional benefit of power generation decreases showing diminishing benefit of each increasing light intensity. This occurs because of the cell's characteristics of $I_{SC}$ and $V_{OC}$ not allow anymore current, and therefore power generated, after $V_{OC}$ is reached. The maximum power point can be determined for each light intensity to find the resistance that gets closest to that point. Understanding MPP can help with maximizing the efficiency of the system.

Experiment 3: Transparency and Angle Tests

Light diffusers can be used with solar cells to spread out the light to all of the cells in the array to improve efficiency (per surface area). A solar array has many solar cells ran in series (or parallel) with each other to increase power generation. If part of the array is not receiving light, the efficiency of the array drops drastically. This experiment compares light diffusers to see if light can be spread out to every cell to ensure no dead/shadowed cells and avoid a large drop in power generation.

Methods:

Various light diffuser samples were tested under light intensities from 25-775 (×100 lux) with a series resistance of 100Ω, as shown in FIG. 26. Each light intensity was also tested at varying degrees away from normal light exposure. Each lux value was tested from 0-180° from normal in 10° increments. Different angles were tested to further understand characteristics about the solar cell to maximize efficiency and find out the best angle to put the cells. Angles were tested with the diffusers to see the relationship between different transparencies and degrees from normal.

The thickness of the holder is 4 mm and 1.75 mm where the PV cell sits. Including the thickness of the cell and the glue that sits underneath the cell, the diffuser is around 1.5-2 mm away from the cell's surface for these tests.

Results and Discussion:

FIG. 27 shows the voltage vs. power graph for the PV cell without a diffuser. The distribution shows that there is a correlation between angle from the light and output voltage. The lower angles have a higher output voltage and create more power and the higher angles have a lower output voltage and create a lower power output. This relationship is true most cases when the light intensity is held constant. This graph shows that power depends on degrees from the light, to go along with the light intensity dependency.

This graph details how power output of our cell changes by changing the angle to the light source. The power output stays pretty consistent before 90 degrees from light, but then has a large drop at 90 degrees. The power output continues to fall until 160 degrees, and then rises for the final two measurements. The changing intensity values stays consistent with Experiment 3 in that the higher intensity, the higher power output. An angle closer to normal is more important than light intensity for angles less than 90 degrees. After 90, there is almost a constant increase in power as light intensity is increased in the same size steps.

This test was ran with the Makrofol DE 1-4 020209 from the diffuser sample kit. The diffuser was tested and found to be 42.8% transparent. The power output drops more drastically past 90 degrees than the test with no diffuser. The power is nearly zero past 90 degrees for all following degrees. The power is also not as consistent at the top as the power starts to fall down approaching 90 degrees. It is also important to note that the axis for Power is in watts and FIG. 28 is in milliwatts. The diffuser blocks more light from reaching the cell and therefore less power is produced.

The takeaway of Table 1 is to show the different rates of change in power output for different diffusers. There is no real pattern to the decrease in power output across the range of diffusers. Most diffusers decrease substantially after 90 degrees as seen in FIGS. 26-27, but some diffusers decrease more steadily, like 91.6% and 87.7%. In a couple specific cases, some diffusers actually increase power when they are turned further from the light source. This happens for 91.6% at 110 degrees and 91.5% at 100 degrees. Most of the diffusers increase slightly after the turn from 170 to 180 degrees, when the cell is facing directly away from the light. The diffusers made out of polycarbonate film, (93, 42.8, 77, 87.6, and 82), all experience sharp drops in power output around the 90 degree mark. The rest of the diffusers are made out of acrylic and experience more gradual drops in power output, except for 64.8%. 64.8 is different in color (white) than the other acrylic diffusers and could the reason for sharp drop at 90 degrees.

Table 2 is a continuation of Table 1 for the polycarbonate diffusers. All of the polycarbonate diffusers have the same thickness and the same surface texture. The first four (89.1, 55.6, 53.2, and 52) are considered translucent cool for their color and the rest are translucent warm. The diffusers all drop in power output around 90 degrees. The behavior of the diffusers are more consistent across the table as they are all made of the same material. The polycarbonate diffusers start to become useful at the 90 degree mark, as these diffusers hold their power output better than using no diffuser.

Table 3 shows the benefit or harm of using a diffuser at certain angles in terms of total power output. Most of the diffusers increase the power output for angles below 90. The differences in the diffusers really show for angles at or above 90. Some diffusers increase the power output whereas some decrease it. The polycarbonate film diffusers decrease power output after 90 degrees. This tells us that using no diffuser past 90 degrees is better than using a polycarbonate film diffusers. Most acrylic diffusers improve power output past 90 degrees. The diffusers that performed the best, (94.2, KSH 93, 91.6, and 87.6), are all made out of acrylic. The 87.6 diffuser, made out of polycarbonate film, increases the power output at 90 degrees, but then decreases in performance similar to other polycarbonate film diffusers. Again, the transparency is not the only factor in changing the power output. Some more transparent diffusers are outperformed by less transparent diffusers, and some less transparent diffusers are outperformed by more transparent diffusers. Proof of this is in the difference in performance between the two 93% transparent diffusers.

Table 4 is a continuation of Table 3 for the polycarbonate diffusers. The polycarbonate diffusers all perform the best after the 90 degree mark. All diffusers except the 52% significantly increase the power of the PV cell at the 90 degree mark to the 110 degree mark. The polycarbonate film diffusers are their most useful in this range and can increase the power output of the cell. These tests will further help maximize power of the EMEC device based on the orientation and angle to the light.

The goal of the diffuser experiments is to find the best set of conditions to use the PV cell to maximize power output. These tests can serve as a reference when designing the black-box device. Power decreases as the cell is rotated away from direct sunlight. Certain diffusers can improve the performance of the cell at certain angles. These combinations can be used with diffused light to create more power from PV cells not in direct light.

The polycarbonate diffusers can be used at lower incident angles to retain efficiency. Acrylic diffusers should be used at higher incident angles past 90 degrees to optimized cell efficiency.

Experiment 4: Colored LED Test

Solar cells generate electricity when light hits the cell and causes electrons to be released from the cell, creating a potential difference, known as the photovoltaic effect. The energy of the ejected electrons is directly related to the wavelength of the light that hits the cell. This experiment examines this relationship and how different colored light sources affect the characteristic curve of a PV cell.

Methods:

The tests were run using the same circuit setup as in Experiment 2. The LEDs that were tested were green, blue, red, and white light. All the tests were ran at 425 lux. The resistors values were set from $0.3\Omega$ to $4000\Omega$ in order to get the full range of the characteristic curves.

Results:

FIG. 12 shows the various characteristic curves for the different colored LEDs. The wavelength of the light appears to have a significant effect on the V_OC and I_SC characteristics of the cell. The colored LEDs bring down both V_OC and I_SC of the cell. The green LEDs pulls the current and voltage down further than the blue. It is also important to note that blue has a shorter wavelength than green in the visible light spectrum.

FIG. 31 shows the maximum power for the different LEDs. The white light has the highest potential power output followed by blue light and green light. These results also follow the wavelength pattern of the visible light spectrum.

The color of the light is another factor that can be manipulated to achieve desired characteristics of the cell. In order to achieve the maximum power of the cell, white light is the best light source for selected PV cell.

Experiment 5: Colored LED with Diffusers

In Experiments 3 and 4, it was observed that diffusers and LED colors can have a significant impact on the power output of a PV cell. This experiment examines their relationship using both the diffusers and colored LEDs together. The purpose of the experiment is to see how the diffusers prevent light from reaching the cell at different wavelengths and to find the best combination of diffusers and LEDs to maximize power.

Methods:

Various light diffuser were tested under light intensities from 24 lux to 775 lux with a series resistance of 100Ω. The cell was tested from 0-180 degrees from normal light for each diffuser. The tests were repeated for all of the different colored LEDs.

Results:

Tables 5 and 6 shows the benefit or harm of using a diffuser at certain angles in terms of total power output by LED color. The overall power output trend of the diffusers is constant over different colored LEDs. The power drops substantially around 90 degrees for the polycarbonate film diffusers, just like for the white LED, whereas other diffusers have more gradual drops. The starting reference power values are all higher for the blue LED. The green LED performs worse at angles past 100 degrees for most diffusers. The 180 degrees values are all under 0.5% for the green and over 0.5% for the blue.

Table 5 shows a large difference in power output around the 90 degree mark. All of the diffusers are worse than reference at 80 and 90 degrees for the green light. After 90 degrees, the results are less consistent. The 5 best performing diffusers past 90 degrees for the green LED (KSH 63, 91.6, 91.5, 79.1, and 61.5) are all made out of acrylic. The worst performers past 90 were made out of polycarbonate film except for 64.8, which is made out of acrylic. 64.8 performed poorly for the white LED test as well, whereas the other acrylic diffusers performed better.

Table 6 is for the blue LED tests. The effect on power output is not consistent across all diffusers. There is not a large drop around the 90 degree mark for most of the diffusers. The diffusers that have a transparency in the 90s performed the worst for the blue LED. This was not the case for the green LED, as KSH 93 performed the best out of all the diffusers. Diffusers below the 90% transparency mark increased power output for the most part past 90 degrees.

Experiment 6: Plural PV Cell Characterization

The EMEC device will contain multiple PV cells connected together that create a series of cells to maximize the power of the device. Understanding how the cells work together is vital to ensuring that the design and use of the device are in the best way possible. FIG. 32A provides a schematic for three inter-dependent parameters: layers' angles from the incoming electromagnetic energy θ, layers' relative angle α, and layers' relative distance D. The layers A and B are selected from a list consisting at least of PV cells and optical layers such as mirrors.

The angle θ defines the angle at which each layer is oriented with respect to the incoming electromagnetic energy, e.g., light and can vary between 0 and 360. At θ=0 degrees, the cell is oriented perpendicular to the incoming electromagnetic radiation. Tradiational solar cells generate maximum power when oriented at θ=0 degrees.

The relative angle α is defined as the angle between individual layers. For instance, in some embodiments, two PV cells are oriented to face each other α=180 degrees. In other embodiments, layer A is a PV cell coupled with a Layer B, a reflective surface at an angle α=90 degrees. In this embodiment, the two layers are oriented at θ=45 degrees, resulting in doubling the light intake of Layer A by reflecting the light from Layer B. PV cells in traditional 2D solar panels are oriented at θ=α=0 degrees.

The relative distance D refers to the stacking density of the layers. The relative distance D will determine the light intake cross section of Layer A and Layer B. Smaller D will result in smaller amount of light entering between the two layers.

In some embodiments, the medium, shown in grey, is resin. The resin is liquid in some embodiments, while a solid, i.e., hardened, in other embodiments. The transparency and the diffusivity of the medium is modified in some embodiments using color pigments, such as dyes, and air bubbles. In some embodiments, the resin medium is thinned by adding acetone.

Methods:

Two PV cells were set up in series with each other, as shown in FIG. 32B, and the voltage across both of the cells was measured.

The cells were placed in holders connected to 200 step motors. The motors were controlled using an Arduino Uno and the Arduino IDE and the voltage was measured across a 100Ω resistor using the NI USB-6009. The cells started flush against each other, and were then open in steps of 10.8 degrees from 0-180 degrees. These measurements were picked on the limits of the stepper motors. Each step from the motor is 1.8 degrees and 5 steps gives 9 degrees to try and mimic the single cell test angles. The cells were equidistant from the light source at all times and since both cells are of the same design, we assumed that the potential across each cell was equal.

Results:

The voltage for the two cell setup is the total voltage, so the voltage of a single cell is the voltage divided by 2, as shown in FIG. 33. The plural cell setup results in doubling the maximum voltage across the resistor. These points occur at the open circuit voltage and is therefore a characteristic of the cell. The voltage almost reaches 1 V for the two cells and the single cell reaches around 0.5 V. The total power of the device is doubled as a result. The overall power distribution of the one cell setup grows twice as fast as the two cell setup.

As shown in FIG. 34, the power per surface area (PPA) for the two cells ranges up to 5 W/m$^2$ per cell. The angle is taken from normal to receiving light. The points that are almost always paired up are just on either side of normal.

FIG. 35 shows the best way to utilize area inside the EMEC to produce the most power. PV cells normal to receiving light produced the most power (FIG. 9). Changing the angle of the cell reduces power, but can utilize a given area in a better way. The cells can produce up to 4 times the power per area than a flat cell at 90 degrees from normal (0 or 180 degrees from zenith). Multiple cells should be utilized vertically or close to vertical to maximize power per area.

FIG. 36 shows the power output for the two cell setup by angle. The blue points are the points where the interaction of multiple cells is beneficial. the blue points are locations in which adding a second PV cell more than doubles the power output. The conditions in which this happens is for high light intensities and small zenith angles. This is a result of the reflection of light between the cells which occurs in a larger amount when they are closer together. The result is less predominate at higher angles because of a larger angle of incidence and the cells are already operating close to their $V_{OC}$ points.

Table 9 is the same data as FIG. 35 just listed out in a table. The cells had no reflective material over them and the power ratio is listed in each cell. The conditions where the two cells system receives extra benefit (power more than doubles) from a second cell occurs for small angles. For the medium and higher angles, there is not this extra benefit of adding a second cell. The red cells are where adding a second cell actually decreases performance of the system. This occurs because the cells are connected together. The drop in performance of a single cell in the series will drop the power in other cells in the series.

The orientation of the cells cannot avoid this fact. If the cells are lined in series, one cell not receiving light acts as a resistor and drops the voltage across the cell. A parallel connection is not the solution either. In parallel, the cells share the same voltage value across each cell. A shaded cell will bring down the total voltage and drop the voltage of each path as a result. However, a series connection is the best solution, as the power output is affected less by shading than in a parallel connection. Bypass diodes can also be utilized to skip any cell in series that is being shaded.

The gain in power output by adding a second PV cell can be seen in FIG. 37. These are the blue points where each cell in the e plural cell setup outperforms a single cell. These locations again occur at small angles, where the cells are the closest to each other. These conditions are where light reflects off the cells into each other and increases power, as seen in FIG. 36. The final zenith angle of 171 has a large drop in power per area compared to the single cell in FIG. 34. This is the first angle that shows a significant decrease in power by adding a second cell. There is less light at 171 degrees and the PV cells are not working efficiently. This hurts the setup as a whole and decreases potential power output from a second cell.

The purpose of Table 12 is to characterize the reflective surface used in following reflectivity tests. The reflective surface used was 35% tint, silver vinyl surface used for automobile windows. The power of the single cell is boosted at small angles. This is expected as the cells are closest to each other and the chance for reflectivity is the greater. The cell also increases in performance at the 180 degree mark. This reflectivity test for the cell helps understand the impact of using this specific vinyl and the optimal zenith angle and lux combination.

Table 11 shows the base effectiveness of using a reflective cover over the cell for a single cell setup. The power decreases for all cases except for zenith angles of 180. The only benefit of using a reflective surface on a single cell in the orientation would be at 180 degrees. The purpose of this test was to characterize how the reflective surface works and the results of using it in power output.

Table 12 shows the benefit or hindrance of putting a reflective surface on one cell in the two cell setup. The benefit of the reflective surface only occurs at zenith angles of 171 and 180 degrees. These angles are when the cells are facing directly away from each other. Therefore, there is no light that is being reflected from one cell to the other. The added benefit at these angles have to do with the performance of the reflective vinyl as seen in Table 11. There is no reflective benefit for small angles, where the cells are closest together and interacting the most.

Table 13 compares the power for a two cell setup and a two cell setup with reflective vinyl over both of the cells. The power is reduced in all situations and conditions.

The reflective surface does not appear to have increased power substantially for any of the cell layouts. Other reflective materials or other transparencies could be tested to find the best way to utilize the cell with a reflective layer.

Experiment 7: Plural PV Cell with Colored LEDs

Experiment 7 shows the effect of using a green and blue LED in the plural PV cell setup in Experiment 6. This test will see how the power is affected by different wavelengths of light and to see how consistent the results are for single cell colorized tests. This characterization will help maximize power output of the cell combination.

Methods:

The cells were tested in the same way as in Experiment 6, from 0-180 degrees using a green LED, blue LED, and white LED. The first test used only one PV cell to create a baseline for the cell in this configuration for different colored LEDs. The second test tested two cells in series with voltage measured across one of the cells. This test also used the three different colored LEDs. Since the white LEDs had the highest power output in Experiment 4, the results of the colored LEDs were compared and normalized to the white light power measurement.

The results are included in Tables 14-19. The first test resulted in the two tables "1 Cell Normalized Green LED Test" and "1 Cell Normalized Blue LED Test." These tables are from the single cell measurement and divided by the white LED's power output for each cell in the table.

The green LED does not have much benefit over the white, as almost all the points result in a number less than 1, or a decrease in power output. The blue LED can be seen to increase the power output for small angles and could be a result of the absorbance of blue light. Blue light has a low absorbance and has a greater chance of reflecting from cell to cell than white light.

The next two tables were created from the two cell tests measuring across a single cell. These values were normalized to white LED tests under the same conditions. Neither of the tables have a significant benefit over white light in this setup. The green LED is not beneficial under any conditions and the blue is slightly beneficial around 160 degrees.

The final two tables were made by taking the values from the second set of tables over the values from the first set of tables. These tables show the power output percent increase change from adding a second cell for each LED color. The purpose of these tables is to show how much more blue or green light can be utilized by adding another cell. These result in an increase in performance of a single cell in the setup.

Both colors increase in power output by adding a second cell for higher zenith angles. As the angle between the cells increases, a second PV cell in the setup will result in substantially increasing performance of each cell.

It is concluded that when using colored LEDs, a two PV cell setup is beneficial for each cell for higher angles. For small angles, blue LEDs should be utilized in a single cell setup. Colored LEDs should never be used for small zenith angles in a two PV cell setup using this specific type of PV cell.

Experiment 8: Plural Cells in Diffusive Medium

Experiment 3 showed the benefit of using a solid, diffusive material to scatter light and provide light to the PV cells.

This experiment using liquid resin as the diffusive material to examine the benefit of scattering light in a liquid material. Resin is beneficial in the design of EMEC devices as the resin can be easily poured over the cells without worrying about the positioning unlike with solid diffusers.

Methods:

The plural resin tests were ran using varying amounts of clear resin. The resin is a solution of resin and ethanol to lower the viscosity of resin. Resin amounts used were from 0 mL to 1000 mL in steps of 200 mL. Each amount of resin had secondary tests that covered the container in a reflective surface (aluminum foil).

The cells started horizontal with a zenith angle of 90 to the light source. The cells were rotated towards each other in steps of 9 degrees until the cells were parallel to each other. The angle measured in the tests was the angle to the horizon of the PV cells (referred to as altitude angle). The power per area numbers were then normalized to the power per area of a flat PV cell with no resin. This normalization shows the benefit of using resin in terms of saving the needed to maximize power from the cells.

Results and Discussion:

FIG. 39 shows normalized power per area (PPA) for a base cell in the resin container. The maximum PPA for the PV cell is around 5 W/m² when the cell in nearly vertical. This shows similar results to FIG. 16, as the maximum PPA for that uncovered cell was also around 5 W/m².

FIG. 40 shows the result of covering the container in aluminum foil. This ensures the container will not absorb any light and deflective it up back towards the cells. This results in the maximum PPA being a little over 5 W/m² at 81 degrees from the horizon. The results are not drastically different from FIG. 39 because the cells are facing upward, towards the light. The light reflected by the foil has a small impact on the upward facing cells. Further figures and charts with foil will be normalized to flat cells in the foil setup as there is a small increase in PPA with using foil.

FIGS. 41-42 show the PPA for the maximum amount of resin used with and without resin respectively. The foil test shows a small increase in PPA compared to no foil again as seen in earlier tests. The lower lux intensities, such as 25 and 75 lux, show odd behavior compared to the higher intensities. This is a result from the characteristics of the resin used. The resin is not completely transparent and smaller light intensities have a problem reaching the cells for higher angles. At smaller angles, the light is not diffused as well and easily shines on the flat cell.

The tests show that a diffusive material, such as resin, can save space when using PV cells, therefore, improving power per unit area significantly. The resin allows for light to be diffused throughout the container and to be shared across cells. The resin also allows for the cells to be positioned in ways such that the PPA can be maximized. Maximizing the PPA will allow for more cells to be used in a smaller area and to allow more power from the same amount of space.

Experiment 9: PV Stacking w/Resin

Experiment 8 shows the benefit of using resin to maximize the power per area of the solar cell. The resin allows for the soft light to be spread throughout the container, powering multiple cells with necessarily needing direct light.

This experiment shows the potential for using multiple layers of PV cells in varying configurations to maximize the PPA of the entire setup. The purpose of this is to create more power using the same amount of land, resulting in more efficient power production.

Methods:

This experiment uses the same setup as in Experiment 12. The cells are placed in a resin bath of 1000 mL and the bath in covered in foil. Three separate tests were ran with the PV cells in different configurations.

The first test set the PV cells in the same way as in Experiment 12. The cells were facing upwards and rotated in 9 degree intervals. The second test placed the cells on the bottom side of these holders. The light was reflected off the container and reached the upside down cells from the bottom. The third test placed two cells at the bottom of the container with the resin over them. The cell holders were in the same position as the first two tests and rotated in the same manner. The purpose of the holders was to block the light where the face up and face down cells would be.

The power produced by each test were added up and PPA was calculated. This number was then normalized to the PPA of a flat PV cell in the container with no resin.

FIG. 43 shows the PPA percentage compared to a flat cell being at 100%. This figure shows that the light can be used to power three different layers of cells to increase the PPA of a cell up to 11 times at higher angles. Even at small angles, using layered cells shows an increase in power produced. This graph shows that the stacking of cells is beneficial in any scenario when using resin.

FIG. 45 shows schematic of three layers (Layer A, B, and C) selected from a list of PV cells, dielectric material, and reflective material. In some embodiments, Layers A, B, and C are PV cells, wherein Layers A and Layer B face each other. Layers B and C are positioned facing away from each other. The spacing between layers A and B is d to allow light to propagate between them. The ratio of spacing, d, and total light intake cross section inside the EMEC, a, can be optimized.

The layers are disposed in a medium. As shown in FIG. 46, the medium can change radially and/or distally inside the EMEC. Some of the properties of the medium include transparency, diffusivity, specific heat, viscosity, freezing point, boiling point, and, absorption. The transparency is within a range 0 to 1, where 0 means no transmission. In some embodiments, medium properties are a function of electromagnetic radiation wavelength. In some embodiments, as shown in FIG. 47, the medium is doped with spacers, marked as stars, whose goal is at least one of the following: 1) to reduce the total weight, 2) to determine the spacing d, and 3) to diffuse the electromagnetic radiation. In some embodiments, the spacers, are air bubbles. In some embodiments, the spacers are clear plastic pellets of (known) uniform diameter. In some embodiments, the medium is a flexible material such as silicon or a gel. In other embodiments, the medium consists of inflexible materials once hardened.

In some embodiments, the internal surface of the EMEC is coated by a reflective material, as illustrated by black triangles in FIG. 48. In this embodiment, the spacing between neighboring PV cells (Layers A & B) is filled with a waveguide of thickness d. The waveguide intake light cross section is intended to capture light with cross section a, propagating in both directions (top to bottom and bottom to top) in the medium. In other embodiments, as shown in FIG. 49, reflective and or diffusive surfaces are positioned near the spacing between neighboring PV cells (Layers A and B) whose purpose is to reflect at least a fraction of the propagating light. The reflected and/or diffused light will then propagate between Layers A and B and is converted to electricity. One example of the reflective surface is a mirror. One example of the diffusive surface is an etching inside the medium. The etching can be created after the hardening of the medium (e.g., epoxy resin+hardener) using laser bubblegram fabrication techniques. A bubblegram (also known as laser crystal, 3D crystal engraving or vitrography) is a solid block of glass or transparent plastic that has been exposed to laser beams to generate three-dimensional designs inside.

In one embodiment, the medium at least partially changes properties. In one embodiment, the medium includes layers of reflective liquid crystal surfaces whose macroscopic properties can be changed under various electric or magnetic perturbations. In some embodiments, the medium can change phase, for instance, from liquid to solid and back to liquid again. For instance, a water-based medium can be cooled to below freezing point temporarily for different dielectric properties.

The spacing between Layers A and B can also be filled with diffusing waveguides, as depicted in FIG. 50. In such embodiments, the diffusing waveguide scatters the incoming electromagnetic radiation. Some of the scattered electromagnetic radiation is then propagated within the waveguide and converted to electricity by Layers A and B. In yet other embodiments, similar to FIG. 46, the medium is divided between distally- and radially-varying dielectric material of differing refractive indices, as shown in FIG. 51. The purpose of such waveguide with gradient refractive index profile is to address individual PV cell spacings. In such embodiment, the medium is a waveguide matrix within which light propoxates along an intended path. The purpose of the varying refractive indices is to direct the light by bending it at the interface of neighboring dielectric materials of varying refractive indices.

In some embodiments, the medium is of liquid phase and can be circulated. Some of the advantages to liquid medium include: 1) heat dissipation, 2) medium replacement, and 3) PV cell replacement. As shown in FIG. 52, the medium is circulated between the EMEC enclosure and a piping system in order to transfer heat from inside the enclosure and discharging it to the surrounding air (or other surrounding media). Other methods of heat transfer include: convection, conduction, thermal radiation, and evaporative cooling. In one embodiment, the PV cells of the EMEC are coated with dielectric insulating material and submerged in a polar liquid such as deionized water with relatively high specific heat. In this embodiment, the EMEC's transparent insulating body consists of a circulatable polar liquid and the insulating dielectric material. In some embodiments, the liquid is conductive and polar such as water, while in other embodiments, the liquid medium is an insulator, such as epoxy resin. In yet other embodiments, the EMEC medium is a diffusive gas, such as smoke and water vapor, which can be circulated for heat transfer.

In other embodiments, as shown in FIG. 53, the cooling mechanism involves circulating an evacuated tube of clear or reflective surface partially filled with a fluid such as alcohol or water. Due to the low pressure, the fluid inside the pipe may boil when it absorbs heat from the air inside the EMEC enclosure. The fluid and/or vapor circulates through the pipe between the PV cells inside the tube. Once outside the EMEC enclosure, the fluid (and/or vapor) is cooled by the air outside the enclosure (and condenses). The (condensed) fluid then returns to the bottom of the enclosure and the cycle repeats. In some embodiments, the heat transfer process is active using an air compressor or a fluid circulator pump. In other embodiments, the heat transfer system includes a temperature regulator whose purpose is to regulate the temperature of the PV cells and/or the medium for optimized PV cells power output. This embodiment aims to provide the appropriate temperature for the PV cells whose efficiency is a function of ambient temperature. In some other embodiments, the PV cell and/or the medium temperature is kept at sub-zero degrees Celsius for optimized power output.

In some embodiments, the EMEC is fabricated layer by layer. Examples of such fabrication process include: 3D printing, chemical vapor deposition, roll-to-roll fabrication, laser etching, and chemical curing such as thermosetting and radiation setting.

In some embodiments, the electromagnetic energy intake cross section is modified to enhance or reduce the amount of incoming energy. In some embodiments, the aperture setting is done using active components such as mechanical gates. In some embodiments, the energy intake is controlled with a layer of liquid crystal.

According to the principles of the present teachings, electromagnetic energy converter system 10 and/or electromagnetic energy converter 14 has been disclosed that is particularly suited for use in any one or a number of applications, including, but not limited to, the efficient delivery and/or storage of transmitted power. In fact, electromagnetic energy converter system 10 and/or electromagnetic energy converter 14 can be used, for example, to power compact solar structures, microelectromechanical devices (MEMS), electronic circuits and devices, transportation elements (e.g. buses, trains, cars, aircraft, and the like), space and long distance applications (e.g. satellites in orbit or aircraft in general (airplanes, UAVs, etc.)). The principles of the present teachings replace bulky and fragile solar panels with a reliable, resilient, compact, lightweight device that is mobile and efficient. Some of the applications of the EMEC include:

a. Transportation: as shown in FIG. 54, the EMEC can be implemented into the design of transportation devices such as a UAV. The EMEC will convert incoming radiation (solar radiation and/or concentrated source of electromagnetic energy, such as a laser) into electricity which can be stored and consumed aboard. Similarly, the EMEC devices can be designed with optimized aerodynamics and can be installed aboard vehicles, such as trucks and vessles.

b. Farms: unlike traditional solar farms which occupy vast surface areas to generate power, the compact EMEC, as shown in FIG. 55, can be implanted on farms, between crops, to convert solar radiation to electricity. The electrical power can be stored and consumed onboard, for example for lighting, and or transferred to the power grid.

c. Urban applications: due to limited available land in urban areas to install traditional solar panels, compact EMEC devices can be used to harvest electricity. Solar radiation can be collected and directed into an EMEC enclosure by a waveguide. In one embodiment, a shown in FIG. 56, the EMEC enclosure and electronics are installed underground. Another benefit of underground EMEC installations is thermal management. The relatively-constant soil temperature, specially at depths greater than 30 ft, can be used to regulate the EMEC temperature. In another embodiment, the EMEC is used to convert solar radiation to electricity to power urban lighting structures, such as light posts, as shown in FIG. 57. Similarly, as shown in FIG. 58, multiple EMEC devices can be coupled together. Two important advantages of this design are: 1) easy installation, and 2) easy maintenance. In one embodiment, the EMEC devices are wrapped around an existing light post. In some embodiments, the junction between neighboring EMEC devices is filled with a junction material to manage the propagation of light between EMECs. Faulty EMECs can be easily replaced.

Here, the definitions of some of the terms are re-stated for clarity:

a. Transparent material: a transparent material refers to a type of material that transmits at least in part of the electromagnetic energy spectrum. Transparency can range between 0 (no transmission) and 1 (100% transmission). The non-transmitted electromagnetic energy can be absorbed by the material and/or deflected.

b. Diffusivity: materials with optical diffusivity diffuse or scatter electromagnetic radiation with or without absorption. Repeated scattering of the electromagnetic radiation can change its direction, often referred to as 'random walk'. Diffusive material can further be diffractive, also known as 'diffractive diffuser or homogenizer' to diffract (and refract) an incoming monochromatic electromagnetic radiation for a particular spatial configuration and/or intensity profile. Diffusivity can range between 0 (no scattering) and 1 (complete reflection and or absorption).

c. Insulating material: an insulating material is a dielectric material with known dielectric constant and refractive index (i.e., finite real and imaginary dielectric constant). In some embodiments, the insulating material may also serve as a thermal insulator to reduce heat transfer between the EMEC medium and the surrounding environment. In other embodiments, the insulating material insulates the PV cells from moisture and other conductive and/or oxidizing agents.

d. Plurality of electromagnetic (EM) energy converting cells: electromagnetic (EM) energy converting cells comprise of a photoelectric layer that converts electromagnetic energy to electricity. This layer can be made of a material selected from a list of conductors (e.g., copper), semi-conductors (e.g., silicon crystals and quantum dots), inorganic materials, and organic materials (e.g., perovskite and organic light emitting diodes). The electric current generated in the photoelectric layer of the electromagnetic (EM) energy converting cell is transferred by conductive poles/terminals. The term 'plurality' refers to more than one electromagnetic (EM) energy converting cell. The present teachings further exclude a plurality of electromagnetic (EM) energy converting cells wherein electromagnetic (EM) energy converting cells are all positioned at relative angle, $\alpha=0$, and electromagnetic (EM) energy converting cell spacing $d=0$. The excluded structure describes a traditional solar panel wherein all PV cells are oriented facing up and positioned in a single plane. The plurality of electromagnetic (EM) energy converting cells can be electrically coupled. In some embodiments, the coupling between the electromagnetic (EM) energy converting cells is done in a series configuration. In other embodiments, the electromagnetic (EM) energy converting cells are connected in a parallel configuration. In yet other embodiments, the electromagnetic (EM) energy converting cells are individually addressed (harvested), while in other embodiments, the cells are addressed as a group wherein the electrical charge from a plurality of cells of similar power output are connected and harvested.

e. Single-Piece encapsulating material: the term 'encapsulating' means to at least partially enclose the electromagnetic (EM) energy converting cell of the EMEC in an insulating material. 'Single piece' refers to a material or a plurality of materials that can transmit at least some electromagnetic energy wavelengths. In some embodiments, the single-piece insulating material holds the electromagnetic (EM) energy converting cells of the EMEC in position, such as a hardened epoxy resin, while in other embodiments, as described above, the single-piece insulating material consists of a dielectric material to cover the electromagnetic (EM) energy converting cells while the covered cells are immersed in a diffusive and/or heat-transferring liquid material. One common characteristic between the aforementioned single-piece encapsulating materials is that they all serve as a medium within which electromagnetic energy is transmitted until converted to electricity by the plurality of electromagnetic (EM) energy converting cells. Another common characteristic of the single-piece encapsulating materials is that they all prevent the flow of electric current between the positive and negative terminals of electromagnetic (EM) energy converting cells, i.e., short-circuit. In other words, the single-piece encapsulating materials are at least partially electrical insulators within which electric charges do not flow freely, even under the influence of an electric field, i.e., potential difference across the terminals.

f. Power per surface area: the term 'power per surface area' refers to the amount of electrical power generated over the footprint, i.e., the occupied surface area by an EMEC. Similarly, the normalized power per surface area is the ratio of EMEC power per surface area and the power output of flat cells occupying the same surface area as the footprint of the EMEC, i.e., $(P/A)_{EMEC}/(P/A)_{flat\ cells}$, under similar electromagnetic radiation and environmental conditions.

What is claimed is:

1. An electromagnetic (EM) energy converter for converting electromagnetic (EM) energy to electricity, the electromagnetic (EM) energy converter comprising:
a body of transparent insulating material; and
a plurality of identical electromagnetic (EM) energy converting cells disposed at least partially within the body of transparent insulating material, each of the plurality of electromagnetic (EM) energy converting cells is at least partially stacked relative to others of the plurality of electromagnetic (EM) energy converting cells, the plurality of electromagnetic (EM) energy converting cells configured to convert the electromagnetic (EM) energy to electricity; and
a heat transfer system,
wherein the body of transparent insulating material is an integral single-piece encapsulating the plurality of electromagnetic (EM) energy converting cells,
wherein the body of transparent insulating material is configured to separate the plurality of identical electromagnetic (EM) energy converting cells and to direct or manipulate electromagnetic (EM) energy toward the plurality of electromagnetic (EM) energy converting cells.

2. The electromagnetic (EM) energy converter according to claim 1, further disposed in an enclosure.

3. The electromagnetic (EM) energy converter according to claim 1, further comprising a substrate supporting the plurality of electromagnetic (EM) energy converting cells.

4. The electromagnetic (EM) energy converter according to claim 1, wherein external surfaces of the body of transparent insulating material are at least partially coated with one or more layers of material.

5. The electromagnetic (EM) energy converter according to claim 4, wherein the material is selected from the group consisting of conductive, dielectric, luminescent, transmissive, reflective, absorptive, diffusive, refractive, dispersive materials or a combination thereof.

6. The electromagnetic (EM) energy converter according to claim 1, wherein the body of transparent insulating material includes a material selected from a group consisting of curable polymers, casting polymers, composite materials, reinforced polymers, epoxy, silicone, a hybrid of silicone and epoxy, amorphous polyamide resin or fluorocarbon, glass and plastic.

7. The electromagnetic (EM) energy converter according to claim 1, wherein the body of transparent insulating material comprises roll-to-roll fabrication materials having polymer films.

8. The electromagnetic (EM) energy converter according to claim 1, wherein the body of transparent insulating material comprises a domed portion configured to function as a lens.

9. The electromagnetic (EM) energy converter according to claim 1, wherein the body of transparent insulating material comprises a dish portion configured to function as an electromagnetic (EM) energy collector.

10. The electromagnetic (EM) energy converter according to claim 1, wherein the body of transparent insulating material is in a state of matter selected from a list of solid, liquid, gel, and gaseous materials, or a combination thereof.

11. The electromagnetic (EM) energy converter according to claim 1, wherein the body of transparent insulating material is physically adjustable.

12. The electromagnetic (EM) energy converter according to claim 1, wherein the plurality of electromagnetic (EM) energy converting cells are coated with at least one layer selected from the group consisting of conductive, dielectric, luminescent, transmissive, absorptive, diffusive, refractive, and dispersive materials, or a combination thereof.

13. The electromagnetic (EM) energy converter according to claim 1, wherein the plurality of electromagnetic (EM) energy converting cells are physically adjustable.

14. The electromagnetic (EM) energy converter according to claim 1 further comprising at least one of optics and optical waveguides.

15. The electromagnetic (EM) energy converter according to claim 1, wherein the plurality of electromagnetic (EM) energy converting cells are vertically-stacked.

16. An electromagnetic (EM) energy converter for converting electromagnetic (EM) energy to electricity, the electromagnetic (EM) energy converter comprising:
- a body of transparent insulating material having a diffusivity; and
- a plurality of identical electromagnetic (EM) energy converting cells disposed at least partially within the body of transparent insulating material, the plurality of electromagnetic (EM) energy converting cells configured to convert the electromagnetic (EM) energy to electricity, the plurality of electromagnetic (EM) energy converting cells being at least partially stacked relative to each other and each having three physical parameters, the three physical parameters comprising:
  - angles between the plurality of electromagnetic (EM) energy converting cells,
  - angles between the plurality of electromagnetic (EM) energy converting cells and an incoming electromagnetic (EM) energy, and
  - spacing between the plurality of electromagnetic (EM) energy converting cells; and
- a heat transfer system,
- wherein the body of transparent insulating material is an integral single-piece encapsulating the plurality of electromagnetic (EM) energy converting cells,
- wherein the body of transparent insulating material is configured to separate the plurality of identical electromagnetic (EM) energy converting cells and to direct or manipulate electromagnetic (EM) energy toward the plurality of electromagnetic (EM) energy converting cells, and wherein at least one of the three physical parameters is identical amongst the plurality of electromagnetic (EM) energy converting cells.

17. The electromagnetic (EM) energy converter according to claim 16, wherein at least the diffusivity or one of the three physical parameters is physically adjustable.

* * * * *